(12) United States Patent
Makiyama

(10) Patent No.: US 9,887,301 B2
(45) Date of Patent: Feb. 6, 2018

(54) SEMICONDUCTOR DEVICE AND METHOD OF MANUFACTURING THE SAME

(71) Applicant: Renesas Electronics Corporation, Koutou-ku, Tokyo (JP)

(72) Inventor: Hideki Makiyama, Tokyo (JP)

(73) Assignee: Renesas Electric Corporation, Tokyo (JP)

( * ) Notice: Subject to any disclaimer, the term of this patent is extended or adjusted under 35 U.S.C. 154(b) by 0 days.

(21) Appl. No.: 15/201,493

(22) Filed: Jul. 3, 2016

(65) Prior Publication Data

US 2017/0062624 A1 Mar. 2, 2017

(30) Foreign Application Priority Data

Aug. 25, 2015 (JP) ................. 2015-165818

(51) Int. Cl.

| H01L 29/792 | (2006.01) |
|---|---|
| H01L 27/115 | (2017.01) |
| H01L 29/06 | (2006.01) |
| H01L 29/66 | (2006.01) |
| H01L 29/78 | (2006.01) |
| H01L 21/28 | (2006.01) |
| H01L 29/08 | (2006.01) |
| H01L 27/11568 | (2017.01) |
| H01L 27/11573 | (2017.01) |

(52) U.S. Cl.
CPC ...... *H01L 29/792* (2013.01); *H01L 21/28282* (2013.01); *H01L 27/11568* (2013.01); *H01L 27/11573* (2013.01); *H01L 29/0649* (2013.01); *H01L 29/0852* (2013.01); *H01L 29/66833* (2013.01); *H01L 29/7838* (2013.01)

(58) Field of Classification Search
None
See application file for complete search history.

(56) References Cited

U.S. PATENT DOCUMENTS

| 6,768,160 B1 | 7/2004 | Li et al. | |
|---|---|---|---|
| 2006/0133146 A1* | 6/2006 | Maekawa | G11C 16/0416 365/185.14 |
| 2006/0246660 A1 | 11/2006 | Choi et al. | |

(Continued)

FOREIGN PATENT DOCUMENTS

| JP | 2002-520807 A | 7/2002 |
|---|---|---|
| JP | 2006-310860 A | 11/2006 |

(Continued)

OTHER PUBLICATIONS

Partial European Search Report dated Jan. 18, 2017, in European Patent Application No. 16183776.0.

*Primary Examiner* — Khaja Ahmad
(74) *Attorney, Agent, or Firm* — Shapiro, Gabor and Rosenberger, PLLC

(57) ABSTRACT

Performances of a semiconductor device are improved. The semiconductor device has: a gate electrode formed on an SOI layer of an SOI substrate via a gate insulating film having a charge storage film therein; an n-type semiconductor region and a p-type semiconductor region respectively formed on SOI layers on both sides of the gate electrode. A memory cell MC serving as a non-volatile memory cell is formed of the gate insulating film, the gate electrode, the n-type semiconductor region and the p-type semiconductor region.

14 Claims, 32 Drawing Sheets

(56) References Cited

U.S. PATENT DOCUMENTS

| | | |
|---|---|---|
| 2007/0207575 A1 | 9/2007 | Taniguchi et al. |
| 2008/0031038 A1* | 2/2008 | Chen .................. H01L 27/115 365/184 |
| 2008/0048241 A1* | 2/2008 | Fujiwara ............... B82Y 10/00 257/315 |
| 2009/0103367 A1 | 4/2009 | Lue |
| 2014/0291746 A1 | 10/2014 | Taniguchi et al. |
| 2014/0353740 A1 | 12/2014 | Nishida et al. |

FOREIGN PATENT DOCUMENTS

| | | |
|---|---|---|
| JP | 2007-234861 A | 9/2007 |
| JP | 2014-232810 A | 12/2014 |
| WO | WO99/57766 A1 | 11/1999 |
| WO | WO 2009/022741 A1 | 2/2009 |

* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2015-165818 filed on Aug. 25, 2015, the content of which is hereby incorporated by reference into this application.

TECHNICAL FIELD OF THE INVENTION

The present invention relates to a semiconductor device and a technique of manufacturing the same. For example, the present invention relates to a technique effectively applied to a semiconductor device provided with a non-volatile memory and a technique of manufacturing the same.

BACKGROUND OF THE INVENTION

In an MISFET (Metal Insulator Semiconductor Field Effect Transistor) formed in a bulk substrate, performances such as short channel characteristics or uniformity of a threshold voltage, etc., are lowered due to its miniaturization, and power consumption tends to increase.

On the other hand, a MISFET formed on an SOI substrate on which a BOX (Buried Oxide) layer serving as a buried oxide film and an SOI (Silicon On Insulator) layer serving as a semiconductor layer are formed on a base body as a bulk substrate is more excellent in performances such as the short channel characteristics or the uniformity of a threshold voltage than the MISFET on the bulk substrate even when being miniaturized, and is also advantageous in achieving low power consumption. Moreover, the MISFET formed on an SOI substrate is referred to as an MISFET on a thin film BOX-SOI, that is, an SOTB (Silicon On Thin Buried oxide)-MISFET.

As a semiconductor device on which such an SOTB-MISFET is mounted, a semiconductor device on which a non-volatile memory is mounted together is cited. As the non-volatile memory, non-volatile memories using an MONOS (Metal-Oxide-Nitride-Oxide-Semiconductor) film or an SONOS (Silicon-Oxide-Nitride-Oxide-Silicon) film as the charge storage film are cited.

Japanese Patent Application Laid-open Publication No. 2014-232810 (Patent Document 1) discloses a technique of a semiconductor device in which a memory cell using the MONOS film is formed in an SOI region of an SOI substrate. Japanese Patent Application Laid-open Publication No. 2006-310860 (Patent Document 2) discloses a technique of a flash memory including a flash block formed on an SOI substrate and a body electrode formed in a lower surface of an SOI substrate.

Japanese Patent Application Laid-Open Publication (Translation of PCT Application) No. 2002-520807 (Patent Document 3) discloses a technique of a non-volatile semiconductor device in which a memory transistor includes an SONOS tunnel metal insulating semiconductor field effect transistor. Japanese Patent Application Laid-open Publication No. 2007-234861 (Patent Document 4) discloses a technique of a method of manufacturing a semiconductor device in which in, a first MISFET is formed on a first region of a semiconductor substrate and a second MISFET is formed on a second region of the semiconductor substrate.

SUMMARY OF THE INVENTION

As the non-volatile memory that is mixedly mounted together with such a SOTB-MISFET, a non-volatile memory capable of reading at a low voltage is desirable since the SOTB-MISFET is advantageous to achieve low power consumption, and, for example, a memory cell using an SONGS film formed on an SOI layer of an SOI substrate as a charge storage film is desirable. Some of memory cells each of which has the SONGS film formed on the SOI layer as described above include a gate electrode formed on a gate insulating film made of an SONGS film, and a channel region formed in an SOI layer below the gate electrode, and n-type semiconductor regions formed in the respective SOI layers on both sides across the gate electrode.

When data of such a memory cell serving as the non-volatile memory cell having the SONGS film is erased, a voltage lower than a voltage applied to the n-type semiconductor region is applied to the gate electrode, and positive holes are implanted from the channel region into the charge storage film. However, the number of the positive holes implanted from the channel region to the charge storage film is small because the p-type impurity concentration in the channel region is low. On the other hand, the implantation speed of the positive holes from the base body of the SOI substrate to the charge storage film is low. For this reason, the data erasing speed is low, and the performances of the semiconductor device cannot be improved.

The other object and novel characteristics will be apparent from the description of the present specification and the accompanying drawings.

According to one embodiment, the semiconductor device has: a gate electrode that is formed on an SOI layer of an SOI substrate via a gate insulating film having a charge storage portion therein; and an n-type semiconductor region and a p-type semiconductor region formed in respective SOI layers on both sides of the gate electrode. A non-volatile memory cell is formed of the gate insulating film, the gate electrode, the n-type semiconductor region and the p-type semiconductor region.

Moreover, according to another embodiment, the semiconductor device has: a first channel region formed in the SOI layer in a first region on an upper surface of a base body of the SOI substrate; and a first gate electrode formed on the first channel region via a first gate insulating film having a charge storage portion therein. Moreover, the semiconductor device has: a second channel region formed in the SOI layer in a second region on an upper surface of a base body of the SOI substrate; and a second gate electrode formed on the second channel region via a second gate insulating film. A non-volatile memory cell is formed of the first channel region, the first gate insulating film and the first gate electrode, and an MISFET is formed of the second channel region, the second gate insulating film and the second gate electrode. The p-type impurity concentration in the first channel region is lower than the p-type impurity concentration in the second channel region.

Furthermore, according to another embodiment, in a method of manufacturing a semiconductor device, a gate electrode is formed on the SOI layer of the SOI substrate via a gate insulating film having a charge storage portion therein, and an n-type semiconductor region and a p-type semiconductor region are formed in the respective SOI layers on both sides of the gate electrode. A non-volatile memory cell is formed of the gate insulating film, the gate electrode, the n-type semiconductor region and the p-type semiconductor region.

According to one embodiment, performances of the semi-conductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols throughout all the drawings for describing the embodiments, and the repetitive description thereof is omitted. Note that hatching is used in some cases even in a plan view so as to make the drawings easy to see.

First Embodiment

<Layout Configuration Example of Semiconductor Chip>

First, a layout configuration example of a semiconductor chip having the semiconductor device of the first embodiment will be described. The semiconductor chip having the semiconductor device of the present first embodiment is obtained by mixedly mounting the semiconductor device, on which an SOTB-MISFET is mounted, formed on an SOI substrate, and a non-volatile memory.

The semiconductor chip having the semiconductor device of the present first embodiment is provided with a low-breakdown-voltage MISFET that is driven by a comparatively low voltage, a high-breakdown-voltage MISFET that is driven by a comparatively high voltage so as to allow a high-voltage driving operation, and a rewritable non-volatile memory cell. In a cross-sectional structure of a semiconductor device to be explained later with reference to FIG. 3, note that an n-channel-type low-breakdown-voltage MISFET, a p-channel-type low-breakdown-voltage MISFET and a non-volatile memory cell will be described.

Figure 1:
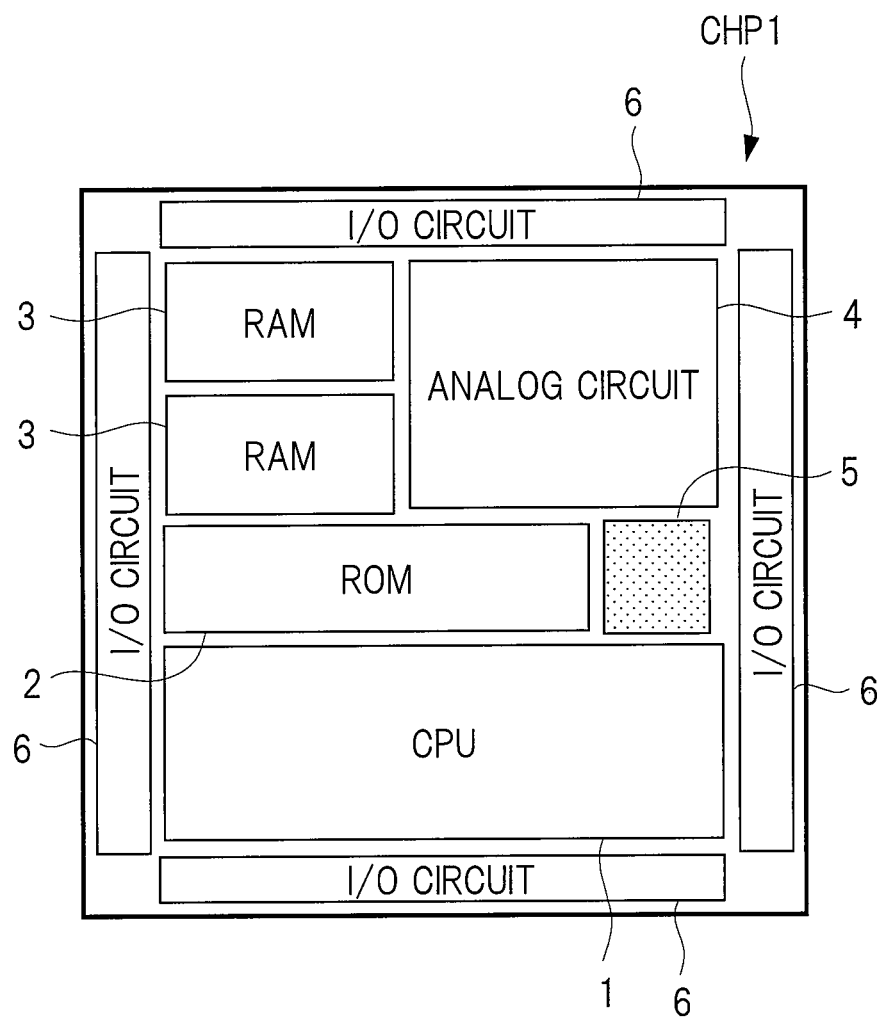
FIG. 1 is a view showing a layout configuration example of a semiconductor chip according to a first embodiment.

FIG. 1 is a view showing a layout configuration example of a semiconductor chip in the first embodiment. As shown in FIG. 1, a semiconductor chip CHP1 has a CPU 1, a ROM (Read Only Memory) 2, a RAM 3, an analog circuit 4, a non-volatile memory 5 and an I/O (Input/Output) circuit 6.

The CPU 1, which is also referred to as a central processing unit, corresponds to a core unit such as a computer. The CPU 1 reads out a command from a storage unit and decrypts the command, and performs various calculations and controls based on the decrypted result, so that high speed processing is required. Therefore, for the MISFET forming the CPU 1, relatively large current driving power among elements formed in the semiconductor chip CHP 1 is required. That is, the CPU 1 is configured of a low-breakdown-voltage MISFET.

The ROM 2 is a memory in which its storage information is fixed and cannot be changed, and is also referred to as a readout only memory. The configuration types of the ROM 2 are a NAND type in which MISFETs are connected in series and a NOR type in which MISFETs are connected in parallel. While the integration density is emphasized in the NAND type, while the NOR type is used for the purpose of emphasizing the operation speed in most cases. Since the high speed operation is required also for the ROM 2, relatively large current driving power is required for the MISFET forming the ROM 2. That is, the ROM 2 is configured of the low-breakdown-voltage MISFET.

The RAM 3 is a memory for the stored information at random, that is, a memory from which the stored information can be read out and into which information to be stored can be newly written as needed, and is also referred to as an as-needed writing and reading (random access) memory. The RAM 3 serving as an IC memory includes two types of a DRAM (Dynamic RAM) using a dynamic circuit and an SRAM (Static RAM) using a static circuit. The DRAM is a random access memory for which a storage retaining operation is required, and the SRAM is a random access memory for which no storage retaining operation is required. Since high-speed operations are required also for these RAMs, relatively large current driving power is required for the MISFETs configuring the RAM 3. That is, the RAM 3 is configured of a low-breakdown-voltage MISFET.

The analog circuit 4 is a circuit which handles signals of temporarily continuously changed voltage and current, that is, analog signals, and is configured of, for example, an amplification circuit, a conversion circuit, a modulation circuit, an oscillation circuit, a power-supply circuit, etc. For these analog circuits 4, a high-breakdown-voltage MISFET having a relatively high breakdown-voltage among elements formed in the semiconductor chip CHP1 is used.

The non-volatile memory 5 is one type of a non-volatile memory that is electrically rewritable in both of writing and erasing operations, and is also referred to as a programmable read-only memory in which the electrical erasing operation is possible. In the present first embodiment, the non-volatile memory 5 is configured of a memory cell MC (see FIG. 3 described later) which serves as a non-volatile memory cell having a SONGS film. For the writing operation and erasing operation of the memory cells MC, for example, an FN (Fowler-Nordheim) tunnel effect is utilized.

The I/O circuit 6 is an input/output circuit, and corresponds to a circuit for use in outputting data from the inside of the semiconductor chip CHP1 to an apparatus externally connected to the outside of the semiconductor chip CHP1 and in inputting data into the semiconductor chip CHP1 from an apparatus externally connected to the semiconductor chip CHP1. The I/O circuit 6 is configured of a high-breakdown-voltage MISFET having a relatively high breakdown-voltage.

<Circuit Block Configuration of Non-Volatile Memory>

Figure 2:
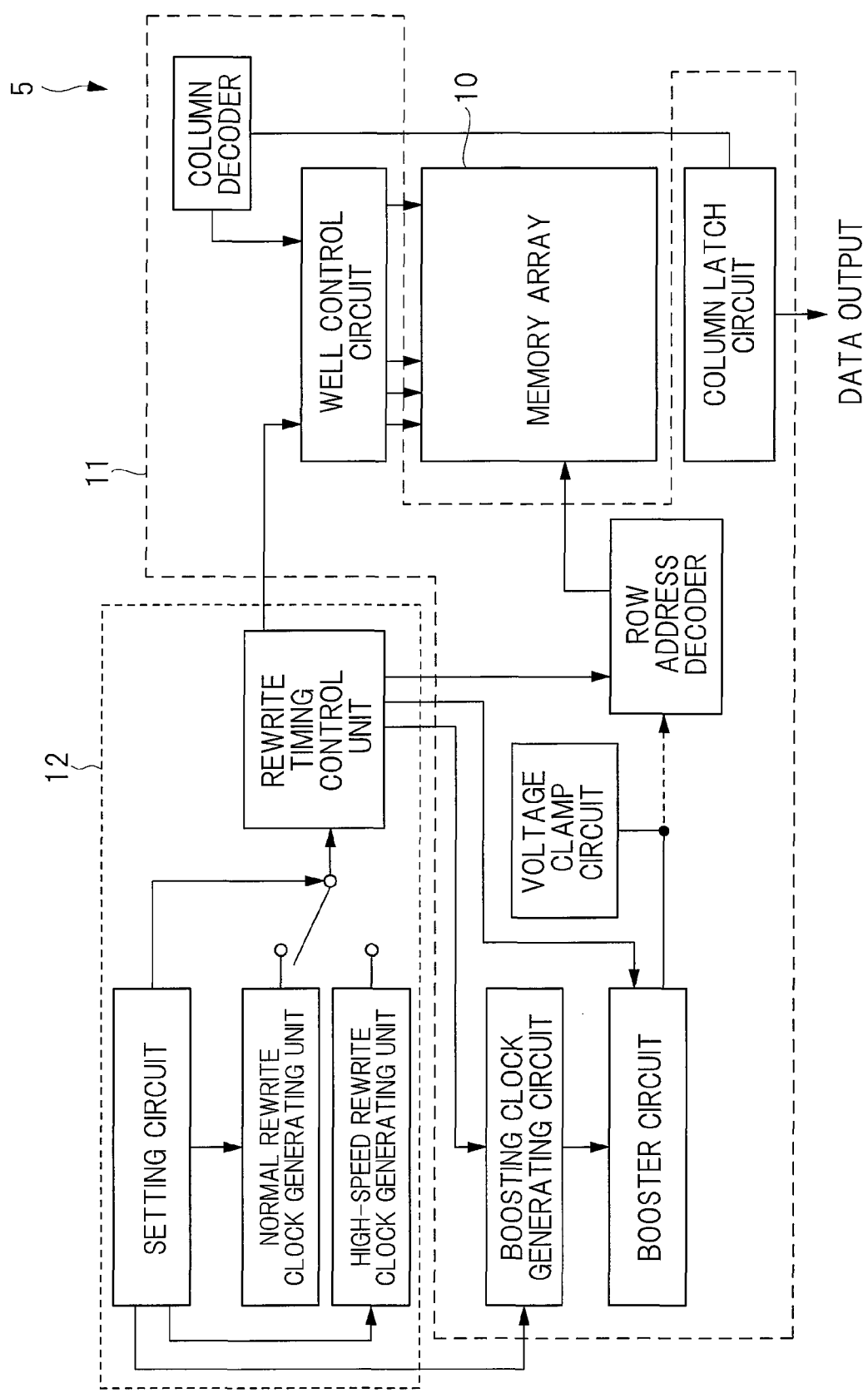
FIG. 2 is a view showing one example of a circuit block configuration of a non-volatile memory.

Next, FIG. 2 is a diagram illustrating an example of a circuit block configuration of the non-volatile memory. In FIG. 2, the non-volatile memory 5 includes a memory array 10, a direct peripheral circuit portion 11, and an indirect peripheral circuit portion 12.

The memory array 10 corresponds to a storage unit of the non-volatile memory 5, and includes a plurality of memory cells being vertically and horizontally arranged in a two-dimensional shape (array form). The memory cell is a circuit configured to store unit information for one bit, and is configured of the memory cell MC (see FIG. 3 described later) serving as a storage unit.

The direct peripheral circuit portion 11 is a circuit configured to drive the memory array 10, that is, a drive circuit, and includes, for example, a booster circuit to generate multiple times of voltage from a power-supply voltage, a boosting clock generating circuit, a voltage clamp circuit, a column decoder and a row address decoder to select a row or a column, a column latch circuit, a well control circuit, and others. The MISFET configuring the direct peripheral circuit portion 11 is formed of a MISFET which requires a relatively high breakdown voltage among the elements formed in the semiconductor chip CHP1.

In addition, the indirect peripheral circuit portion 12 is a rewrite control circuit of the memory array, and includes a setting circuit, a normal rewrite clock generating unit, a high-speed rewrite clock generating unit, a rewrite timing control unit, and others. The MISFET configuring the indirect peripheral circuit portion 12 is formed of a low-breakdown-voltage MISFET which is driven with a relatively low voltage and is capable of a high-speed operation among the elements formed in the semiconductor chip CHP1.

<Structure of Semiconductor Device>

Figure 3:
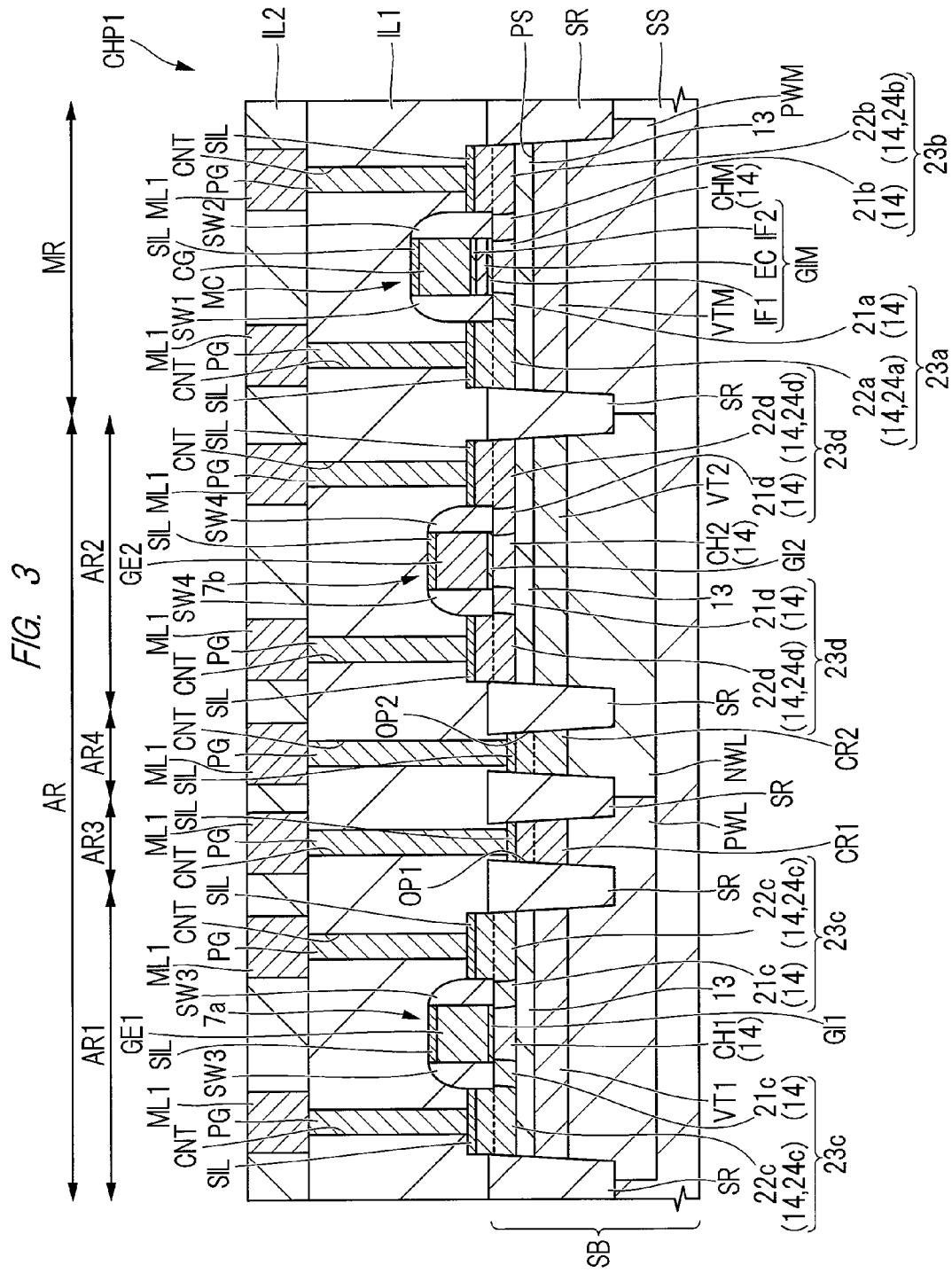
FIG. 3 is a cross-sectional view of a principal part of a semiconductor device of the first embodiment.

Next, a structure of the semiconductor chip CHP1 serving as the semiconductor device of the first embodiment will be described with reference to the drawings. FIG. 3 is a cross-sectional view of a principal part of the semiconductor device of the embodiment.

As illustrated in FIG. 3, the semiconductor chip CHP1 serving as the semiconductor device of the first embodiment has a memory formation region MR and a main circuit formation region AR. In addition, the main circuit formation region AR has low-breakdown-voltage MISFET formation regions AR1 and AR2.

The memory cell of the non-volatile memory 5 illustrated in FIG. 1 is formed in the memory formation region MR, and this memory cell is formed of a memory cell MC having a SONGS film.

The memory cell MC in the semiconductor device according to the present first embodiment has a structure that is different from that of a normal field effect transistor in that one of two semiconductor regions corresponding to the source region and the drain region is an n-type semiconductor region and the other is a p-type semiconductor region. However, since the memory cell MC of the present first embodiment is similar to a normal field effect transistor in three terminal elements obtained by electrically connecting the gate electrode, the source electrode, and the drain electrode, it is referred to as "transistor" for convenience of explanation.

Note that the "p-type" means a conductivity type using a hole as a major charge carrier, and the "n-type" means a conductivity type using an electron as the major charge carrier which is different from the p-type.

MISFETs 7a and 7b serving as the low-breakdown-voltage MISFETs, which require a large current driving force in order to enable the high-speed operation, are formed in the low-breakdown-voltage MISFET formation regions AR1 and AR2. The MISFET 7a is an n-channel-type MISFET, and the MISFET 7b is a p-channel-type MISFET. As such regions in which the MISFETs 7a and 7b serving as the low-breakdown-voltage MISFETs are formed, for example, formation regions of CPU1, ROM2, RAM3 or others are cited. The MISFETs 7a and 7b serving as the low-breakdown-voltage MISFETs are operated by, for example, a power supply voltage of about 1.5 V.

Moreover, in the high-breakdown-voltage MISFET formation region (illustration is omitted), a high-breakdown-voltage MISFET is formed. As such a region in which the high-breakdown-voltage MISFET is formed, for example, a formation region for an analog circuit 4, a region in which an I/O circuit 6 is formed, or others is cited. The high-breakdown-voltage MISFET is operated by, for example, a power supply voltage of about 5V.

As shown in FIG. 3, the semiconductor chip CHP1 has an SOI substrate SB serving as a semiconductor substrate. The SOI substrate SB has a base body SS serving as a semiconductor substrate, a BOX layer 13 serving as an insulation layer, that is, a buried oxide film, and a SOI layer 14 serving as a semiconductor layer. The BOX layer 13 is formed on an upper surface PS serving as a main surface of the base body SS, and the SOI layer 14 is formed on the BOX layer 13.

The base body SS is made of, for example, a silicon (Si) substrate, and more preferably, is made of a silicon single crystal substrate. The BOX layer 13 is made of, for example, a silicon oxide film. The thickness of the BOX layer 13 is, for example, about 10 to 40 nm. The SOI layer 14 is made of, for example, a silicon single crystal layer. The thickness of the SOI layer 14 is, for example, about 10 to 20 nm.

In an upper surface PS of the base body SS, an element separation region SR for separating elements is formed. Moreover, active regions separated by the element separation region SR are the memory formation region MR and the low-voltage breakdown MISFET formation regions AR1 and AR2, respectively. That is, the memory formation region MR and the low-voltage breakdown MISFET formation regions AR1 and AR2 are partial regions on the upper surface PS of the SOI substrate SB, respectively. A p-type well PWM is formed in the memory formation region MR on the upper surface PS side of the base body SS. Similarly, a p-type well PWL is formed in the low-breakdown-voltage MISFET formation region AR1 on the upper surface PS side of the base body SS, and an n-type well NWL is formed in the low-breakdown-voltage MISFET formation region AR2 on the upper surface PS side of the base body SS.

Note that the BOX layer 13 is formed on the base body SS in the memory formation region MR and the low-breakdown-voltage MISFET formation regions AR1 and AR2.

Next, the memory cell MC serving as a non-volatile memory cell having an SONOS film will be described. The memory cell MC has the p-type well PWM, a semiconductor region VTM, the BOX layer 13, a channel region CHM, a gate insulating film GIM, a gate electrode CG, sidewall spacers SW1 and SW2, an $n^-$-type semiconductor region 21a, a $p^-$-type semiconductor region 21b, an $n^+$-type semiconductor region 22a and a $p^+$-type semiconductor region 22b. That is, the non-volatile memory cell is formed of the gate insulating film GIM, the gate electrode CG, the $n^-$-type semiconductor region 21a, the $p^-$-type semiconductor region 21b, the $n^+$-type semiconductor region 22a and the $p^+$-type semiconductor region 22b. Moreover, the gate insulating film GIM includes an insulating film IF1 made of, for example, a silicon oxide film, a charge storage film EC serving as an insulating film made of, for example, a silicon nitride film, and an insulating film IF2 made of, for example, a silicon oxide film, and is referred to also as an ONO (Oxide-Nitride-Oxide) film. Note that the "$n^-$-type" and the "$n^+$-type" mean a conductivity type using an electron as the major charge carrier, and the "$p^-$-type" and the "$p^+$-type" mean a conductivity type using a hole as a major charge carrier.

In the memory formation region MR, the p-type well PWM is formed in the upper layer portion of the base body SS, that is, on the upper surface PS side of the base body SS. The p-type well PWM is a p-type semiconductor region in which a p-type impurity such as boron (B) is introduced. The p-type impurity concentration in the p-type well PWM can be set to, for example, about $5 \times 10^{17}$ to $5 \times 10^{18}$ cm$^{-3}$.

The semiconductor region VTM is formed in the upper layer portion of the p-type well PWM. The semiconductor region VTM is a p-type semiconductor region in which a p-type impurity such as boron (B) is introduced, and is a semiconductor region used for adjusting the operation voltage of the memory cell MC. The p-type impurity concentration of the semiconductor region VTM can be set to be higher than the p-type impurity concentration of, for example, the p-type well PWM.

In the memory formation region MR, the insulating film IF1 is formed on the SOI layer 14, the charge storage film EC is formed on the insulating film IF1, an insulating film IF2 is formed on the charge storage film EC, and a gate electrode CG made of a conductor film is formed on the insulating film IF2. That is, the gate insulating film GIM is formed on the SOI layer 14, and the gate electrode CG is formed on the gate insulating film GIM. The gate insulating film GIM has the charge storage film EC serving as the charge storage portion formed therein. The gate electrode CG is made of, for example, a polycrystalline silicon film, that is, a polysilicon film.

In the SOI layer 14 of a portion located below the gate electrode CG, the channel region CHM serving as a semiconductor region is formed. The channel region CHM is a p-type semiconductor region in which a p-type impurity such as boron is introduced or a semiconductor region in which no impurity is introduced and which is kept in an intrinsic state that exerts neither the n-type conductivity nor the p-type conductivity. Moreover, even when the channel region CHM is a p-type semiconductor region, the p-type impurity concentration in the channel region CHM is lower than the p-type impurity concentration of both of the p⁻-type semiconductor region 21b and the p⁺-type semiconductor region 22b. When the channel region CHM contains a p-type impurity, the p-type impurity concentration in the channel region CHM can be set to, for example, about $5 \times 10^{15}$ to $5 \times 10^{16}$ cm⁻³.

On a side surface of the gate electrode CG on one side (left side in FIG. 3) when seen in a plan view, for example, the sidewall spacer SW1 serving as a side wall portion made of an insulating film is formed. Moreover, on a side surface of the gate electrode CG on a side opposite to the one side, the sidewall spacer SW2 serving as a side wall portion made of an insulating film is formed. That is, the sidewall spacer SW2 is formed on the side of the gate electrode CG opposite to the side on which the sidewall spacer SW1 is formed.

In the SOI layer 14 of a portion located below the sidewall spacer SW1, the n⁻-type semiconductor region 21a is formed. Moreover, when seen in a plan view, in the SOI layer 14 of a portion located on the side opposite to the gate electrode CG across the n⁻-type semiconductor region 21a, the n⁺-type semiconductor region 22a is formed. The n⁺-type semiconductor region 22a is made in contact with the n⁻-type semiconductor region 21a, and the impurity concentration of the n⁺-type semiconductor region 22a is higher than the impurity concentration of the n⁻-type semiconductor region 21a. An LDD (Lightly Doped Drain) configuration is formed of the n⁻-type semiconductor region 21a and the n⁺-type semiconductor region 22a. The n-type impurity concentration of the n⁺-type semiconductor region 22a can be set to, for example, about $5 \times 10^{19}$ to $5 \times 10^{20}$ cm⁻³ so that the n-type impurity concentration of the n⁻-type semiconductor region 21a can be made lower than the n-type impurity concentration of the n⁺-type semiconductor region 22a.

On the other hand, in the SOI layer 14 of a portion located below the sidewall spacer SW2, the p⁻-type semiconductor region 21b is formed. Moreover, when seen in a plan view, in the SOI layer 14 of a portion located on the side opposite to the gate electrode CG across the p⁻-type semiconductor region 21b, the p⁺-type semiconductor region 22b is formed. The p⁺-type semiconductor region 22b is made in contact with the p⁻-type semiconductor region 21b, and the impurity concentration of the p⁺-type semiconductor region 22b is higher than the impurity concentration of the p⁻-type semiconductor region 21b. An LDD (Lightly Doped Drain) configuration is formed of the p⁻-type semiconductor region 21b and the p⁺-type semiconductor region 22b. The p-type impurity concentration of the p⁺-type semiconductor region 22b can be set to, for example, about $5 \times 10^{19}$ to $5 \times 10^{20}$ cm⁻³ so that the p-type impurity concentration of the p⁻-type semiconductor region 21b can be made lower than the p-type impurity concentration of the p⁺-type semiconductor region 22b.

That is, in the present first embodiment, in the memory formation region MR when seen in a plan view, in the SOI layer 14 of a portion located on one side (left side in FIG. 3) of the gate electrode CG, an n-type semiconductor region 23a including the n⁻-type semiconductor region 21a and the n⁺-type semiconductor region 22a is formed. Moreover, in the present first embodiment, in the memory formation region MR when seen in a plan view, in the SOI layer 14 of a portion located on the side of the gate electrode CG opposite to the one side (right side in FIG. 3), a p-type semiconductor region 23b including the p⁻-type semiconductor region 21b and the p⁺-type semiconductor region 22b is formed. The p-type impurity concentration of the p-type semiconductor region 23b is higher than the p-type impurity concentration of the channel region CHM.

In the memory formation region MR when seen in a plan view, on the SOI layer 14 of a portion located on the side opposite to the gate electrode CG across the sidewall spacer SW1, a semiconductor film 24a made of a silicon film grown by a selective epitaxial growth may be formed. Moreover, the n⁺-type semiconductor region 22a may also be formed in the semiconductor film 24a. At this time, when seen in a plan view, the n⁺-type semiconductor region 22a is formed in the SOI layer 14 of a portion located on one side of the gate electrode CG and the semiconductor film 24a.

Furthermore, in the memory formation region MR when seen in a plan view, on the SOI layer 14 of a portion located on the side opposite to the gate electrode CG across the sidewall spacer SW2, a semiconductor film 24b made of a silicon film grown by a selective epitaxial growth may be formed. Moreover, the p⁺-type semiconductor region 22b may also be formed in the semiconductor film 24b. At this time, when seen in a plan view, the p⁺-type semiconductor region 22b is formed in the SOI layer 14 of a portion located on the side of the gate electrode CG opposite to the one side and the semiconductor film 24a.

In the upper surface of the gate electrode CG, the upper surface of the n⁺-type semiconductor region 22a and the upper surface of the p⁺-type semiconductor region 22b, a silicide film SIL is formed in order to reduce the resistivity.

The insulating film IF1 is made of, for example, a silicon oxide film. For example, when data is stored or erased by implanting electrons from the SOI layer 14 to the charge storage film EC through the insulating film IF1, the insulating film IF1 functions as a tunnel insulating film.

The charge storage film EC is an insulating film which is provided as a charge storage portion to store the charge contributing to the data storage, and is made of, for example, the silicon nitride. Therefore, the gate insulating film GIM includes the charge storage film EC as the charge storage portion therein. Moreover, the insulating film IF2 is made of, for example, a silicon oxide film.

Next, the n-channel MISFET 7a serving as a low-breakdown-voltage MISFET will be described. The MISFET 7a has the p-type well PWL, a semiconductor region VT1, the BOX layer 13, a channel region CH1, a gate insulating film GI1, a gate electrode GE1, a sidewall spacer SW3, an n⁻-type semiconductor region 21c, and a n⁺-type semiconductor region 22c. That is, the MISFET 7a is formed of the gate insulating film GI1, the gate electrode GE1, the n⁻-type semiconductor region 21c, and the n⁺-type semiconductor region 22c.

The p-type well PWL is formed in the low-breakdown-voltage MISFET formation region AR1 in the upper layer portion of the base body SS, that is, on the upper surface PS side of the base body SS. The p-type well PWL is a p-type semiconductor region in which a p-type impurity such as boron (B) is introduced. The p-type impurity concentration in the p-type well PWL can be set to, for example, about $5 \times 10^{17}$ to $5 \times 10^{18}$ cm⁻³.

The semiconductor region VT1 is formed in the upper layer portion of the p-type well PWL. The semiconductor region VT1 is a p-type semiconductor region in which a p-type impurity such as boron (B) is introduced, and is a semiconductor region used for adjusting the threshold voltage of the MISFET 7a. The p-type impurity concentration of the semiconductor region VT1 can be set to be higher than the p-type impurity concentration of, for example, the p-type well PWL.

In the low-breakdown-voltage MISFET formation region AR1, the insulating film GI1 is formed on the SOI layer 14, and a gate electrode GE1 is formed on the gate insulating film GI1. The gate insulating film GI1 is made of, for example, a silicon oxide film. The gate electrode GE1 is made of, for example, a polysilicon film.

In the SOI layer 14 of a portion located below the gate electrode GE1, the channel region CH1 is formed. The channel region CH1 is a p-type semiconductor region in which a p-type impurity such as boron is introduced or a semiconductor region in which no impurity is introduced and which is kept in an intrinsic state that exerts neither the n-type conductivity nor the p-type conductivity. When the channel region CH1 contains a p-type impurity, the p-type impurity concentration in the channel region CH1 can be set to, for example, about $5 \times 10^{15}$ to $5 \times 10^{16}$ cm$^{-3}$.

On both side surfaces of the gate electrode GE1 when seen in a plan view, for example, the sidewall spacer SW3 serving as a side wall portion made of an insulating film is formed.

In the SOI layer 14 of a portion located below the sidewall spacer SW3, the n$^-$-type semiconductor region 21c is formed. Moreover, on each of both sides of the gate electrode GE1 when seen in a plan view, in the SOI layer 14 of a portion located on the side opposite to the gate electrode GE1 across the n$^-$-type semiconductor region 21c, the n$^+$-type semiconductor region 22c is formed. The n$^+$-type semiconductor region 22c is made in contact with the n$^-$-type semiconductor region 21c, and the impurity concentration of the n$^+$-type semiconductor region 22c is higher than the impurity concentration of the n$^-$-type semiconductor region 21c. An n-type semiconductor region 23c having an LDD (Lightly Doped Drain) configuration is formed of the n$^-$-type semiconductor region 21c and the n$^+$-type semiconductor region 22c. The n-type impurity concentration of the n$^+$-type semiconductor region 22c can be set to, for example, about $5 \times 10^{19}$ to $5 \times 10^{20}$ cm$^{-3}$ so that the n-type impurity concentration of the n$^-$-type semiconductor region 21c can be made lower than the n-type impurity concentration of the n$^+$-type semiconductor region 22c.

Furthermore, in the low-breakdown-voltage formation region AR1 when seen in a plan view, on the SOI layer 14 of a portion located on the side opposite to the gate electrode CG across the sidewall spacer SW3, a semiconductor film 24c made of a silicon film grown by a selective epitaxial growth may be formed. Moreover, the n$^+$-type semiconductor region 22c may also be formed in the semiconductor film 24c. At this time, when seen in a plan view, the n$^+$-type semiconductor region 22c is formed in the SOI layer 14 of a portion located on the both sides of the gate electrode CG and the semiconductor film 24c.

In the upper surface of the gate electrode GE1 and the upper surface of the n$^+$-type semiconductor region 22c, a silicide film SIL is formed in order to reduce the resistivity.

When seen in a plan view, the p-type well PWL is formed from the low-breakdown-voltage MISFET formation region AR1 to the region AR3 on outside of the low-breakdown-voltage MISFET formation region AR1. Between the low-breakdown-voltage MISFET formation region AR1 and the region AR3, an element separation region SR is formed. In the region AR3, the SOI layer 14 and the BOX layer 13 located between two adjacent element separation regions SR are removed to form an opening OP1, and a contact region CR1 serving as a p-type semiconductor region is formed on the upper layer portion of the p-type well PWL and the p-type well PWL of portions exposed from the bottom of the opening OP1. In the region AR3, the contact region CR1 includes the semiconductor film 24c and the semiconductor region VT1 formed on the p-type well PWL of portions exposed from the bottom of the opening OP1 (see FIG. 26 described later). Therefore, in the region AR3, a plug PG is formed on the contact region CR1, and the p-type well PWL is electrically connected to the plug PG via the contact region CR1. Note that the silicide film SIL is formed in the upper surface of the contact region CR1.

Next, the p-channel MISFET 7b serving as a low-breakdown-voltage MISFET will be described. The MISFET 7b has the n-type well NWL, a semiconductor region VT2, the BOX layer 13, a channel region CH2, a gate insulating film GI2, a gate electrode GE2, a sidewall spacer SW4, a p$^-$-type semiconductor region 21d, and a p$^+$-type semiconductor region 22d. That is, the MISFET 7b is formed of the gate insulating film GI2, the gate electrode GE2, the p$^-$-type semiconductor region 21d, and the p$^+$-type semiconductor region 22d.

The n-type well NWL is formed in the low-breakdown-voltage MISFET formation region AR2 in the upper layer portion of the base body SS, that is, on the upper surface PS side of the base body SS. The n-type well NWL is an n-type semiconductor region in which an n-type impurity such as phosphorous (P) or arsenic (As) is introduced. The n-type impurity concentration in the n-type well NWL can be set to, for example, about $5 \times 10^{17}$ to $5 \times 10^{18}$ cm$^{-3}$.

The semiconductor region VT2 is formed in the upper layer portion of the n-type well NWL. The semiconductor region VT2 is an n-type semiconductor region in which an n-type impurity such as phosphorous (P) or arsenic (As) is introduced, and is a semiconductor region used for adjusting the threshold voltage of the MISFET 7b. The n-type impurity concentration of the semiconductor region VT2 can be set to be higher than the n-type impurity concentration of, for example, the n-type well NWL.

In the low-breakdown-voltage MISFET formation region AR2, the insulating film GI2 is formed on the SOI layer 14, and a gate electrode GE2 is formed on the gate insulating film GI2. The gate insulating film GI2 is made of, for example, a silicon oxide film. The gate electrode GE2 is made of, for example, a polysilicon film.

In the SOI layer 14 of a portion located below the gate electrode GE2, the channel region CH2 is formed. The channel region CH2 is an n-type semiconductor region in which an n-type impurity such as phosphorous (P) or arsenic (As) is introduced or a semiconductor region in which no impurity is introduced and which is kept in an intrinsic state that exerts neither the n-type conductivity nor the p-type conductivity. When the channel region CH2 contains an n-type impurity, the n-type impurity concentration in the channel region CH2 can be set to, for example, about $5 \times 10^{15}$ to $5 \times 10^{16}$ cm$^{-3}$.

In both side surfaces of the gate electrode GE2 when seen in a plan view, for example, the sidewall spacer SW4 serving as a side wall portion made of an insulating film is formed.

In the SOI layer 14 of a portion located below the sidewall spacer SW4, the p$^-$-type semiconductor region 21d is formed. Moreover, on each of both sides of the gate electrode GE2 when seen in a plan view, in the SOI layer 14 of a portion located on the side opposite to the gate electrode GE2 across the p$^-$-type semiconductor region 21d, the p$^+$-type semiconductor region 22d is formed. The p$^+$-type semiconductor region 22d is made in contact with the p⁻-type semiconductor region 21d, and the impurity concentration of the p⁺-type semiconductor region 22d is higher than the impurity concentration of the p⁻-type semiconductor region 21d. A p-type semiconductor region 23d having an LDD configuration is formed of the p⁻-type semiconductor region 21d and the p⁺-type semiconductor region 22d. The p-type impurity concentration of the p⁺-type semiconductor region 22d can be set to, for example, about $5 \times 10^{19}$ to $5 \times 10^{20}$ cm$^{-3}$ so that the p-type impurity concentration of the p⁻-type semiconductor region 21d can be made lower than the p-type impurity concentration of the p⁺-type semiconductor region 22d.

Furthermore, in the low-breakdown-voltage formation region AR2 when seen in a plan view, on the SOI layer 14 of a portion located on the side opposite to the gate electrode CG across the sidewall spacer SW4, a semiconductor film 24d made of a silicon film grown by a selective epitaxial growth may be formed. Moreover, the p⁺-type semiconductor region 22d may also be formed in the semiconductor film 24d. At this time, when seen in a plan view, the p⁺-type semiconductor region 22d is formed in the SOI layer 14 of a portion located on the both sides of the gate electrode CG and the semiconductor film 24d.

On the upper surface of the gate electrode GE2 and the upper surface of the p⁺-type semiconductor region 22d, a silicide film SIL is formed in order to reduce the resistivity.

When seen in a plan view, the n-type well NWL is formed from the low-breakdown-voltage MISFET formation region AR2 to the region AR4 on outside of the low-breakdown-voltage MISFET formation region AR2. Between the low-breakdown-voltage MISFET formation region AR2 and the region AR4, an element separation region SR is formed. In the region AR4, the SOI layer 14 and the BOX layer 13 located between two adjacent element separation regions SR are removed to form an opening OP2, and a contact region CR2 serving as an n-type semiconductor region is formed in the upper layer portion of the n-type well NWL and on the n-type well NWL of portions exposed from the bottom of the opening OP2. In the region AR4, the contact region CR2 includes the semiconductor film 24d and the semiconductor region VT2 formed on the n-type well NWL of portions exposed from the bottom of the opening OP2 (see FIG. 25 described later). Therefore, in the region AR4, a plug PG is formed on the contact region CR2, and the n-type well NWL is electrically connected to the plug PG via the contact region CR2. Note that the silicide film SIL is formed in the upper surface of the contact region CR2.

On the SOI substrate SB, an interlayer insulating film IL1 is formed so as to cover the memory cell MC and the MISFETs 7a and 7b. The interlayer insulating film IL1 is made of, for example, an insulating film made of, for example, a silicon oxide film, a stacked film of an insulating film made of a silicon nitride film and an insulating film made of a silicon oxide film, or others. The upper surface of the interlayer insulating film IL1 is flattened.

A contact hole CNT is formed in the interlayer insulating film IL1, and a plug PG made of a conductor film is buried in the contact hole CNT. The plug PG is formed of a thin barrier conductor film that is formed on a bottom and a side wall, that is, a side wall surface of the contact hole CNT, and a main conductor film formed on the burrier conductor film so as to bury the contact hole CNT therein. For simplicity of the view, FIG. 3 integrally illustrates the burrier conductor film and the main conductor film configuring the plug PG. Note that the burrier conductor film configuring the plug PG may be formed as, for example, a titanium (Ti) film, a titanium nitride (TiN) film, or a stacked film of them, and the main conductor film configuring the plug PG may be formed as, for example, a tungsten (W) film.

The plug PG is formed on each of the n⁺-type semiconductor regions 22a and 22c, and on the p⁺-type semiconductor regions 22b and 22d, and it is also formed on each of the gate electrodes CG, GE1 and GE2 although illustration is omitted. And, the plug PG is electrically connected to each of the n⁺-type semiconductor regions 22a and 22c, and to each of the p⁺-type semiconductor regions 22b and 22d, and it is also electrically connected to each of the gate electrodes CG, GE1 and GE2 although illustration is omitted.

An interlayer insulating film IL2 is formed on the interlayer insulating film IL1 in which the plug PG is buried, and a wiring ML1 of a first layer is formed in a wiring trench formed in the interlayer insulating film IL2 as a damascene wiring serving as a buried wiring made of, for example, copper (Cu) as a main conductor material. Moreover, on the wiring ML1 of the first layer, an upper layer wiring is also formed as the damascene wiring. However, its illustration and explanation will be omitted here. Furthermore, the wiring ML1 of the first layer and the wiring formed in a layer upper than this are not limited to the damascene wiring, and can be formed also by patterning a wiring conductor film and can be, for example, a tungsten (W) wiring, an aluminum (Al) wiring or others.

<Operation of Non-Volatile Memory Cell>

The semiconductor device according to the present first embodiment is configured as described above, and an operation of the memory cell serving as the non-volatile memory cell included in this semiconductor device will be explained below.

Figure 4:
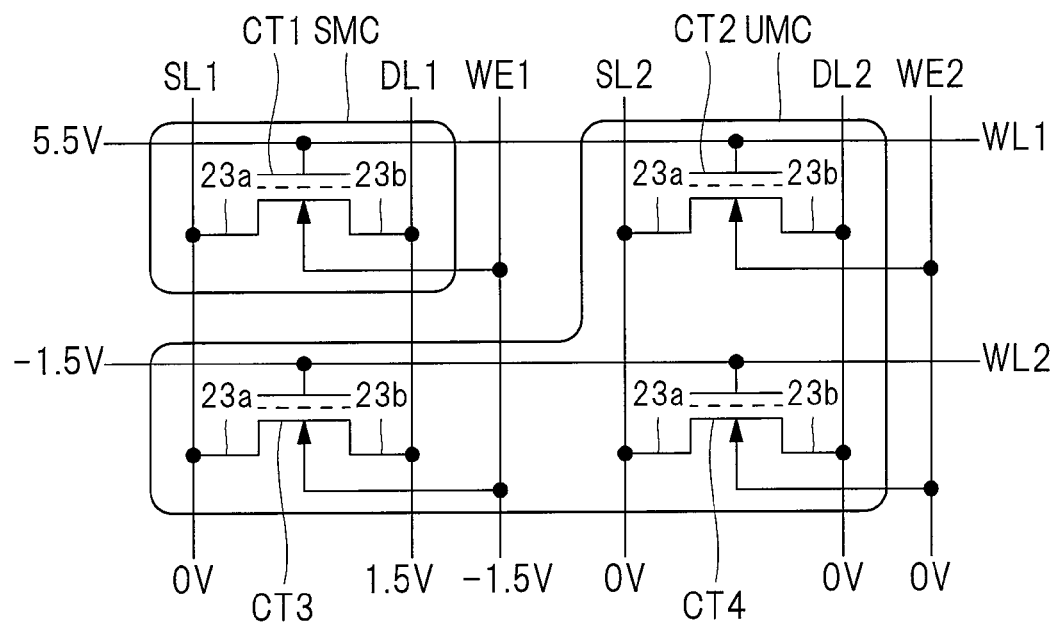
FIG. 4 is an explanatory view showing one example of a memory array structure and operation conditions of a memory cell.
Figure 5:
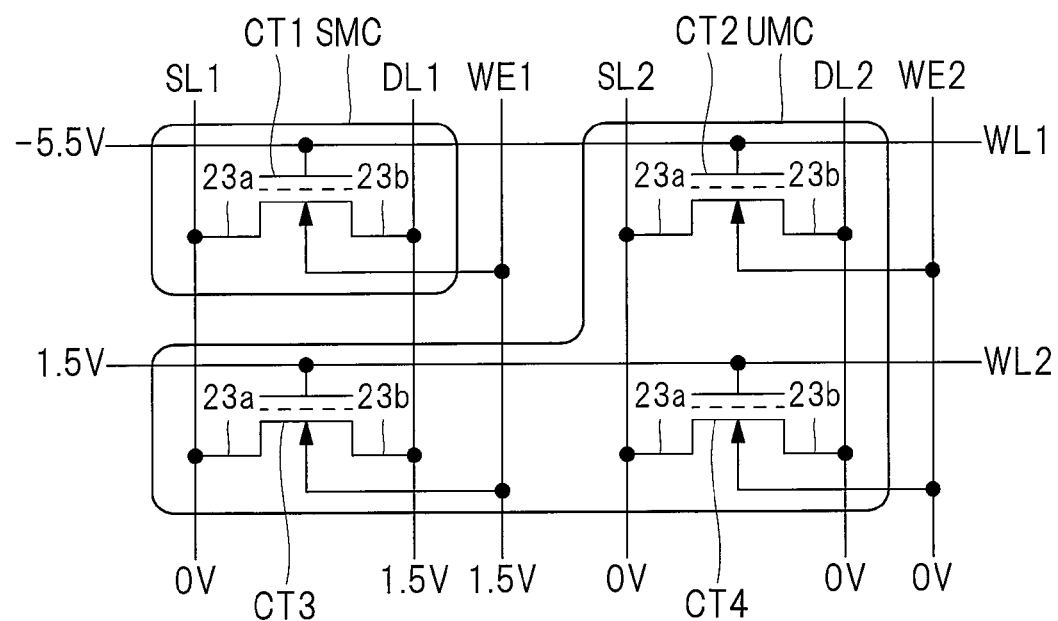
FIG. 5 is an explanatory view showing one example of a memory array structure and operation conditions of a memory cell.
Figure 6:
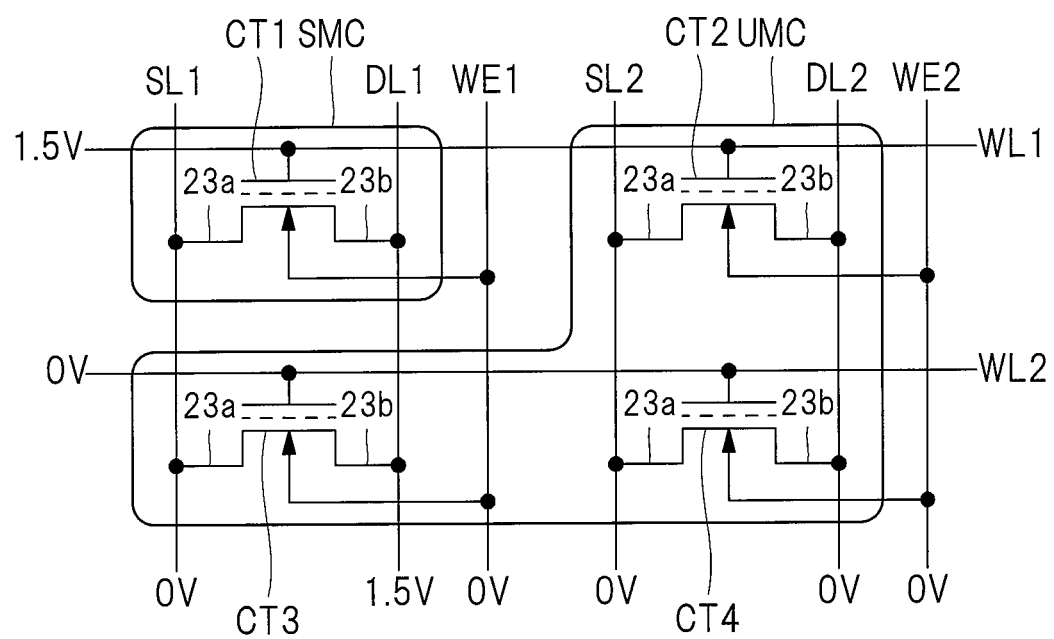
FIG. 6 is an explanatory view showing one example of a memory array structure and operation conditions of a memory cell.

FIGS. 4 to 6 are explanatory diagrams each illustrating an example of a memory array structure of the memory cell and an operating condition (one cell/one transistor). In FIG. 4, each of cell transistors CT1 to CT4 corresponds to the memory cell MC illustrated in FIG. 3. Each gate electrode of the cell transistors CT1 and CT2 is connected to a word line WL1, and each gate electrode of the cell transistors CT3 and CT4 is connected to a word line WL2.

The n-type semiconductor region 23a serving as each source region of the cell transistors CT1 and CT3 is connected to a source line SL1, and the n-type semiconductor region 23a serving as each source region of the cell transistors CT2 and CT4 is connected to a source line SL2. The p-type semiconductor region 23b serving as each drain region of the cell transistors CT1 and CT3 is connected to a data line DL1, and the p-type semiconductor region 23b serving as each drain region of the cell transistors CT2 and CT4 is connected to a data line DL2.

Each back gate (p-type well) of the cell transistors CT1 and CT3 is connected to a well WE1, and each back gate (p-type well) of the cell transistors CT2 and CT4 is connected to a well WE2.

Each of FIGS. 4 to 6 illustrates a case in which the memory cells are arranged in two rows and two columns for simplification of description. However, the arrangement is not limited to this, and more memory cells are practically arranged in a matrix form to configure the memory array. In addition, the memory cell array on the same well and the same word line is configured in, for example, one column of the cell transistor CT1 in FIGS. 4 to 6. However, in a case of a configuration of 8 bits (one byte), cell transistors in eight columns are formed on the same well. In this case, the memory cell is erased and written in a unit of one byte.

Next, write, erase and read operations of the one cell-one transistor memory cell will be explained with reference to FIGS. 4 to 6.

First, with reference to FIG. 4, the writing operation will be explained. For example, in a memory cell to which data is written, that is, in a selected memory cell SMC, a case of data writing in the central transistor CT1 is considered. At this time, as shown in FIG. 4, it is assumed that the electric potential of the well WE1 is −1.5 V, that the electric potential of the word line WL1 is 5.5 V, that the electric potential of the source line SL1 is 0 V and that the electric potential of the data line DL1 is 1.5 V. Then, in the central transistor CT1 included in the selected memory cell SMC, data is written by the implantation of electrons into the charge storage film by, for example, the FN tunnel effect.

At this time, it is assumed that the electric potential of the well WE2 is set to 0 V, that the electric potential of the word line WL2 is set to −1.5 V, that the electric potential of the source line SL2 is set to 0 V, and that the electric potential of the data line DL2 is set to 0 V. Thus, in each of the central transistors CT2 to CT4 included in the memory cells in which no data is written, that is, non-selected memory cells UMC, electrons are prevented from being introduced into the charge storage film so that no data is written therein.

Next, with reference to FIG. 5, the erasing operation will be explained. For example, in a memory cell from which data is erased, that is, in a selected memory cell SMC, a case of data erasing in the central transistor CT1 is considered. At this time, as shown in FIG. 5, it is assumed that the electric potential of the well WE1 is 1.5 V, that the electric potential of the word line WL1 is −5.5 V, that the electric potential of the source line SL1 is 0 V and that the electric potential of the data line DL1 is 1.5 V. Then, in the central transistor CT1 included in the selected memory cell SMC, data is erased by the implantation of holes into the charge storage film by, for example, the FN tunnel effect to cause the disappearance of the electrons stored in the charge storage film.

At this time, it is assumed that the electric potential of the well WE2 is set to 0 V, that the electric potential of the word line WL2 is set to 1.5 V, that the electric potential of the source line SL2 is set to 0 V, and that the electric potential of the data line DL2 is set to 0 V. Thus, in each of the central transistors CT2 to CT4 included in the memory cells in which no data is written, that is, non-selected memory cells UMC, holes are prevented from being introduced into the charge storage film so that no data is erased therefrom.

Next, with reference to FIG. 6, the reading operation will be explained. For example, in a memory cell in which data has been written, that is, in a selected memory cell SMC, a case of data reading from the central transistor CT1 is considered. At this time, as shown in FIG. 6, it is assumed that the electric potential of the well WE1 is 0 V, that the electric potential of the word line WL1 is 1.5 V, that the electric potential of the source line SL1 is 0 V and that the electric potential of the data line DL1 is 1.5 V. Then, data is read from the central transistor CT1 based on an amount of current flowing between the n-type semiconductor region 23a serving as the source region of the cell transistor CT1 and the p-type semiconductor region 23b serving as the drain region thereof.

Moreover, it is assumed that the electric potential of the well WE2 is 0 V, the electric potential of the word line WL2 is 0 V, the electric potential of the source line SL2 is 0 V, and the electric potential of the data line DL2 is 0 V. At this time, although the central transistor CT2 included in the non-selection memory cell UMC is turned on, no electric current does not flow because no electric potential exists between the n-type semiconductor region 23a serving as the source region of the central transistor CT2 and the p-type semiconductor region 23b serving as the drain region. On the other hand, the central transistors CT3 and CT4 included in the non-selection memory cell UMC can be prevented from being turned on.

In the explanations with reference to the above-mentioned FIGS. 4 to 6, an expression "electric potential" is used. However, when the voltage means, for example, an electric potential relative to the ground electric potential, for example, the electric potential of the well WE1 means a voltage to be applied to the well WE1.

<Behaviors of Charge in Writing Operation and Erasing Operation>

Next, behaviors of charge in a writing operation and an erasing operation will be explained with reference to a semiconductor device of a comparative example.

Figure 7:
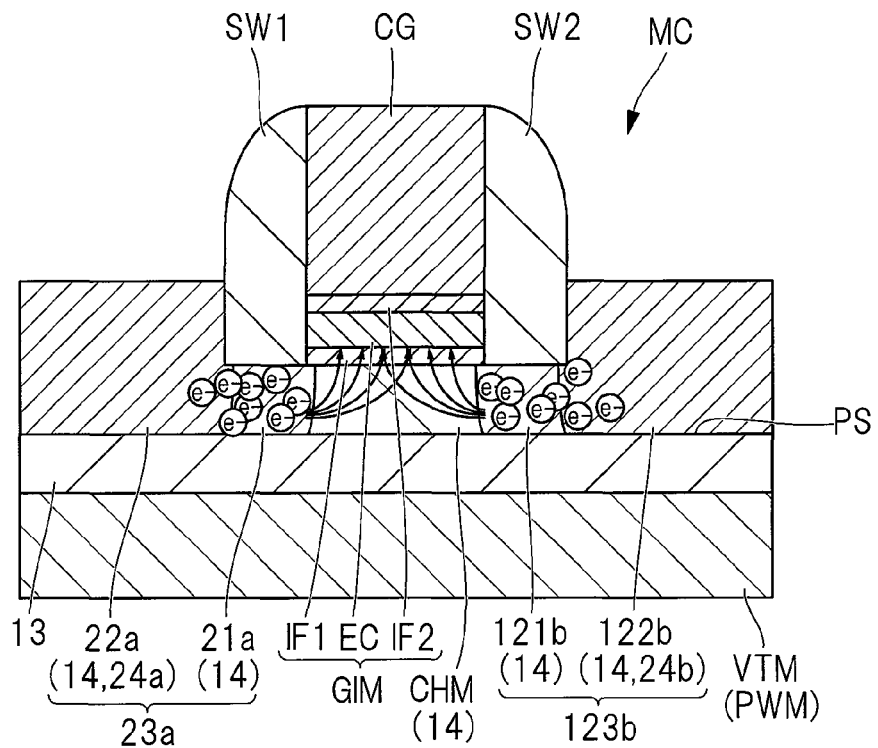
FIG. 7 is a cross-sectional view of a principal part of a semiconductor device of a comparative example.
Figure 8:
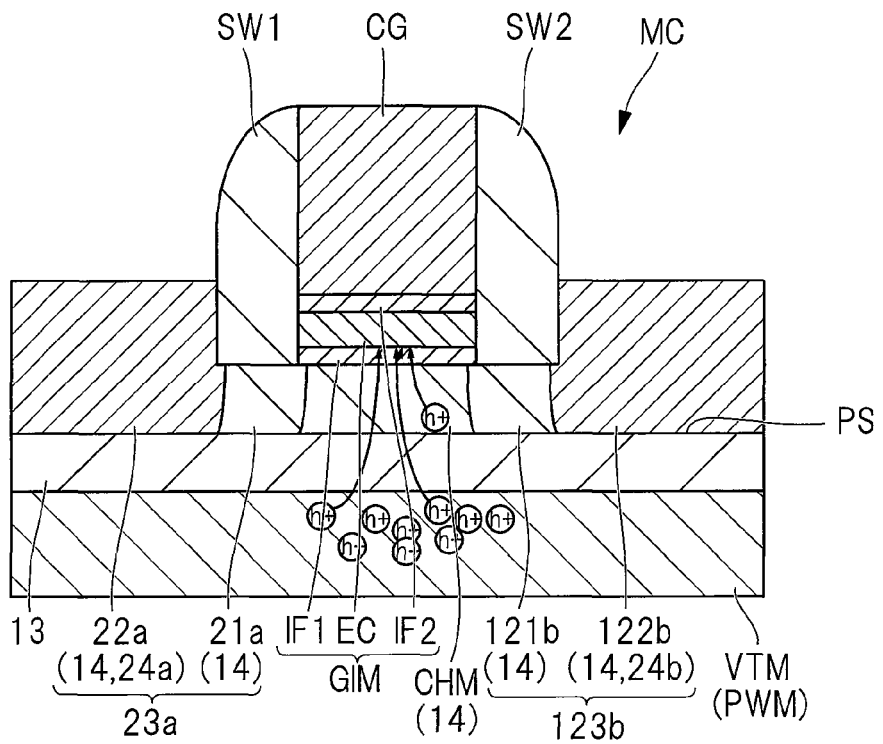
FIG. 8 is a cross-sectional view of a principal part of a semiconductor device of a comparative example.
Figure 9:
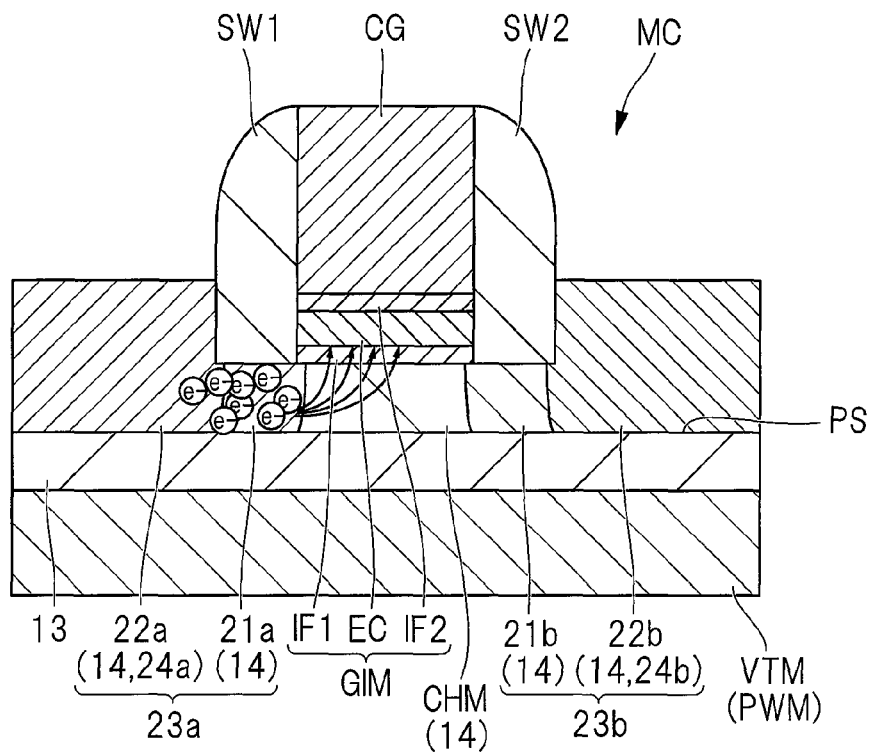
FIG. 9 is a cross-sectional view of a principal part of a semiconductor device of the first embodiment.
Figure 10:
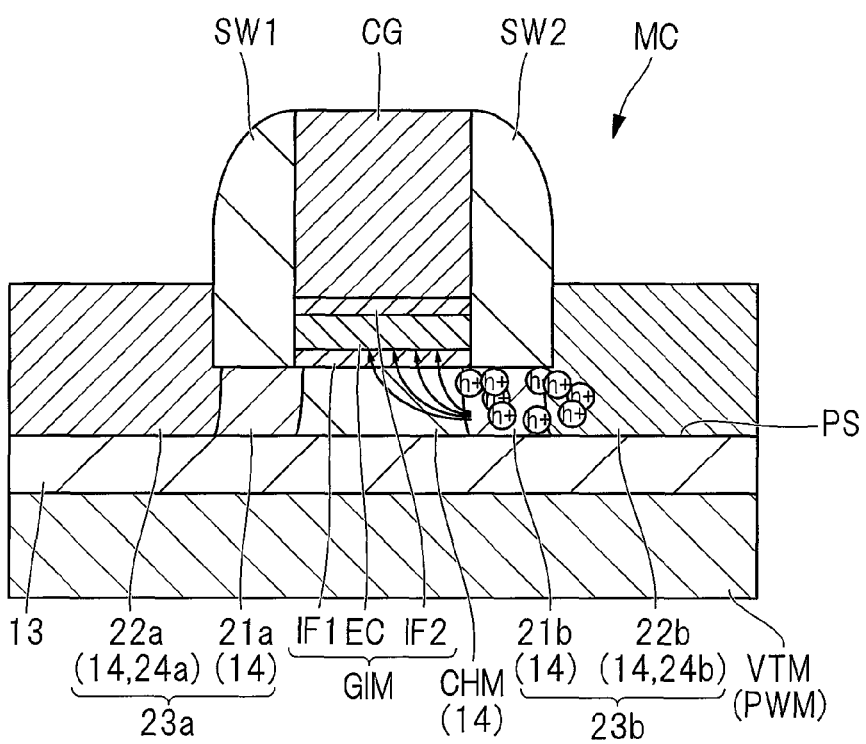
FIG. 10 is a cross-sectional view of a principal part of a semiconductor device of the first embodiment.

FIGS. 7 and 8 are cross-sectional views of a principal part of the semiconductor device of the comparative example. FIGS. 9 and 10 are cross-sectional views of a principal part of the semiconductor device of the first embodiment. FIGS. 7 and 9 schematically show behaviors of charge in a writing operation in the memory cell MC. FIGS. 8 and 10 schematically show behaviors of charge in an erasing operation of the memory cell MC. Note that the periphery of the memory cell MC is shown to be enlarged in FIGS. 7 to 10, and illustration of the silicide film SIL, the interlayer insulating film IL1 and portions above the interlayer insulating film IL1 shown in FIG. 3 is omitted. Moreover, in FIGS. 7 to 10, the electrons are indicated by "e⁻", and the positive holes are indicated by "h⁺".

Figure 11:
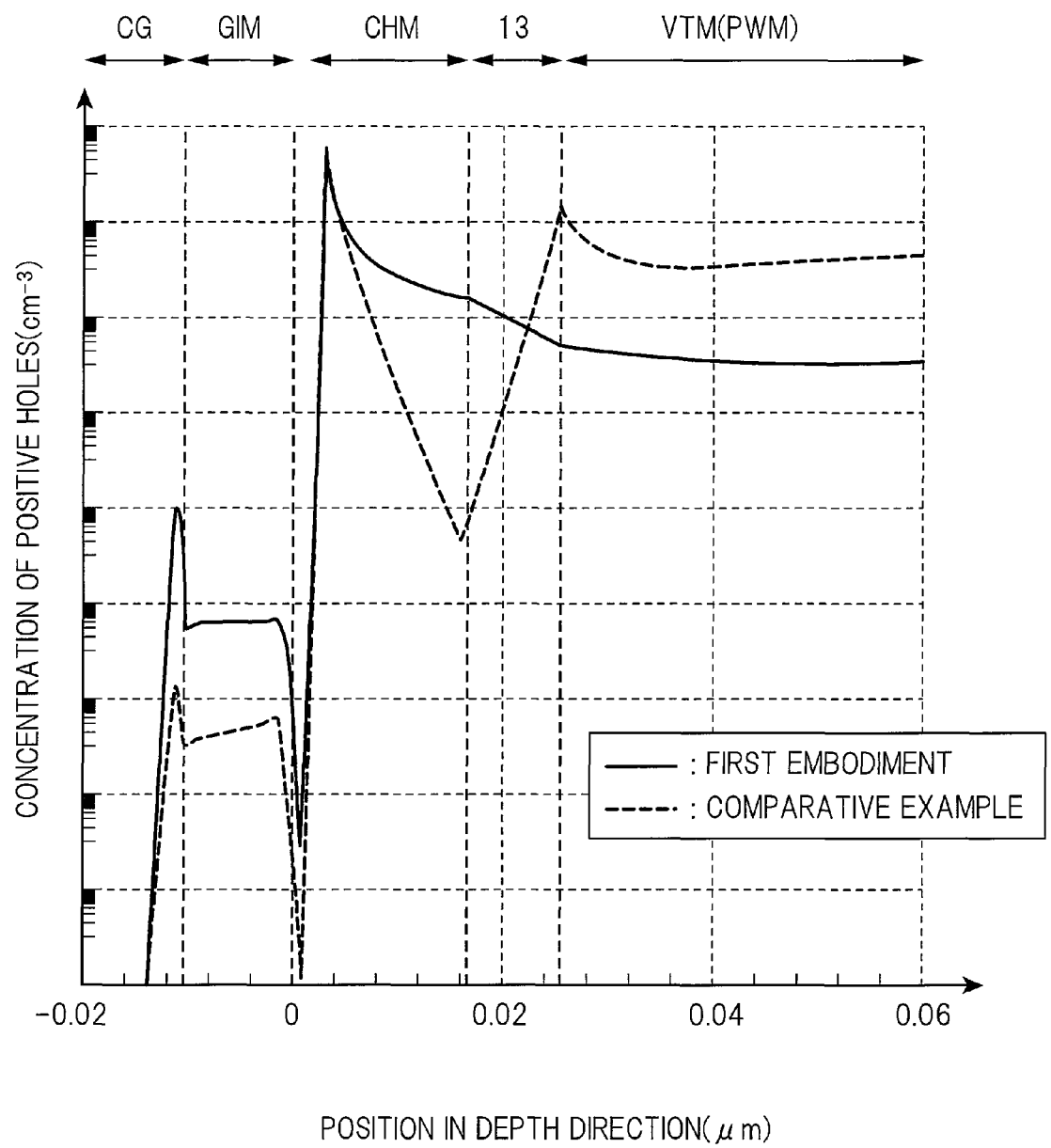
FIG. 11 is a graph showing a position dependency in a depth direction of a positive hole concentration in a semiconductor device of a comparative example and the semiconductor device of the first embodiment.

FIG. 11 is a graph showing a position dependency of the concentration of positive holes in the depth direction in the semiconductor device of the comparative example and the semiconductor device of the first embodiment. FIG. 11 shows a result of the concentration of positive holes of each of the gate electrode CG, the gate insulating film GIM, the channel region CHM, the BOX layer 13 and the p-type well PWM including the semiconductor region VTM, the result being obtained immediately after a voltage for erasing data is applied thereto and being calculated by TCAD (Technology Computer-Aided Design) simulation. In the present first embodiment, note that the calculation is performed under conditions in which the p-type impurity concentration in the p-type semiconductor region 23b is $1 \times 10^{20}$ cm$^{-3}$ or more. Moreover, in the comparative example, the calculation is performed under the same conditions except that an n-type semiconductor region 123b is used in place of the p-type semiconductor region 23b.

The semiconductor device of the comparative example is different from the semiconductor device of the first embodiment in that both of the two semiconductor regions corresponding to the source region and drain region included in the memory cell MC are n-type semiconductor regions.

As shown in FIG. 7, in the memory cell MC, in the SOI layer 14 of a portion located below the sidewall spacer SW2, an n⁻-type semiconductor region 121b is formed in place of the p⁻-type semiconductor region 21b. Moreover, when seen in a plan view, an n⁺-type semiconductor region 122b is formed in the SOI layer 14 of a portion located on the side opposite to the gate electrode CG across the n⁻-type semiconductor region 121b. Therefore, in the comparative example, in the memory formation region MR when seen in a plan view, an n-type semiconductor region 123b including the n⁻-type semiconductor region 121b and the n⁺-type semiconductor region 122b is formed in the SOI layer 14 of a portion located on the side opposite to the one side (right side in FIG. 7) of the gate electrode CG.

Also in the semiconductor device of the comparative example, the case of the writing of the data into the memory cell MC by the same method as the method explained with reference to FIG. 4 is considered. In such a case, when the data is written into the memory cell MC, a voltage that is higher than both of the voltages applied to the n-type semiconductor regions 23a and 123b (corresponding to the p-type semiconductor region 23b of FIG. 4) is applied to the gate electrode CG. At this time, from both of the n-type semiconductor regions 23a and 123b, electrons are implanted into the charge storage film EC by, for example, the FN tunnel effect. The implantation of the electrons from these n-type semiconductor regions 23a and 123b to the charge storage film EC is fast.

Meanwhile, also in the semiconductor device of the comparative example, the case of the erasing of the data from the memory cell MC by the same method as the method explained with reference to FIG. 5 is considered. In such a case, when the data is erased from the memory cell MC, a voltage that is lower than both of the voltages applied to the n-type semiconductor regions 23a and 123b (corresponding to the semiconductor region 23b of FIG. 4) is applied to the gate electrode CG. At this time, the positive holes are implanted from the channel region CHM or the p-type well PWM into the charge storage film EC by, for example, the FN tunnel effect.

However, the p-type impurity concentration in the channel region CHM is lower than the p-type impurity concentration in the p-type well PWM. Therefore, the number of the positive holes implanted from the channel region CHM to the charge storage film EC is extremely smaller than the number of the positive holes implanted from the p-type well PWM to the charge storage film EC. Moreover, prior to the implantation of positive holes from the p-type well PWM to the charge storage film EC, it is required to accumulate the charges in, that is, to charge, for example, capacitive elements formed across the BOX layer 13, and therefore, the implantation of the positive holes from the p-type well PWM to the charge storage film EC is slower than the implantation of the positive holes from the channel region CHM to the charge storage film EC.

That is, in the semiconductor device of the comparative example, although the data is written fast, the data is erased slow, and therefore, the performances of the semiconductor device cannot be improved.

On the other hand, in the semiconductor device according to the present first embodiment, as shown in FIGS. 9 and 10, one of the two semiconductor regions corresponding to the source region and the drain region included in the memory cell MC is the n-type semiconductor region 23a, and the other is the p-type semiconductor region 23b.

In the semiconductor device of the present first embodiment, when the data is written into the memory cell MC, a voltage higher than both of voltages to be applied to the n-type semiconductor region 23a and the p-type semiconductor region 23b is applied to the gate electrode CG. At this time, as shown in FIG. 9, the electrons are implanted from the n-type semiconductor region 23a to the charge storage film EC by, for example, the FN tunnel effect. That is, in the semiconductor device of the present first embodiment, the data is written into the memory cell MC by implanting the electrons from the n-type semiconductor region 23a to the charge storage film EC. The implantation of the electrons from the n-type semiconductor region 23a to the charge storage film EC is fast.

Moreover, in the semiconductor device of the first embodiment, when the data is erased from the memory cell MC, a voltage that is lower than both of the voltages applied to the n-type semiconductor region 23a and the p-type semiconductor region 23b is applied to the gate electrode CG. At this time, as shown in FIG. 10, the positive holes are implanted from the p-type semiconductor region 23b into the charge storage film EC by, for example, the FN tunnel effect. That is, in the semiconductor device of the present first embodiment, the data is erased from the memory cell MC by implanting the positive holes from the p-type semiconductor region 23b to the charge storage film EC.

The p-type impurity concentration in the p-type semiconductor region 23b is higher than the p-type impurity concentration in the channel region CHM. Therefore, the number of the positive holes implanted from the p-type semiconductor region 23b to the charge storage film EC is extremely larger than the number of the positive holes implanted from the channel region CHM to the charge storage film EC.

Therefore, it is not required to implant the positive holes from the p-type well PWM to the charge storage film EC. Moreover, the implantation of the positive holes from the p-type semiconductor region 23b to the charge storage film EC is faster than the implantation of the positive holes from the channel region CHM and the p-type well PWM to the charge storage film EC.

Also from the graph of FIG. 11, it is found that the concentration of positive holes in the channel region CHM in the first embodiment becomes higher than the concentration of positive holes in the channel region CHM in the comparative example immediately after the application of a voltage for erasing the data. Moreover, it is found that the concentration of positive holes in the charge storage film EC (indicated by the gate insulating film GIM in FIG. 11) in the first embodiment becomes higher than the concentration of positive holes in the charge storage film EC (indicated by the gate insulating film GIM in FIG. 11) in the comparative example immediately after the application of the voltage for erasing the data. From these facts, the data shown in FIG. 11 supports the fact that the number of positive holes implanted into the charge storage film EC is larger in the first embodiment than the comparative example.

Main Features and Effects of Present Embodiment

As explained above, in the semiconductor device of the present first embodiment, in the memory formation region MR when seen in a plan view, the n-type semiconductor region 23a including the n⁻-type semiconductor region 21a and the n⁺-type semiconductor region 22a is formed in the SOI layer 14 in a portion located on one side of the gate electrode CG. Moreover, in the semiconductor device of the present first embodiment, in the memory formation region MR when seen in a plan view, the p-type semiconductor region 23b including the p⁻-type semiconductor region 21b and the p⁺-type semiconductor region 22b is formed in the SOI layer 14 of a portion located on the side opposite to the one side of the gate electrode CG.

Therefore, in the semiconductor device of the present first embodiment, when the data is erased from the memory cell MC, the implantation of the positive holes from the p-type semiconductor region 23b to the charge storage film EC is fast, and therefore, the data erasing speed is large, so that the performances of the semiconductor device can be improved.

More preferably, the n-type impurity concentration in the n-type semiconductor region 23a is higher than the p-type impurity concentration in the p-type semiconductor region 23b.

In the memory cell MC in the present first embodiment, when the channel region CHM is a p-type semiconductor region, an electric current flowing between the n-type semiconductor region 23a and the p-type semiconductor region 23b becomes larger when the n-type impurity concentration in the n-type semiconductor region 23a is made higher than when the p-type impurity concentration in the p-type semiconductor region 23b is made higher. Thus, when the electric current flowing between the n-type semiconductor region 23a and the p-type semiconductor region 23b becomes large, the read-out voltage can be made lower, and therefore, the performances of the semiconductor device can be improved.

It seems that this is because when the channel region CHM is a p-type semiconductor region, for example, a magnitude of the electric current flowing between the n-type semiconductor region 23a and the p-type semiconductor region 23b is influenced by a magnitude of an electric current flowing through the p-n junction between the channel region CHM which is the p-type semiconductor region and the semiconductor region 23a. In this case, when the n-type impurity concentration in the n-type semiconductor region 23a is made higher, the size of the electric current flowing through the p-n junction can be made greater than the case when the p-type impurity concentration in the p-type semiconductor region 23b is made higher.

More specifically, the n-type impurity concentration in the $n^+$-type semiconductor region 22a can be made higher than the p-type impurity concentration in the $p^+$-type semiconductor region 22b.

Preferably, when the data stored in the memory cell MC is read, a voltage higher than the voltage to be applied to the n-type semiconductor region 23a is applied to the p-type semiconductor region 23b. That is, when the memory cell MC is considered to be similar to an n-channel-type MISFET, the reading operation is performed by forming the p-type semiconductor region 23b as the drain region of the n-channel-type MISFET and forming the n-type semiconductor region 23a as the source region of the n-channel-type MISFET.

On the other hand, even when the p-type semiconductor region 23b is formed as the source region of the n-channel-type MISFET and when the n-type semiconductor region 23a is formed as the drain region of the n-channel-type MISFET, the reading operation can be performed when a voltage in a forward direction is applied to the p-n junction between the channel region CHM which is the p-type semiconductor region and the n-type semiconductor region 23a. In such a case, a voltage lower than the voltage to be applied to the p-type semiconductor region 23b may be applied to the n-type semiconductor region 23a.

However, in a normal n-channel-type MISFET, a configuration in which 0 V is applied to the source region and in which a positive voltage is applied to the drain region, that is, a configuration in which the electric potential of the source line SL1 (see FIG. 6) is set to Wand in which the electric potential of the data line DL1 (see FIG. 6) is set to a positive electric potential, is generally used. In consideration of this configuration, when the data is read, a voltage higher than the voltage to be applied to the n-type semiconductor region 23a is preferably applied to the p-type semiconductor region 23b. In such a case, between the memory formation region MR where the memory cell MC is formed and the other region, wirings to be connected to the source region can be electrically connected to each other, or wirings to be connected to the drain region can be electrically connected to each other, so that the semiconductor device can be easily designed.

Note that the conductive types of the respective semiconductor regions included in the memory cell MC in the present first embodiment may be collectively changed to a reversed conductive type. In such a case, electrons are implanted in place of positive holes in the erasing operation, and the implanting speed of the electrons can be made large, so that performances of the semiconductor device can be improved.

Moreover, the gate insulating film GIM of the memory cell MC in the present first embodiment may have a conductor film such as a metal film in place of the charge storage film EC, and the conductor film may be in an electrically floating state. That is, the memory cell MC in the present first embodiment may have not an SONGS film serving as the charge storage portion but a floating gate.

Modified Example of Semiconductor Device of First Embodiment

Figure 12:
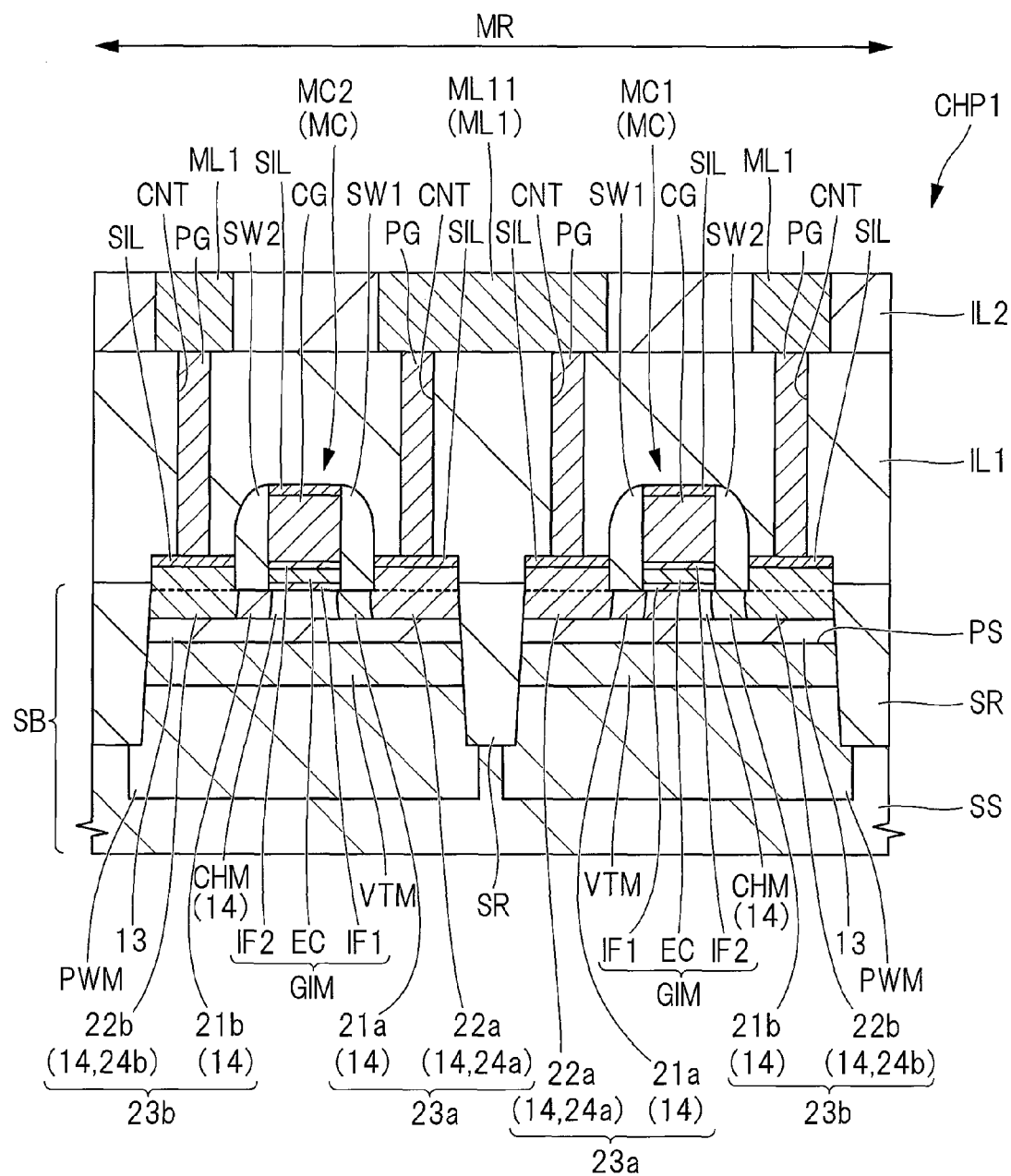
FIG. 12 is a cross-sectional view of a principal part of a semiconductor device of a modified example of the first embodiment.

FIG. 12 is a cross-sectional view of a principal part of a semiconductor device according to a modified example of the first embodiment.

As shown in FIG. 12, memory cells MC1 and MC2 serving as two adjacent memory cells MC are arranged so that the n-type semiconductor regions 23a included in the memory cells MC1 and MC2 are adjacent to each other, and a wiring ML11 serving as the wiring ML1 may be commonly used as a source line. That is, the wiring ML11 is electrically connected to the n-type semiconductor region 23a of the memory cell MC1 through the plug PG and the silicide film SIL, and also electrically connected to the n-type semiconductor region 23a of the memory cell MC2 through the plug PG and the silicide film SIL. Thus, the area of the semiconductor chip can be reduced, and the number of the wirings ML1 can be reduced.

Moreover, as shown in FIG. 12, the p-type wells PWM included in the respective memory cells MC1 and MC2 serving as the two adjacent memory cells MC may be not in contact with each other and be separated from each other. In this manner, for example, voltages to be applied to the p-type wells PWM included in the respective memory cells MC1 and MC2 can be individually controlled.

<Method of Manufacturing Semiconductor Device>

Next, a method of manufacturing the semiconductor device of the present first embodiment will be explained.

Figure 13:
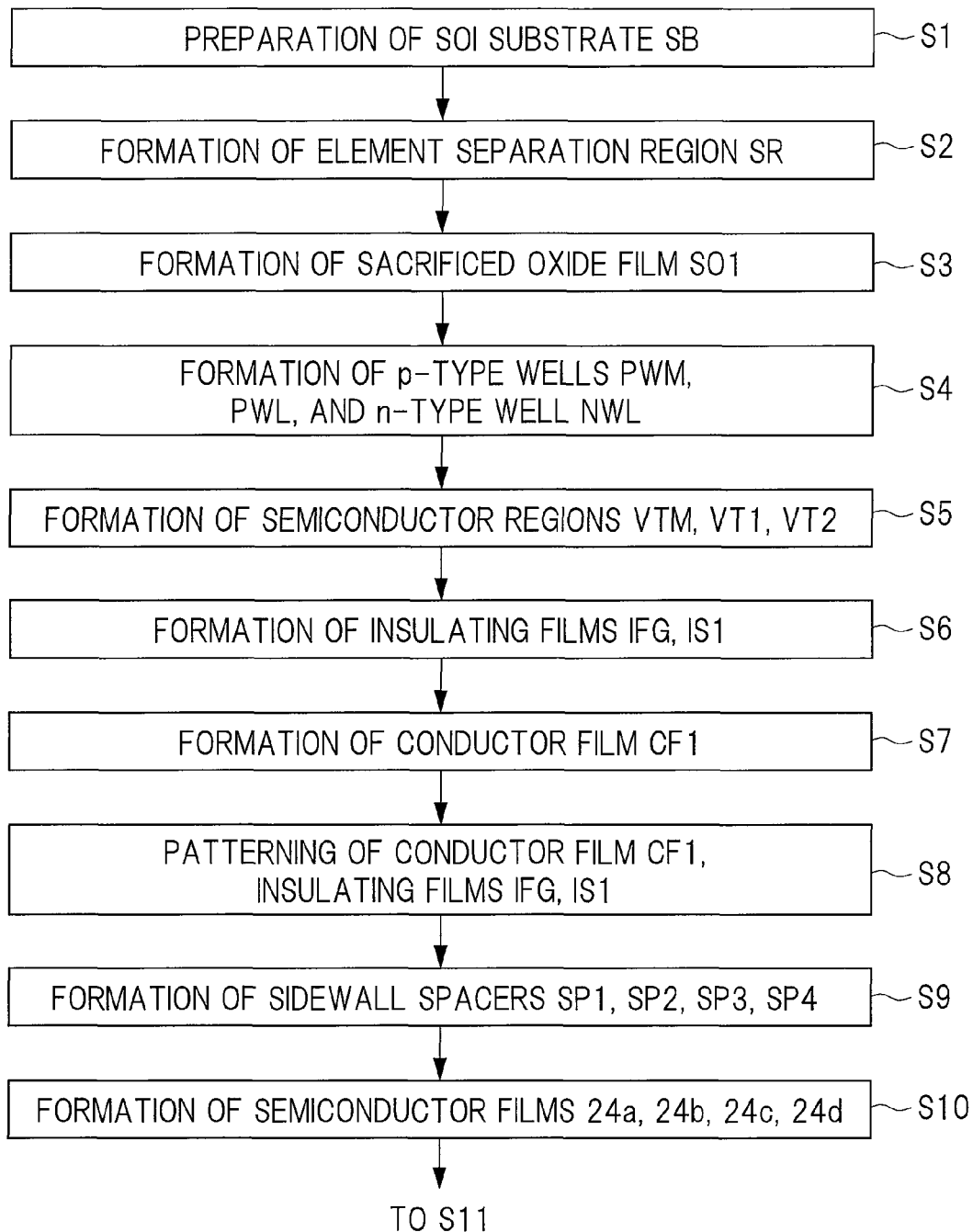
FIG. 13 is a process flowchart showing a part in manufacturing processes of the semiconductor device of the first embodiment.
Figure 14:
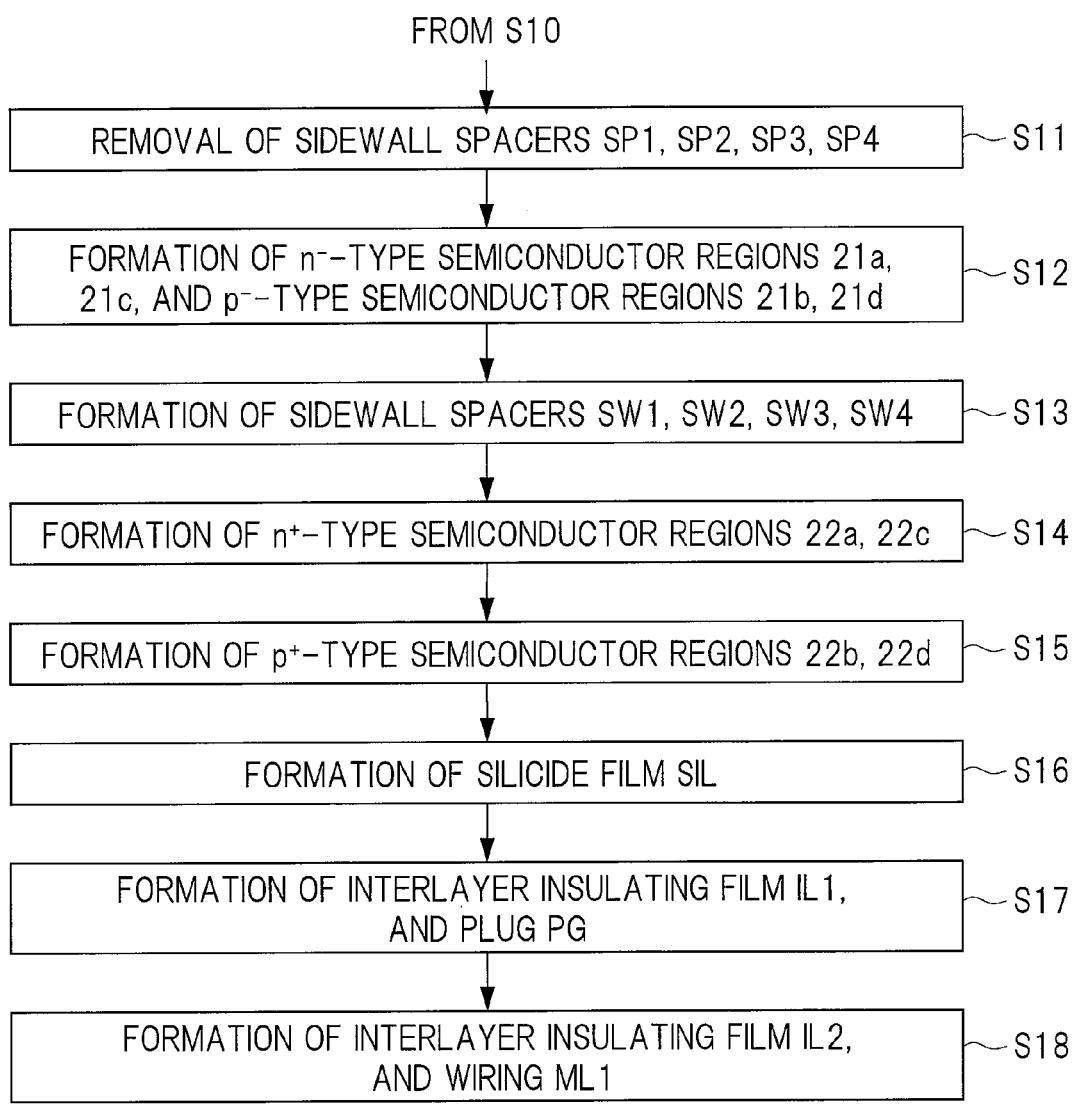
FIG. 14 is a process flowchart showing a part in manufacturing processes of the semiconductor device of the first embodiment.

FIGS. 13 and 14 are process flow charts showing a part of manufacturing processes of the semiconductor device of the first embodiment. FIGS. 15 to 26 are cross-sectional views of a principal part in the manufacturing processes of the semiconductor device of the first embodiment. FIGS. 15 to 26 show cross-sectional views of a principal part of the memory formation region MR and the main circuit formation region AR.

In the present first embodiment, the explanation will be made about a case of formation of a memory cell MC (see FIG. 26) having a configuration similar to that of an n-channel-type MISFET in the memory formation region MR. However, a memory cell MC having a configuration similar to that of a p-channel-type MISFET whose conductive type is reversed can also be formed (the same goes for the following embodiments).

In the present first embodiment, the explanation will be about a configuration in which an n-channel-type MISFET 7a (see FIG. 25) is formed in a low-breakdown-voltage MISFET formation region AR1 of the main circuit formation region AR and in which a p-channel-type MISFET 7b (see FIG. 26) is formed in a low-breakdown-voltage MISFET formation region AR2 of the main circuit formation region AR. Note that a region on an outside of the low-breakdown-voltage MISFET formation region AR1 of the main circuit formation region AR is set to a region AR3, and a region on an outside of the low-breakdown-voltage MISFET formation region AR2 of the main circuit formation region AR is set to a region AR4.

Figure 15:
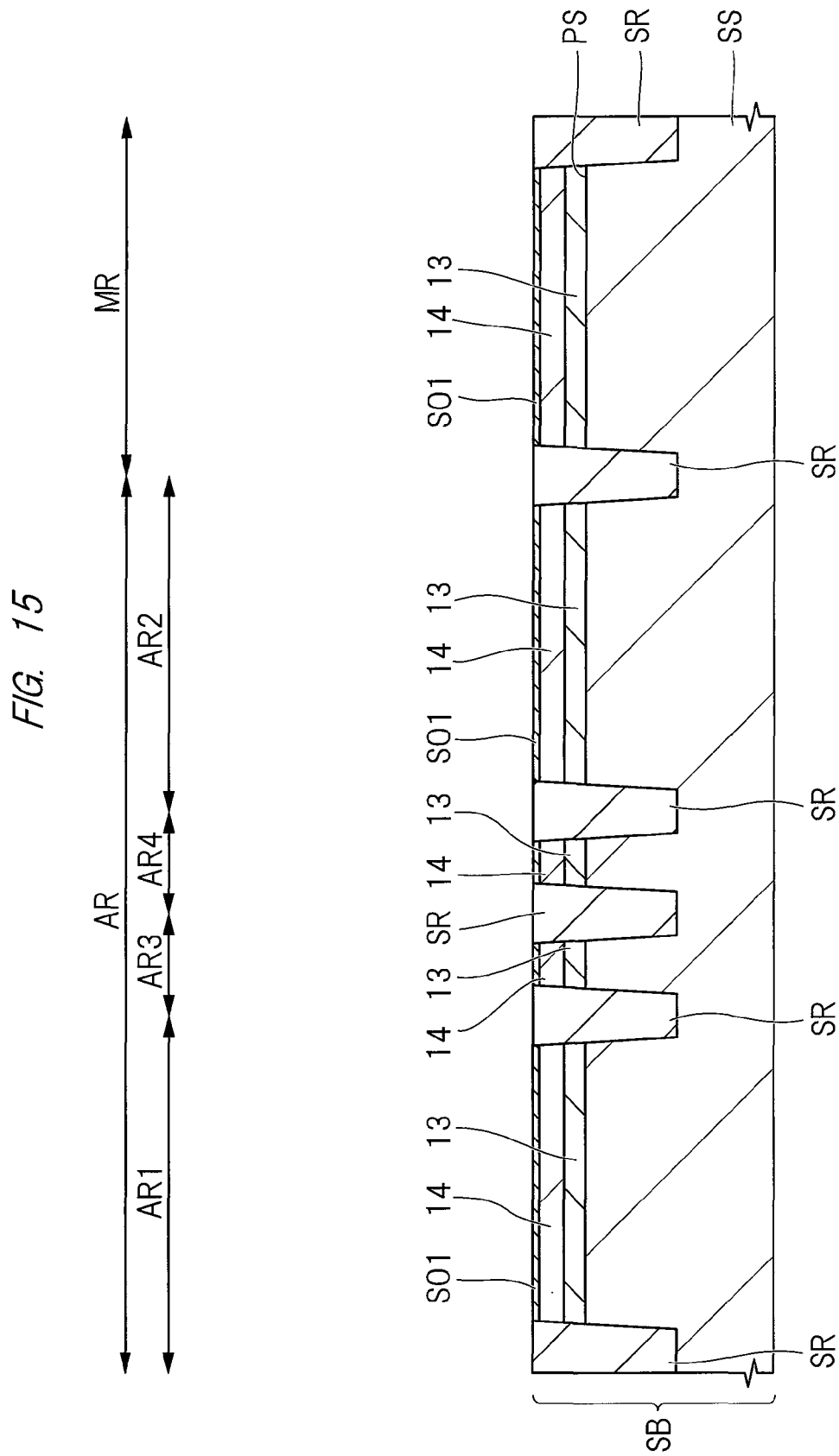
FIG. 15 is a cross-sectional view of a principal part in manufacturing processes of the semiconductor device of the first embodiment.

First, as shown in FIG. 15, an SOI substrate SB is provided, that is, prepared (step S1 in FIG. 13). In this step S1, an SOI substrate SB serving as a semiconductor substrate is provided, the SOI substrate SB including a base body SS, a BOX layer 13 formed on the base body SS and an SOI layer 14 formed on the BOX layer 13, in a memory formation region MR and low-breakdown-voltage MISFET formation regions AR1 and AR2, is provided.

The base body SS is made of, for example, a silicon (Si) substrate, and is more preferably made of a silicon single crystal substrate. The BOX layer 13 is made of, for example, a silicon oxide film. The thickness of the BOX layer 13 is, for example, about 10 to 40 nm. The SOI layer 14 is made of, for example, a silicon single crystal layer. The thickness of the SOI layer 14 is, for example, about 10 to 20 nm.

Next, as shown in FIG. 15, an element separation region SR is formed (see step S2 of FIG. 13). In this step S2, the element separation region SR is formed by, for example, using an STI (Shallow Trench Isolation) method.

In this STI method, first, an element separation trench is formed in the SOI substrate SB by using a photolithography technique and an etching technique. Then, an insulating film made of, for example, a silicon oxide film is formed on the SOI substrate SB so as to bury the element separation trench, and then, an unnecessary insulating film formed on the SOI substrate SB is removed by a chemical mechanical polishing (CMP) method. Thus, the element separation region SR in which the insulating film is buried only inside the element separating trench is formed.

By forming the element separation region SR as described above, the memory formation region MR and the main circuit formation region AR are partitioned by the element separation region SR, so that the main circuit formation region AR is partitioned into a low-breakdown-voltage MISFET formation region AR1, a low-breakdown-voltage MISFET formation region AR2, a region AR3 and a region AR4.

Next, as shown in FIG. 15, a sacrificed oxide film SO1 is formed (step S3 of FIG. 13). In this step S3, in the memory formation region MR and the low-breakdown-voltage MISFET formation regions AR1 and AR2, the sacrificed oxide film SO1 is formed on the SOI layer 14 by using, for example, a thermal oxidizing method. At this time, in the memory formation region MR and the low-breakdown-voltage MISFET formation regions AR1 and AR2, the sacrificed oxide film SO1 is formed on the SOI layer 14. The sacrificed oxide film SO1 is made of, for example, a silicon oxide film. Note that the sacrificed oxide film SO1 is formed on the SOI layer 14 also in the regions AR3 and AR4.

By forming the sacrificed oxide film SO1, the SOI layer 14 can be prevented from being damaged when the p-type wells PWM and PWL and the n-type well NWL (see FIG. 16 described later) are formed in step S4 described later.

Figure 16:
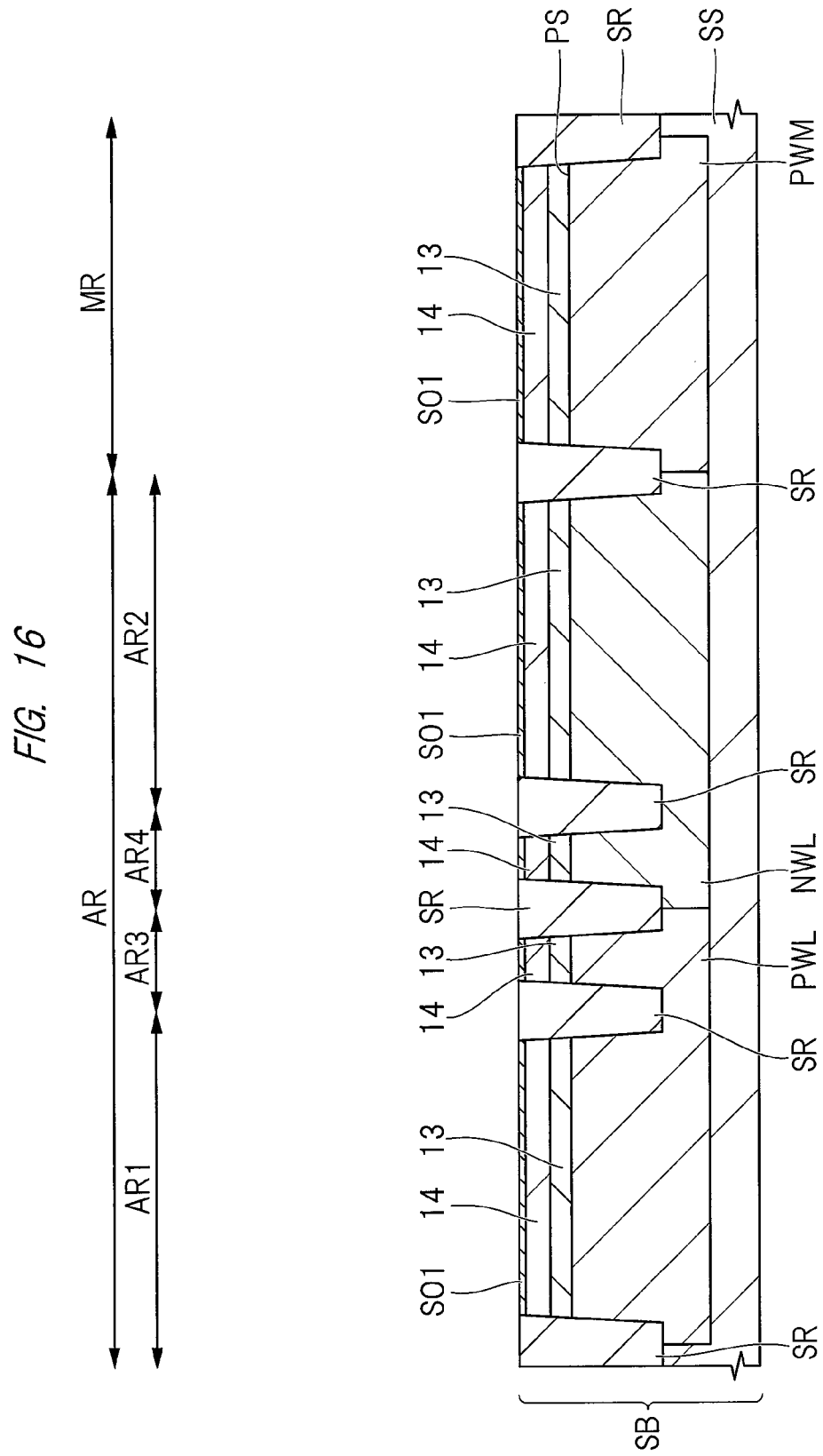
FIG. 16 is a cross-sectional view of a principal part in manufacturing processes of the semiconductor device of the first embodiment.

Next, as shown in FIG. 16, the p-type wells PWM and PWL and the n-type well NWL are formed (step S4 in FIG. 13).

In this step S4, first, a resist film (illustration is omitted) is patterned so as to cover the low-breakdown-voltage MISFET formation regions AR1 and AR2 and to expose the memory formation region MR. Then, by an ion implantation method using the patterned resist film (illustration is omitted) as a mask, a p-type impurity such as boron (B) is introduced into the base body SS.

Thus, in the memory formation region MR, a p-type well PWM is formed on the upper surface PS side serving as the main surface of the base body SS. The implantation condition at the time of ion implantation is adjusted so that the p-type impurity concentration in the p-type well PWM is, for example, about $5 \times 10^{17}$ to $5 \times 10^{18}$ cm$^{-3}$. At this time, the sacrificed oxide film SO1 is formed in the memory formation region MR on the SOI layer 14, and therefore, the upper surface of the p-type well PWM can be prevented from being damaged when the p-type well PWM is formed by the ion implantation method.

In this step S4, moreover, a p-type impurity such as boron (B) is introduced into the base body SS by an ion implantation method using the patterned resist film (illustration is omitted) as a mask, so as to cover the memory formation region MR and the low-breakdown-voltage MISFET formation region AR2 and to expose the low-breakdown-voltage MISFET formation region AR1.

Thus, in the low-breakdown-voltage MISFET formation region AR1, a p-type well PWL is formed on the upper surface PS side of the base body SS. The implantation condition at the time of ion implantation is adjusted so that the p-type impurity concentration in the p-type well PWL is, for example, about $5 \times 10^{17}$ to $5 \times 10^{18}$ cm$^{-3}$. At this time, the sacrificed oxide film SO1 is formed in the low-breakdown-voltage MISFET formation region AR1 on the SOI layer 14, and therefore, the SOI layer 14 can be prevented from being damaged when the p-type well PWL is formed by the ion implantation method.

Note that the p-type well PWL is also formed on the upper surface PS side of the base body SS also in the region AR3 on the outside of the low-breakdown-voltage MISFET formation region AR1.

In this step S4, moreover, a resist film (illustration is omitted) is patterned so as to cover the memory formation region MR and the low-breakdown-voltage MISFET formation region AR1 and to expose the low-breakdown-voltage MISFET formation region AR1. And, an n-type impurity such as phosphorus (P) or arsenic (As) is introduced into the base body SS by an ion implantation method using the patterned resist film (illustration is omitted) as a mask.

Thus, in the low-breakdown-voltage MISFET formation region AR2, an n-type well NWL is formed on the upper surface PS side of the base body SS. The implantation condition at the time of ion implantation is adjusted so that the n-type impurity concentration in the n-type well NWL is, for example, about $5 \times 10^{17}$ to $5 \times 10^{18}$ cm$^{-3}$. At this time, since the sacrificed oxide film SO1 is formed on the SOI layer 14 in the low-breakdown-voltage MISFET formation region AR2, the SOI layer 14 can be prevented from being damaged when the n-type well NWL is formed by the ion implantation method.

Note that the n-type well NWL is formed on the upper surface PS side of the base body SS also in the region AR4 on the outside of the low-breakdown-voltage MISFET formation region AR2.

Figure 17:
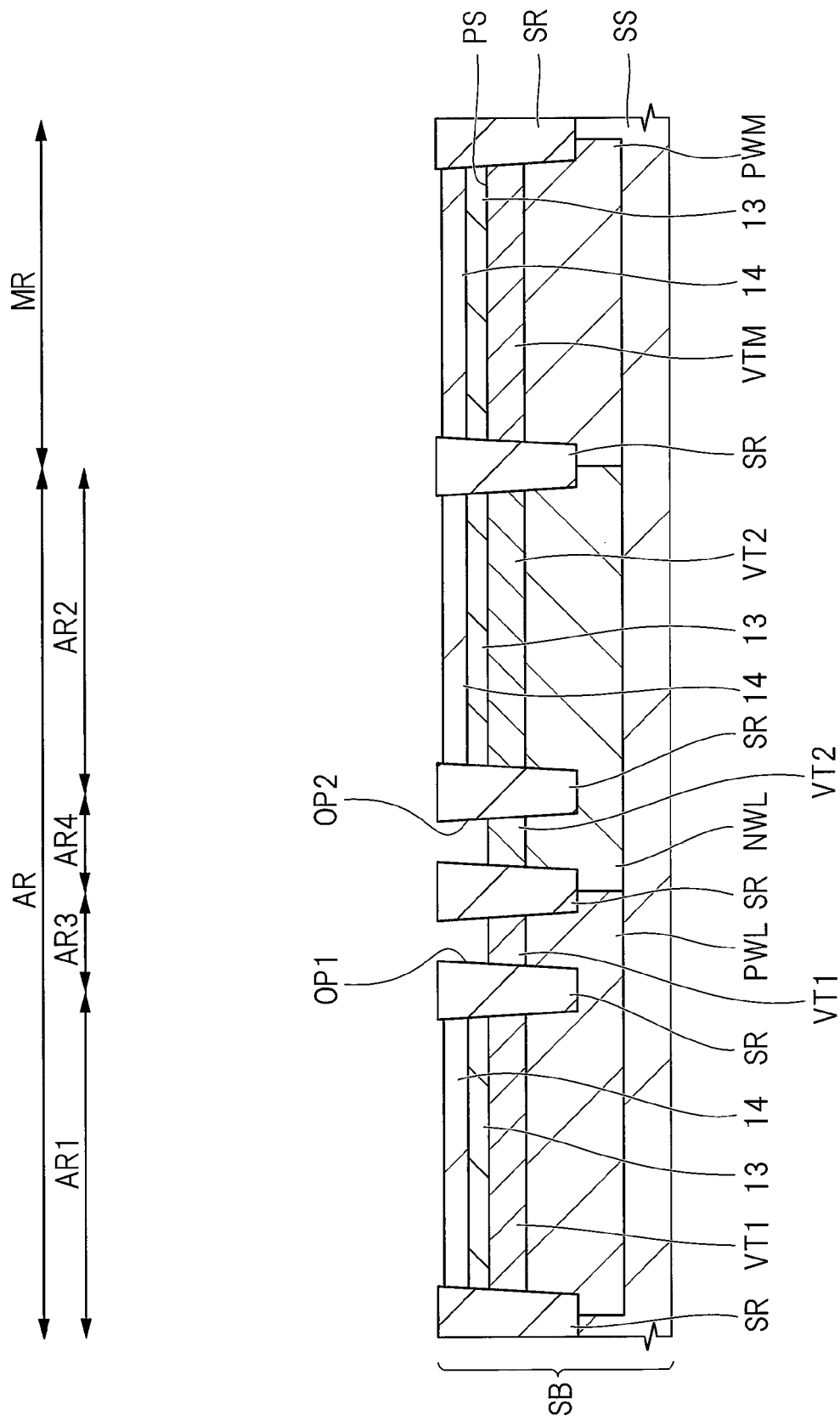
FIG. 17 is a cross-sectional view of a principal part in manufacturing processes of the semiconductor device of the first embodiment.

Next, as shown in FIG. 17, semiconductor regions VTM, VT1 and VT2 are formed (step S5 in FIG. 13).

In this step S5, the resist film (illustration is omitted) is patterned so as to cover the low-breakdown-voltage MIS- FET formation regions AR1 and AR2 and to expose the memory formation region MR. Then, by an ion implantation method using the patterned resist film (illustration is omitted) as a mask, a p-type impurity such as boron (B) is introduced into the upper layer portion of the p-type well PWM.

Thus, in the memory formation region MR, the semiconductor region VTM is formed in the upper layer portion of the p-type well PWM. The implantation condition at the time of ion implantation is adjusted so that the p-type impurity concentration in the semiconductor region VTM is, for example, about $5\times10^{17}$ to $5\times10^{18}$ cm$^{-3}$, and so as to be higher than the p-type impurity concentration in the p-type well PWM. At this time, since the sacrificed oxide film SO1 is formed on the SOI layer 14 in the memory formation region MR, the SOI layer 14 can be prevented from being damaged when the semiconductor region VTM is formed by the ion implantation method.

In this step S5, moreover, the resist film (illustration is omitted) is patterned so as to cover the memory formation region MR and the low-breakdown-voltage MISFET formation region AR2 and to expose the low-breakdown-voltage MISFET formation region AR1. Then, by an ion implantation method using the patterned resist film (illustration is omitted) as a mask, a p-type impurity such as boron (B) is introduced into the upper layer portion of the p-type well PWL.

Thus, in the low-breakdown-voltage MISFET formation region AR1, the semiconductor region VT1 is formed in the upper layer portion of the p-type well PWL. The implantation condition at the time of ion implantation is adjusted so that the p-type impurity concentration in the semiconductor region VT1 is, for example, about $5\times10^{17}$ to $5\times10^{18}$ cm$^{-3}$, and so as to be higher than the p-type impurity concentration in the p-type well PWL. At this time, since the sacrificed oxide film SO1 is formed on the SOI layer 14 in the low-breakdown-voltage MISFET formation region AR1, the SOI layer 14 can be prevented from being damaged when the semiconductor region VT1 is formed by the ion implantation method.

Note that the semiconductor region VT1 is formed in the upper layer portion of the p-type well PWL also in the region AR3 on the outside of the low-breakdown-voltage MISFET formation region AR1.

In this step S5, moreover, the resist film (illustration is omitted) is patterned so as to cover the memory formation region MR and the low-breakdown-voltage MISFET formation region AR1 and to expose the low-breakdown-voltage MISFET formation region AR2. Then, by an ion implantation method using the patterned resist film (illustration is omitted) as a mask, an n-type impurity such as phosphorous (P) or arsenic (As) is introduced into the upper layer portion of the n-type well NWL.

Thus, in the low-breakdown-voltage MISFET formation region AR2, the semiconductor region VT2 is formed in the upper layer portion of the n-type well NWL. The implantation condition at the time of ion implantation is adjusted so that the n-type impurity concentration in the semiconductor region VT2 is, for example, about $5\times10^{17}$ to $5\times10^{18}$ cm$^{-3}$, and so as to be higher than the n-type impurity concentration in the n-type well NWL. At this time, since the sacrificed oxide film SO1 is formed on the SOI layer 14 in the low-breakdown-voltage MISFET formation region AR2, the SOI layer 14 can be prevented from being damaged when the semiconductor region VT2 is formed by the ion implantation method.

Note that the semiconductor region VT2 is formed in the upper layer portion of the n-type well NWL also in the region AR4 on the outside of the low-breakdown-voltage MISFET formation region AR2.

In step S5, next, as shown in FIG. 17, the sacrificed oxide film SO1 formed on the SOI layer 14 in the memory formation region MR and the low-breakdown-voltage MISFET formation regions AR1 and AR2 is removed by a wet etching process using, for example, hydrofluoric acid (HF).

In this step S5, next, as shown in FIG. 17, openings OP1 and OP2 are formed. That is, in the region AR3, a part of the SOI layer 14 is removed by using an anisotropic dry etching method using a resist film as a mask, and then, the BOX layer 13 is removed by a wet etching method, so that the opening OP1 that penetrates through the SOI layer 14 and the BOX layer 13 to reach the semiconductor region VT1 is formed. Moreover, in the region AR4, a part of the SOI layer 14 is removed by using an anisotropic dry etching method using a resist film as a mask, and then, the BOX layer 13 is removed by a wet etching method, so that the opening OP2 that penetrates through the SOI layer 14 and the BOX layer 13 to reach the semiconductor region VT2 is formed. The opening OP1 is formed so as to ensure an electric contact with the p-type well PWL, and the opening OP2 is formed so as to ensure an electric contact with the n-type well NWL.

Figure 18:
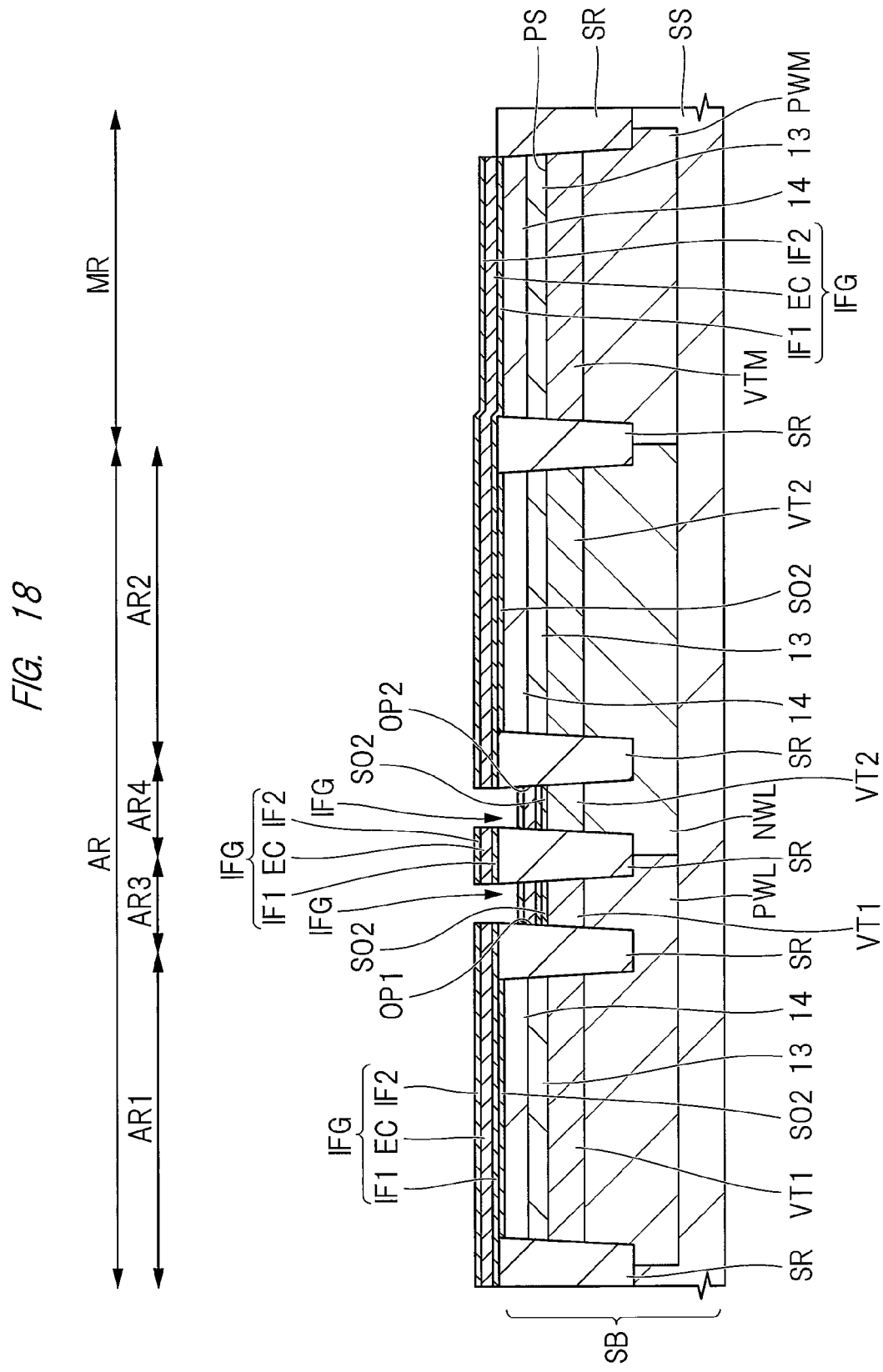
FIG. 18 is a cross-sectional view of a principal part in manufacturing processes of the semiconductor device of the first embodiment.

Next, as shown in FIG. 18, insulating films IFG and IS1 are formed (step S6 in FIG. 4).

In this step S6, first, as shown in FIG. 18, in the memory formation region MR and the low-breakdown-voltage MISFET formation regions AR1 and AR2, a sacrificed oxide film SO2 is formed on the SOI layer 14 by, for example, a thermal oxidizing method or others.

At this time, the sacrificed film SO2 is formed on the SOI layer 14 in the memory formation region MR and the low-breakdown-voltage MISFET formation regions AR1 and AR2. The sacrificed oxide film SO2 is made of, for example, a silicon oxide film. Note that the sacrificed oxide film SO2 is formed on the semiconductor region VT1 also in the region AR3, and is formed on the semiconductor region VT2 also in the region AR4.

In this step S6, next, as shown in FIG. 18, the sacrificed oxide film SO2 formed in the memory formation region MR is removed by an etching process using the resist film (illustration is omitted) as a mask.

In step S6, next, as shown in FIG. 18, the insulating film IFG covering the sacrificed oxide film SO2 is formed on the SOI layer 14 in the memory formation region MR and the low-breakdown-voltage MISFET formation regions AR1 and AR2. More specifically, in the memory formation region MR and the low-breakdown-voltage MISFET formation regions AR1 and AR2, an insulating film IF1 covering the sacrificed oxide film SO2 is formed on the SOI layer 14, a charge storage film EC is formed on the insulating film IF1, and an insulating film IF2 is formed on the charge storage film EC. The insulating film IFG is formed of the insulating film IF1, the charge storage film EC and the insulating film IF2. The insulating film IFG is an insulating film having the charge storage film EC serving as a charge storage portion therein. Note that the insulating film IFG is formed on the sacrificed oxide film SO2 also in the region AR3, and is also formed on the sacrificed oxide film SO2 also in the region AR4.

The insulating film IF1 is made of, for example, a silicon oxide film. Preferably, the insulating film IF1 can be formed by an ISSG (In Situ Steam Generation) oxidizing method. The ISSG oxidizing method is a method of forming an oxide film made of, for example, silicon oxide on the surface of the SOI layer 14 by directly introducing hydrogen and oxygen into a depressurized thermal treatment chamber to cause a radical oxidizing reaction on the surface of the SOI layer 14 made of silicon or others heated at a temperature of, for example, 800 to 1100° C. Since the radical oxidation reaction is used, the oxidation power in the ISSG oxidizing method is higher than the oxidation power in, for example, the thermal oxidizing method or others. Therefore, by using the ISSG oxidizing method, an insulating film IF1 made of a silicon oxide film having a high quality film property which is dense can be formed. The thickness of the insulating film IF1 is, for example, about 2 nm.

The charge storage film EC is made of, for example, a silicon nitride film. For example, the charge storage film EC can be formed by a CVD (Chemical Vapor Deposition) method. The thickness of the charge storage film EC is, for example, about 8 nm.

The insulating film IF2 is made of, for example, a silicon oxide film. More preferably, the insulating film IF2 can be formed by, for example, an HTO (High Temperature Oxide) method. By this method, an insulating film IF2 made of a silicon oxide film having a high quality film property which is dense has can be formed. The thickness of the insulating film IF2 is, for example, about 3 nm.

Figure 19:
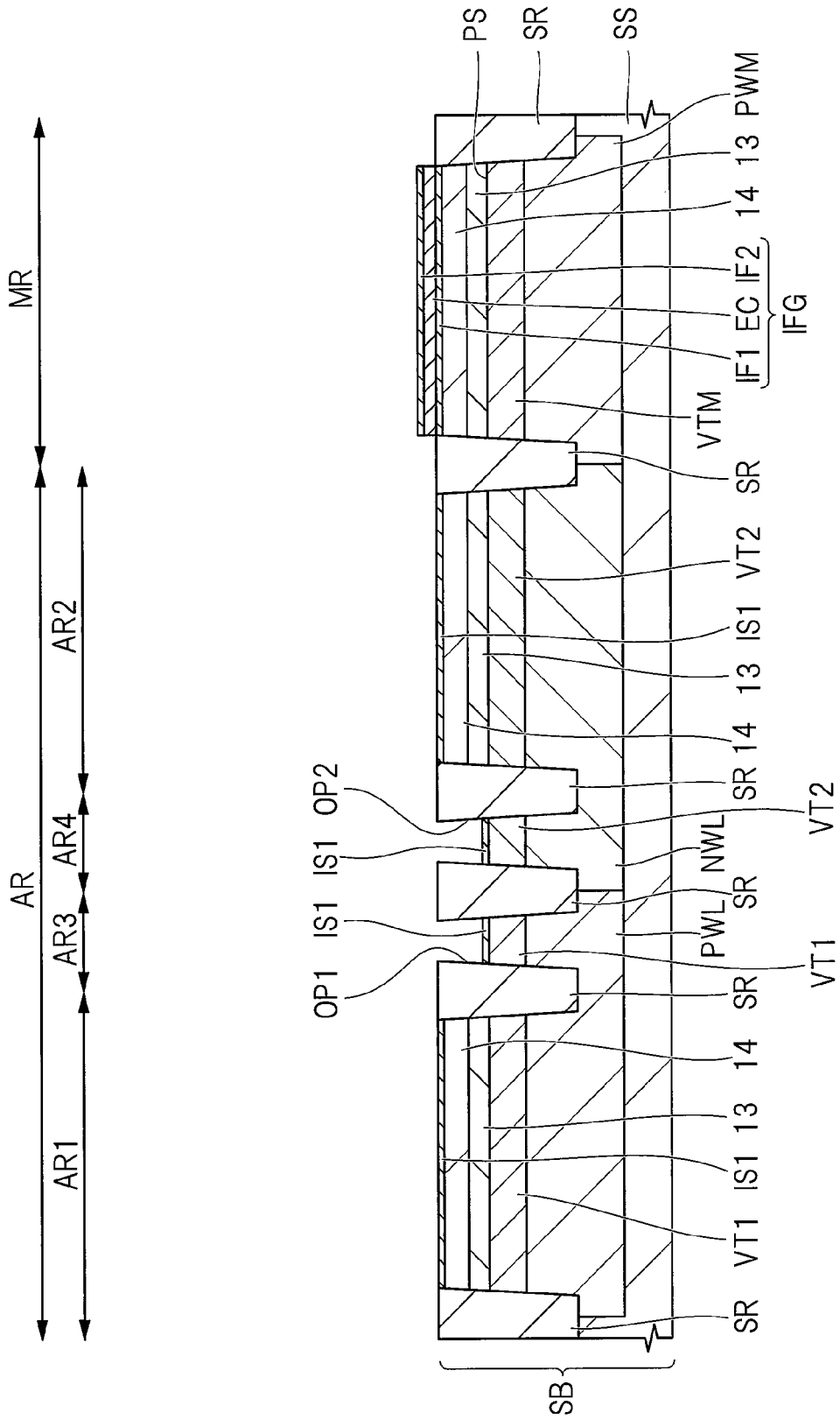
FIG. 19 is a cross-sectional view of a principal part in manufacturing processes of the semiconductor device of the first embodiment.

Next, as shown in FIG. 19, by an etching process using a resist film (illustration is omitted) as a mask, the insulating film IFG and the sacrificed oxide film SO2 formed in the low-breakdown-voltage MISFET formation regions AR1 and AR2 are removed. In this manner, in the memory formation region MR, an insulating film IFG serving as a stacked insulating film having a high quality film property which is dense and which has a good breakdown voltage property can be formed on the SOI layer 14. The insulating film IFG is referred to also as an ONO (Oxide Nitride Oxide) film. Note that the insulating film IFG and the sacrificed oxide film SO2 are removed also from the regions AR3 and AR4.

In this step S6, next, as shown in FIG. 19, in the low-breakdown-voltage MISFET formation regions AR1 and AR2, an insulating film IS1 for a gate insulating film is formed on the SOI layer 14 by using, for example, a thermal oxidizing method or others. The sacrificed oxide film SO1 is made of, for example, a silicon oxide film. Note that the insulating film IS1 is formed on the semiconductor region VT1 also in the region AR3, and is formed on the semiconductor region VT2 also in the region AR4.

Figure 20:
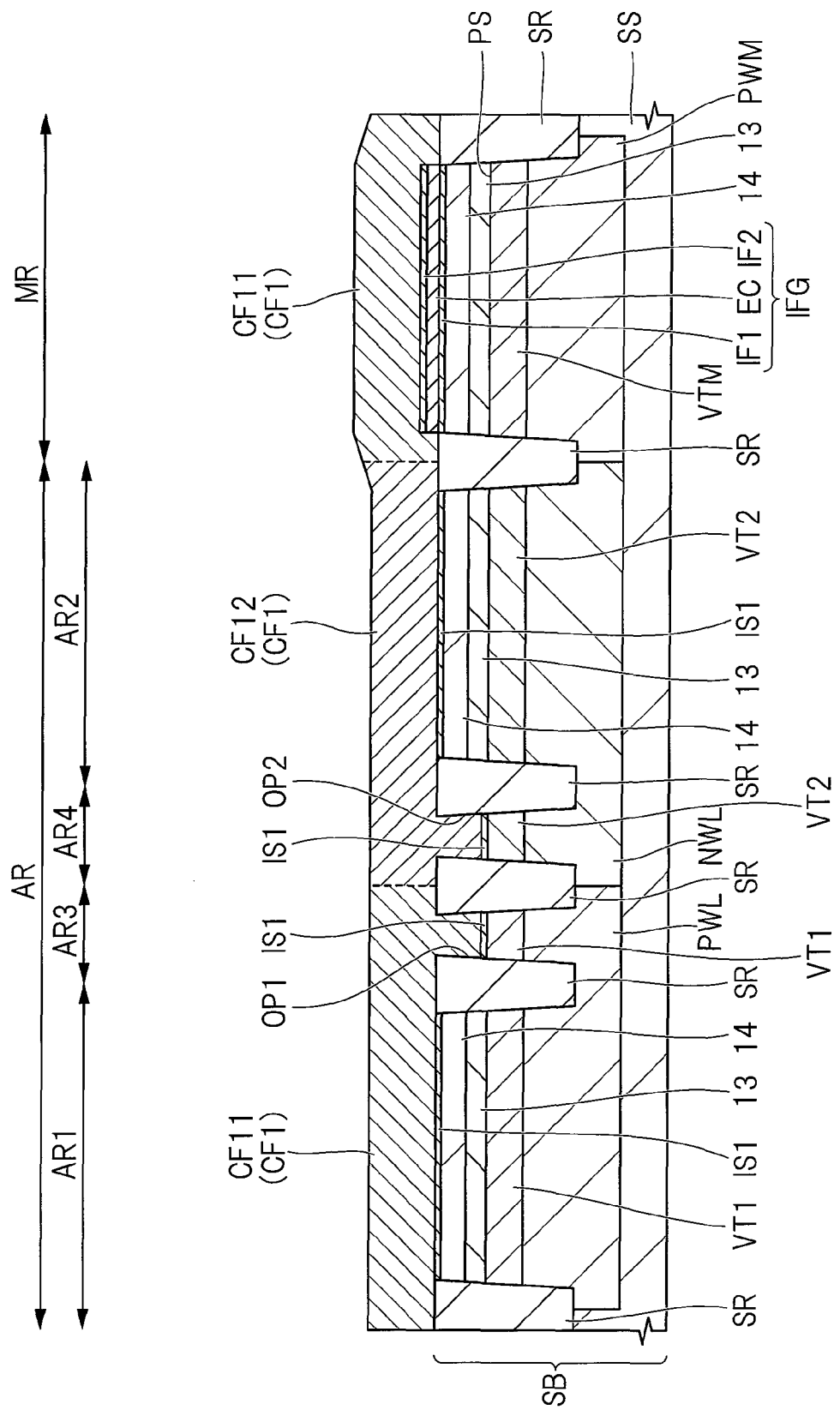
FIG. 20 is a cross-sectional view of a principal part in manufacturing processes of the semiconductor device of the first embodiment.

Next, as shown in FIG. 20, a conductor film CF1 is formed (step S7 in FIG. 13). In this step S7, in the memory formation region MR and the low-breakdown-voltage MISFET formation regions AR1 and AR2, a conductor film CF1 for a gate electrode is formed on the insulating film IFG.

Preferably, the conductor film CF1 is made of, polycrystalline silicon, that is, polysilicon. Such a conductor film CF1 can be formed by using the CVD method or others. A thickness of the conductor film CF1 can be as much enough as to cover the insulating films IFL and IS1. In addition, at the time of deposition of the conductor film CF1, the conductor film CF1 can be deposited first as an amorphous silicon film, and then, the amorphous silicon film can be formed as the polycrystalline silicon film by the subsequent heat treatment.

More preferably, in the memory formation region MR and the low-breakdown-voltage MISFET formation region AR1, as a conductor film CF11 included in the conductor film CF1, for example, a film to which an n-type impurity such as phosphorus (P) or arsenic (As) is introduced can be used. Moreover, in the low-breakdown-voltage MISFET formation region AR2, as a conductor film CF12 included in the conductor film CF1, for example, a film to which a p-type impurity such as boron (B) is introduced can be used.

The impurity can be introduced thereto at the time of or after the deposition of the conductor film CF1. When the impurity is introduced at the time of the deposition of the conductor film CF1, by containing a doping gas into a gas for use in the deposition of the conductor film CF1, a conductor film CF1 to which the impurity is introduced can be deposited. Alternatively, when an impurity is introduced after the deposition of the silicon film, the silicon film is deposited without intentionally introducing the impurity thereto, and then, the impurity is introduced into this silicon film by an ion implantation method or others, so that the conductor film CF1 to which the impurity is introduced can be formed.

Figure 21:
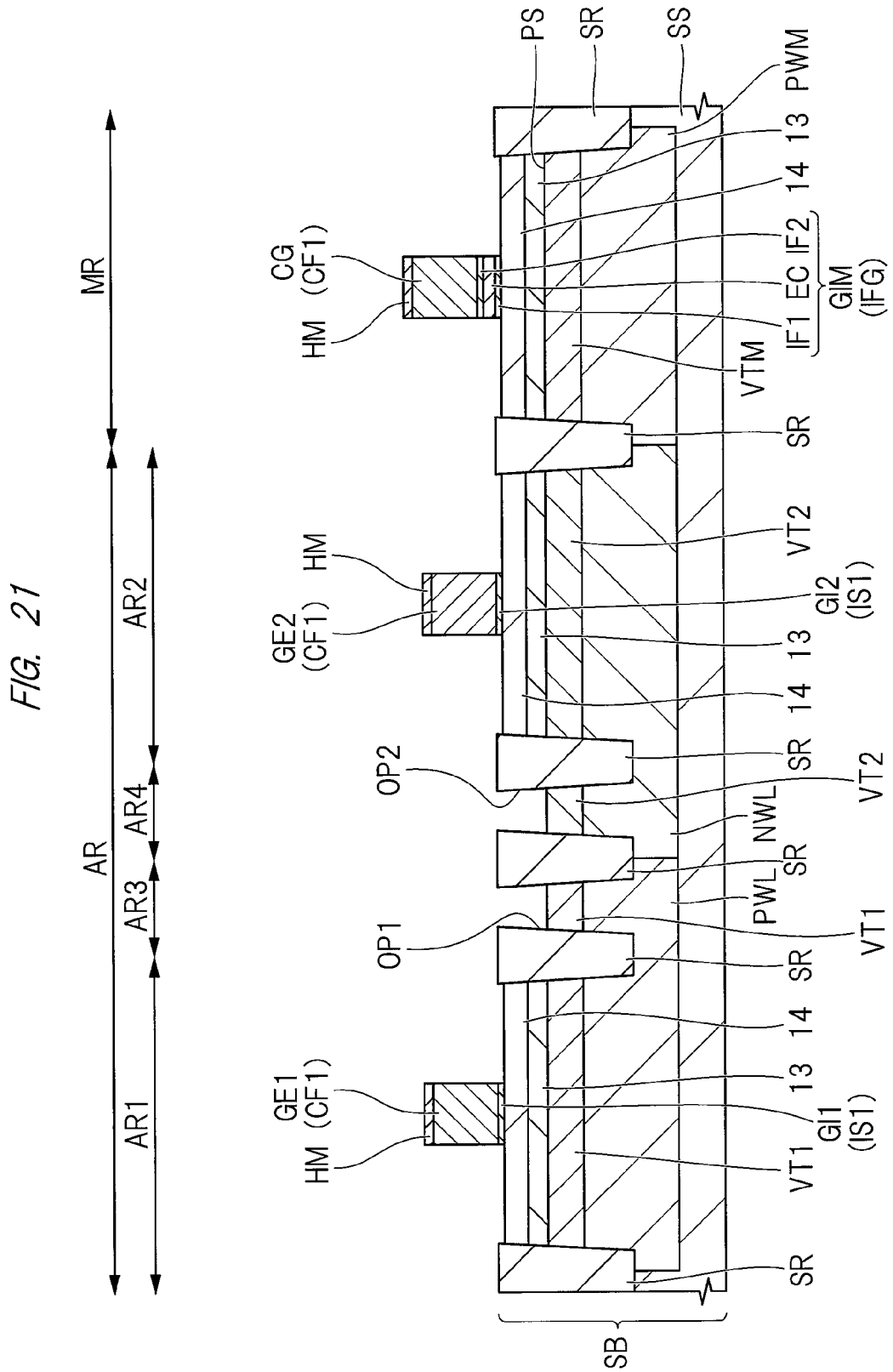
FIG. 21 is a cross-sectional view of a principal part in manufacturing processes of the semiconductor device of the first embodiment.

Next, as shown in FIG. 21, the conductor film CF1 and the insulating film IFG are patterned (step S8 in FIG. 13).

In this step S8, first, as shown in FIG. 21, a hard mask film HM made of, for example, a silicon nitride film or others is formed on the conductor film CF1, and a resist film (illustration is omitted) is applied on the hard mask film HM, and then, a photolithography technique and an etching technique are used, so that the hard mask film HM is patterned. The hard mask film HM is patterned so that the conductor film CF1 of the memory formation region MR in a portion arranged in a region where the gate electrode CG is formed is covered with the hard mask film HM, and the conductor film CF1 of the memory formation region MR in a portion arranged in a region other than the region where the gate electrode CG is formed is exposed from the hard mask film HM. Moreover, also as similar to the low-breakdown-voltage MISFET formation regions AR1 and AR2, the hard mask film HM is patterned so that the conductor film CF1 in a portion arranged in a region where the gate electrodes GE1 and GE2 are formed is covered with the hard mask film HM.

In this step S8, next, as shown in FIG. 21, by using the patterned hard mask film HM as a mask, the conductor film CF1 and the insulating films IFG and IS1 are patterned by performing an etching process such as dry etching.

Thus, in the memory formation region MR, the gate electrode CG made of the conductor film CF1 is formed, and the gate insulating film GIM, which is made of the insulating film IFG in a portion between the gate electrode CG and the SOI layer 14 is also formed. That is, in the memory formation region MR, the gate electrode CG is formed on the SOI layer 14 via the gate insulating film GIM.

Moreover, in the low-breakdown-voltage MISFET formation region AR1, a gate electrode GE1 made of the conductor film CF1 is formed on the SOI layer 14, and the gate insulating film GI1 made of the insulating film IS1 in a portion between the gate electrode GE1 and SOI layer 14 is formed. That is, in the low-breakdown-voltage MISFET formation region AR1, the gate electrode GE1 is formed on the SOI layer 14 via the gate insulating film GI1.

Furthermore, in the low-breakdown-voltage MISFET formation region AR2, a gate electrode GE2 made of the conductor film CF1 is formed on the SOI layer 14, and a gate insulating film GI2 made of the insulating film IS1 in a portion between the gate electrode GE2 and SOI layer 14 is formed. That is, in the low-breakdown-voltage MISFET formation region AR2, the gate electrode GE2 is formed on the SOI layer 14 via the gate insulating film GI2.

In this manner, by performing processes explained with reference to FIGS. 18 to 21, the gate insulating film GIM including the charge storage film EC therein is formed on the SOI layer 14, and the gate electrode CG is formed on the gate insulating film GIM.

Note that the processes explained with reference to FIGS. 18 to 21 are one example. Therefore, various methods can be performed, for example, the method performing the process of forming the insulating film for the gate insulating film and the conductor film for the gate electrode in the memory formation region MR before or after the process of forming the insulating film for the gate insulating film and the conductor film for the gate electrode in the low-breakdown-voltage MISFET formation regions AR1 and AR2.

Figure 22:
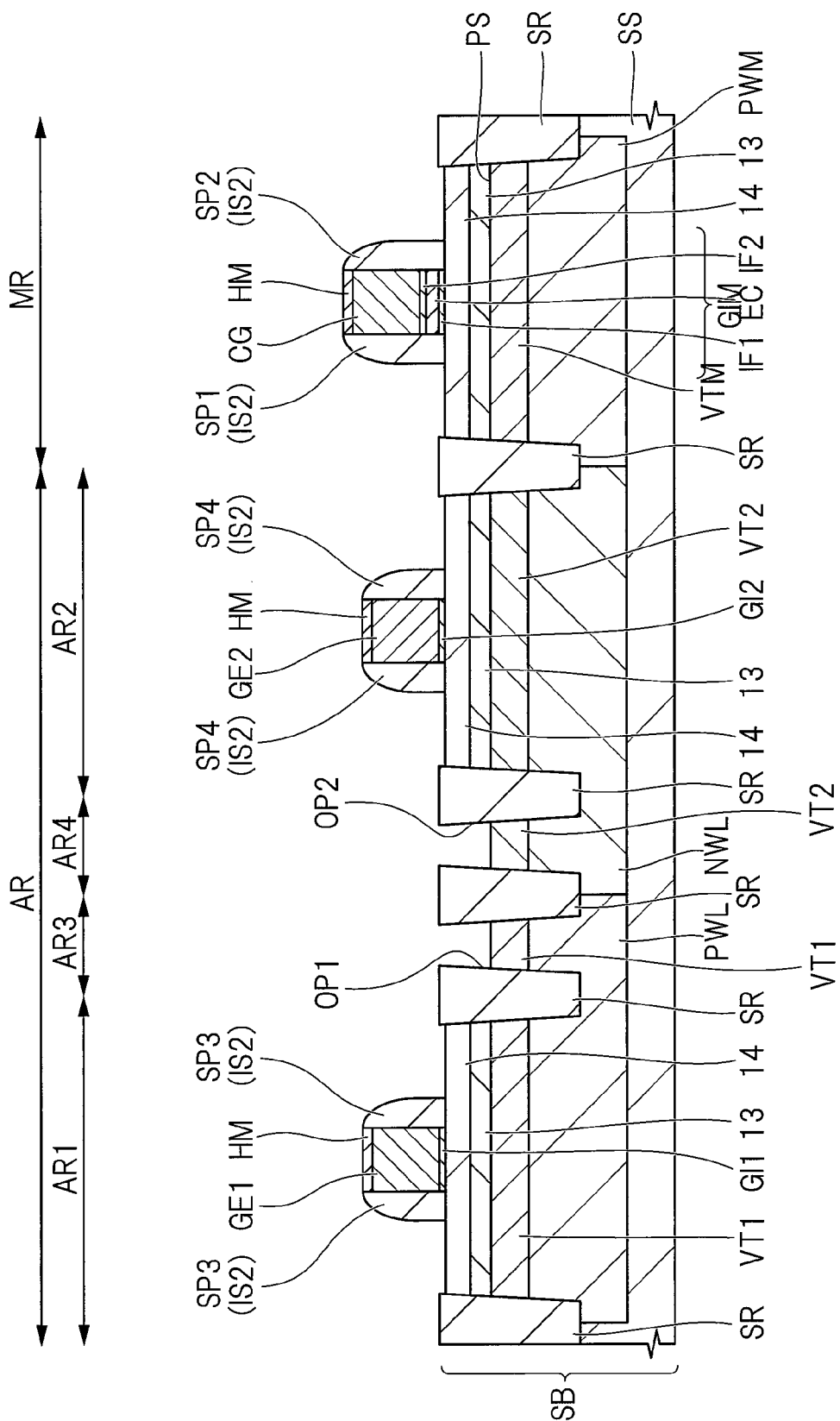
FIG. 22 is a cross-sectional view of a principal part in manufacturing processes of the semiconductor device of the first embodiment.

Next, as shown in FIG. 22, sidewall spacers SP1, SP2, SP3 and SP4 are formed (step S9 in FIG. 13).

In this step S9, first, as shown in FIG. 22, in the memory formation region MR and the low-breakdown-voltage MISFET formation regions AR1 and AR2, an insulating film IS2 for sidewall spacers is formed on the SOI layer 14. The insulating film IS2 is made of, for example, a silicon nitride film.

In this step S10, next, as shown in FIG. 22, the insulating film IS2 is etched back by using, for example, an anisotropic etching process. In this manner, in the memory formation region MR, the sidewall spacer SP1 made of the insulating film IS2 is formed in a side surface of the gate electrode CG on one side (left side in FIG. 22), and the sidewall spacer SP2 made of the insulating film IS2 is formed in a side surface of the gate electrode CG on the side (right side in FIG. 22) opposite to the one side.

Moreover, a sidewall spacer SP3 made of the insulating film IS2 is formed on each of the both side surfaces of the gate electrode GE1 in the low-breakdown-voltage MISFET formation region AR1, and in the low-breakdown-voltage MISFET formation region AR2, a sidewall spacer SP4 made of the insulating film IS2 is formed on each of the both side surfaces of the gate electrode GE2.

Figure 23:
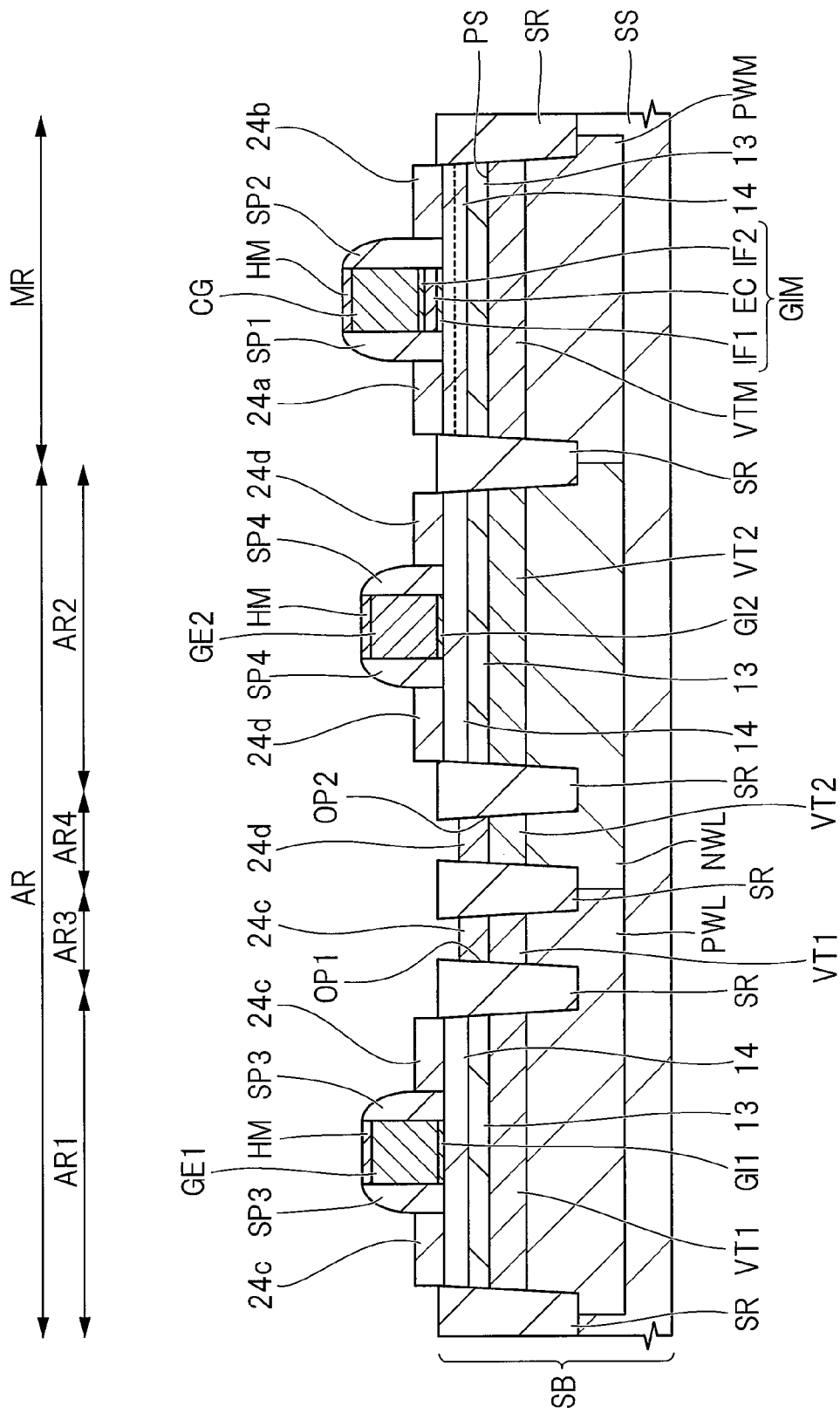
FIG. 23 is a cross-sectional view of a principal part in manufacturing processes of the semiconductor device of the first embodiment.

Next, as shown in FIG. 23, semiconductor films 24*a*, 24*b*, 24*c* and 24*d* are formed (step S10 in FIG. 13). In this step S10, in the memory formation region MR, a semiconductor film 24*a* made of an epitaxial silicon film having a thickness of, for example, about 20 nm is selectively formed on the SOI layer 14 in a portion located on the side opposite to the gate electrode CG across the sidewall spacer SP1. Moreover, in the memory formation region MR, a semiconductor film 24*b* made of an epitaxial silicon film having a thickness of, for example, about 20 nm is selectively formed on the SOI layer 14 in a portion located on the side opposite to the gate electrode CG across the sidewall spacer SP2.

Further, in the low-breakdown-voltage MISFET formation region AR1, a semiconductor film 24*c* made of an epitaxial silicon film having a thickness of, for example, about 20 nm is selectively formed on the SOI layer 14 in a portion located on the side opposite to the gate electrode GE1 across the sidewall spacer SP3. Moreover, in the low-breakdown-voltage MISFET formation region AR2, a semiconductor film 24*d* made of an epitaxial silicon film having a thickness of, for example, about 20 nm is selectively formed on the SOI layer 14 in a portion located on the side opposite to the gate electrode GE2 across the sidewall spacer SP4.

These semiconductor films 24*a*, 24*b*, 24*c* and 24*d* are formed by a CVD method using, for example, monosilane gas as a raw material in a state in which the surface of the SOI layer 14 is cleaned to remove a natural oxide film. At this time, in the region AR3, the semiconductor film 24*c* is formed also on the semiconductor region VT1 exposed from the bottom of the opening OP1, that is, formed inside the opening OP1. Moreover, in the region AR4, the semiconductor film 24*d* is also formed on the semiconductor region VT2 exposed from the bottom of the opening OP2, that is, formed inside the opening OP2.

Note that the selective growth of the semiconductor films 24*a*, 24*b*, 24*c* and 24*d* is not essential, and can be eliminated depending on the requirements of element characteristics.

Figure 24:
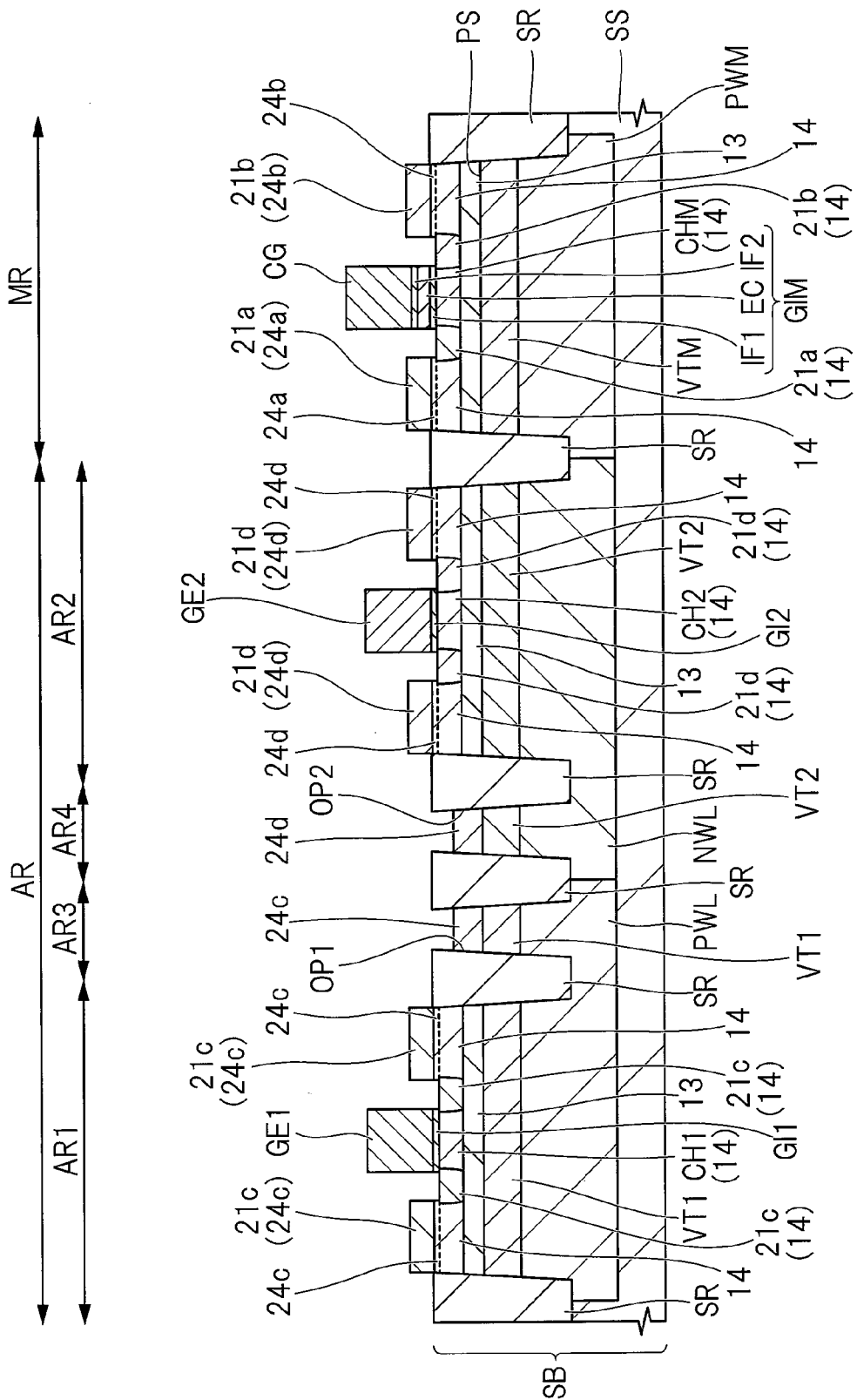
FIG. 24 is a cross-sectional view of a principal part in manufacturing processes of the semiconductor device of the first embodiment.

Next, as shown in FIG. 24, the sidewall spacers SP1, SP2, SP3 and SP4 are removed (step S11 in FIG. 14). In this step S11, in the memory formation region MR and the low-breakdown-voltage MISFET formation regions AR1 and AR2, the sidewall spacers SP1, SP2, SP3 and SP4 formed in the both side surfaces of the gate electrodes CG, GE1 and GE2 are removed by, for example, wet etching. Note that, when the sidewall spacers SP1, SP2, SP3 and SP4 made of, for example, a silicon nitride film, are removed, the hard mask HM made of, for example, a silicon nitride film is also removed.

Next, as shown in FIG. 24, n$^-$-type semiconductor regions 21*a* and 21*c*, and p$^-$-type semiconductor regions 21*b* and 21*d* are formed (step S12 in FIG. 14).

In this step S12, a resist film (illustration is omitted) is patterned so as to cover a portion of the memory formation region MR, which is located on a side (right side in FIG. 24) opposite to one side of the gate electrode CG and cover the low-breakdown-voltage MISFET formation region AR2 when seen in a plan view. Moreover, in this step S12, the resist film (illustration is omitted) is patterned so as to expose a portion of the memory formation region MR, which is located on the one side (left side in FIG. 24) of the gate electrode CG and expose the low-breakdown-voltage MISFET formation region AR1 when seen in a plan view. Then, by an ion implantation method using the patterned resist film (illustration is omitted) as a mask, an n-type impurity such as phosphorus (P) or arsenic (As) is introduced into the semiconductor film 24*a*, the SOI layer 14 below the semiconductor film 24*a*, the semiconductor film 24*c*, and the SOI layer 14 below the semiconductor film 24*c*.

Thus, an n$^-$-type semiconductor region 21*a* is formed in the SOI layer 14 in a portion located on one side of the gate electrode CG in the memory formation region MR when seen in a plan view, and an n$^-$-type semiconductor region 21*c* is formed in the SOI layer 14 in portions located on the both sides across the gate electrode GE1 in the low-breakdown-voltage MISFET formation region AR1 when seen in a plan view. The n$^-$-type semiconductor region 21*a* is formed in the memory formation region MR so as to be aligned on the gate electrode CG, and the n$^-$-type semiconductor region 21*c* is formed in the low-breakdown-voltage MISFET formation region AR1 so as to be aligned on the gate electrode GE1. Note that the n$^-$-type semiconductor region 21*a* is also formed in the upper layer portion of the semiconductor film 24*a* in the memory formation region MR, and the n$^-$-type semiconductor region 21*c* is also formed in the upper layer portion of the semiconductor film 24*c* in the low-breakdown-voltage MISFET formation region AR1.

In this step S12, a resist film (illustration is omitted) is patterned so as to cover a portion of the memory formation region MR, which is located on one side (left side in FIG. 24) of the gate electrode CG and cover the low-breakdown-voltage MISFET formation region AR1 when seen in a plan view. Moreover, in this step S12, the resist film (illustration is omitted) is patterned so as to expose a portion of the memory formation region MR, which is located on a side (right side in FIG. 24) opposite to the one side of the gate electrode CG and expose the low-breakdown-voltage MIS- FET formation region AR2 when seen in a plan view. Then, by an ion implantation method using the patterned resist film (illustration is omitted) as a mask, a p-type impurity such as boron (B) is introduced into the semiconductor film 24b, the SOI layer 14 below the semiconductor film 24b, the semiconductor film 24d, and the SOI layer 14 below the semiconductor film 24d.

Thus, a p⁻-type semiconductor region 21b is formed in the SOI layer 14 in a portion located on a side opposite to one side of the gate electrode CG in the memory formation region MR when seen in a plan view, and a p⁻-type semiconductor region 21d is formed in the SOI layer 14 in portions located on the both sides across the gate electrode GE2 in the low-breakdown-voltage MISFET formation region AR2 when seen in a plan view. The p⁻-type semiconductor region 21b is formed in the memory formation region MR so as to be aligned on the gate electrode CG, and the p⁻-type semiconductor region 21d is formed in the low-breakdown-voltage MISFET formation region AR2 so as to be aligned on the gate electrode GE2. Note that the p⁻-type semiconductor region 21b is also formed in the upper layer portion of the semiconductor film 24b in the memory formation region MR, and the p⁻-type semiconductor region 21d is also formed in the upper layer portion of the semiconductor film 24d in the low-breakdown-voltage MISFET formation region AR2.

Moreover, a channel region CHM serving as a semiconductor region of a p-type or in an intrinsic state is formed in the SOI layer 14 in a portion located below the gate electrode CG. Furthermore, a channel region CH1 serving as a semiconductor region of a p-type or in an intrinsic state is formed in the SOI layer 14 in a portion located below the gate electrode GE1, and a channel region CH2 serving as a semiconductor region of an n-type or in an intrinsic state is formed in the SOI layer 14 in a portion located below the gate electrode GE2.

Figure 25:
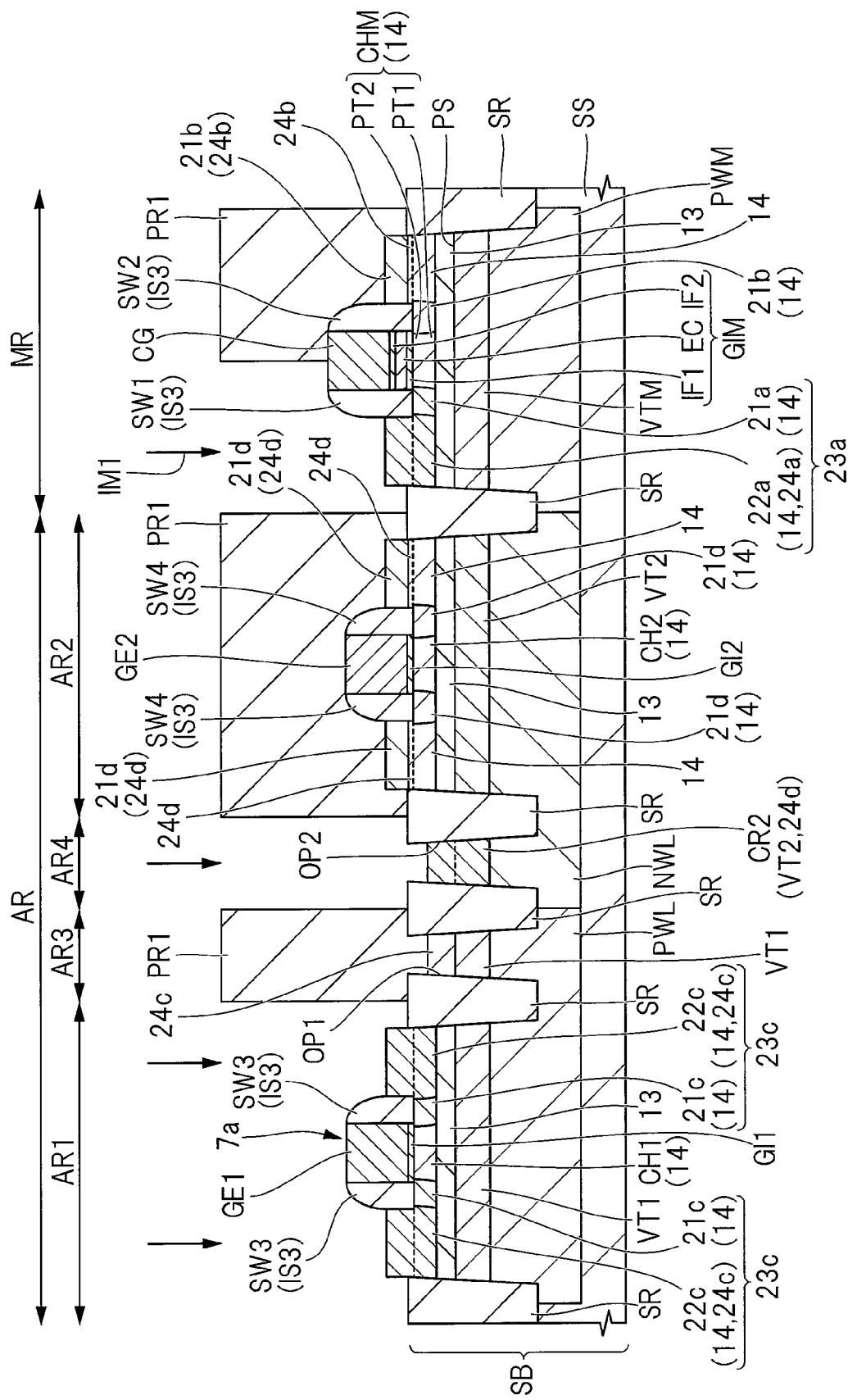
FIG. 25 is a cross-sectional view of a principal part in manufacturing processes of the semiconductor device of the first embodiment.

Next, as shown in FIG. 25, sidewall spacers SW1, SW2, SW3 and SW4 are formed (step S13 in FIG. 14).

In this step S13, next, as shown in FIG. 25, an insulating film IS3 for a sidewall spacer is formed in the entire upper surface of the SOI substrate SB. The insulating film IS3 is formed of, for example, an insulating film made of a silicon oxide film, an insulating film made of a silicon nitride film, or a stacked film of them.

In this step S13, next, as shown in FIG. 25, the insulating film IS3 is etched back by using, for example, an anisotropic etching process. In this manner, in the memory formation region MR, the sidewall spacer SW1 made of the insulating film IS3 is formed in a side surface of the gate electrode CG on one side (left side in FIG. 25), and the sidewall spacer SW2 made of the insulating film IS3 is formed in a side surface on a side (right side in FIG. 25) opposite to the one side of the gate electrode CG. At this time, the sidewall spacer SW1 is formed between the gate electrode CG and the semiconductor film 24a, and the sidewall spacer SW2 is formed between the gate electrode CG and the semiconductor film 24b.

Moreover, in the low-breakdown-voltage MISFET formation region AR1, the sidewall spacer SW3 made of the insulating film IS3 is formed on each of the both side surfaces of the gate electrode GE1. The sidewall spacer SW3 is formed between the gate electrode GE1 and the semiconductor film 24c.

Furthermore, in the low-breakdown-voltage MISFET formation region AR2, the sidewall spacer SW4 made of the insulating film IS3 is formed on each of the both side surfaces of the gate electrode GE2. The sidewall spacer SW4 is formed between the gate electrode GE2 and the semiconductor film 24d.

Next, as shown in FIG. 25, n⁺-type semiconductor regions 22a and 22c are formed (step S14 in FIG. 14).

In this step S14, a resist film PR1 is patterned so as to cover a portion of the memory formation region MR, which is located on a side (right side in FIG. 25) opposite to one side of the gate electrode CG and cover the low-breakdown-voltage MISFET formation region AR2. Moreover, in this step S14, the resist film PR1 is patterned so as to expose a portion of the memory formation region MR, which is located on the one side (left side in FIG. 25) of the gate electrode CG and expose the low-breakdown-voltage MISFET formation region AR1. Then, by an ion implantation method using the patterned resist film PR1 as a mask, an n-type impurity such as phosphorus (P) or arsenic (As) is introduced into the semiconductor film 24a, the SOI layer 14 below the semiconductor film 24a, the semiconductor film 24c, and the SOI layer 14 below the semiconductor film 24c. That is, an n-type impurity ion IM1 is ion-implanted into the semiconductor films 24a 24c.

Thus, an n⁺-type semiconductor region 22a is formed in the semiconductor film 24a and the SOI layer 14 in a portion located on a side opposite to the gate electrode CG across the sidewall spacer SW1 in the memory formation region MR when seen in a plan view. Also, an n⁺-type semiconductor region 22c is formed in the semiconductor film 24c and the SOI layer 14 in a portion located on a side opposite to the gate electrode GE1 across the sidewall spacer SW3 in the low-breakdown-voltage formation region AR1 when seen in a plan view. The n⁺-type semiconductor region 22a is formed in the memory formation region MR so as to be aligned on the sidewall spacer SW1, and the n⁺-type semiconductor region 22c is formed in the low-breakdown-voltage MISFET formation region AR1 so as to be aligned on the sidewall spacer SW3. The ion implantation conditions at the time of an ion implantation are adjusted so that the n-type impurity concentrations of the n⁺-type semiconductor regions 22a and 22c are, for example, about $5 \times 10^{19}$ to $5 \times 10^{20}$ cm⁻³.

Thus, as shown in FIG. 25, when seen in a plan view, an n-type semiconductor region 23a including the n⁻-type semiconductor region 21a and the n⁺-type semiconductor region 22a is formed in the SOI layer 14 in a portion located on one side (left side in FIG. 26) of the gate electrode CG.

On the other hand, in the low-breakdown-voltage MISFET formation region AR1, an n-channel type MISFET 7a is formed of the p-type well PWL, the gate insulating film GI1, the gate electrode GE1, the sidewall spacer SW3, the n⁻-type semiconductor region 21c and the n⁺-type semiconductor region 22c. Moreover, an n-type semiconductor region 23c including the n⁻-type semiconductor region 21c and the n⁺-type semiconductor region 22c is formed.

Note that the resist film PR1 is patterned in this step S14 so as to expose the region AR4, and note that an n-type impurity is introduced into the semiconductor film 24d and the semiconductor region VT2 in the region AR4. Moreover, in the region AR4, a contact region CR2 including the semiconductor film 24d and the semiconductor region VT2 to which the n-type impurity is introduced is formed.

Figure 26:
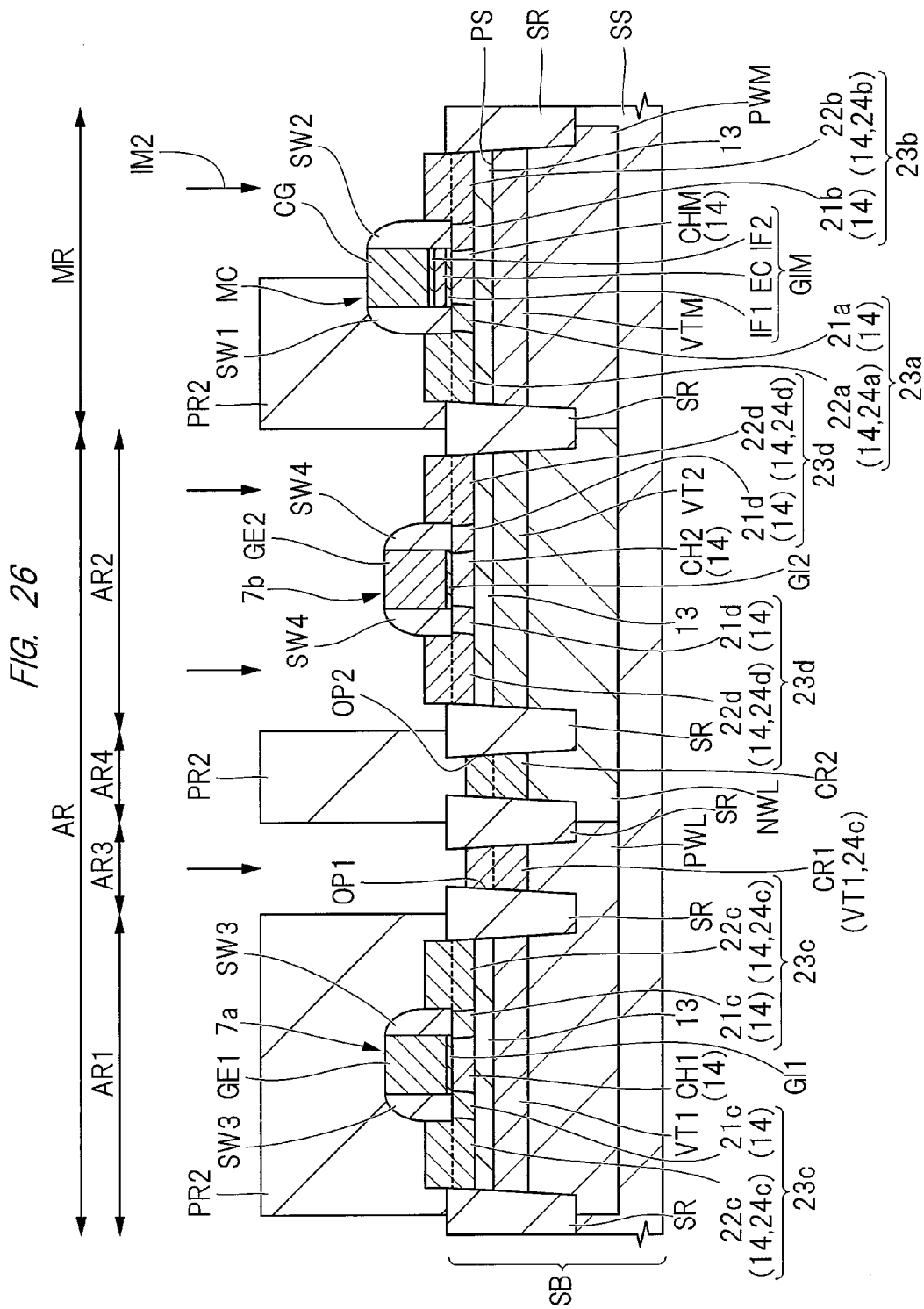
FIG. 26 is a cross-sectional view of a principal part in manufacturing processes of the semiconductor device of the first embodiment.

Next, as shown in FIG. 26, p⁺-type semiconductor regions 22b and 22d are formed (step S15 in FIG. 14).

In this step S15, a resist film PR2 is patterned so as to cover a portion of the memory formation region MR which is located on one side (left side in FIG. 26) of the gate electrode CG and cover the low-breakdown-voltage MIS- FET formation region AR1. Moreover, in the step S15, the resist film PR2 is also patterned so as to expose a portion of the memory formation region MR which is located on a side (right side in FIG. 26) opposite to the one side of the gate electrode CG and expose the low-breakdown-voltage MISFET formation region AR2. Then, by an ion implantation method using the patterned resist film PR2 as a mask, a p-type impurity such as boron (B) is introduced into the semiconductor film 24b and the SOI layer 14 below the semiconductor film 24b, and to the semiconductor film 24d and the SOI layer 14 below the semiconductor film 24d in the memory formation region MR. That is, p-type impurity ion IM2 is ion-introduced into the semiconductor films 24b and 24d.

Thus, a $p^+$-type semiconductor region 22b is formed in the semiconductor film 24b and the SOI layer 14 in a portion located on a side opposite to the gate electrode CG across the sidewall spacer SW2 in the memory formation region MR when seen in a plan view. Also, a $p^+$-type semiconductor region 22d is formed in the semiconductor film 24d and the SOI layer 14 in a portion located on a side opposite to the gate electrode GE2 across the sidewall spacer SW4 in the low-breakdown-voltage formation region AR2 when seen in a plan view. The $n^+$-type semiconductor region 22d is formed in the low-breakdown-voltage MISFET formation region AR2 so as to be aligned on the sidewall spacer SW4. The ion implantation conditions at the time of an ion implantation are adjusted so that the p-type impurity concentrations of the $p^+$-type semiconductor regions 22b and 22d are, for example, about $5 \times 10^{19}$ to $5 \times 10^{20}$ cm$^{-3}$.

Thus, as shown in FIG. 26, in the memory formation region MR, a memory cell MC is formed of the p-type well PWM, the gate insulating film GIM, the gate electrode CG, the sidewall spacers SW1 and SW2, the $n^-$-type semiconductor region 21a, the $p^-$-type semiconductor region 21b, the $n^+$-type semiconductor region 22a and the $p^+$-type semiconductor region 22b. Moreover, when seen in a plan view, a p-type semiconductor region 23b including the $p^-$-type semiconductor region 21b and the $p^+$-type semiconductor region 22b is formed in the SOI layer 14 in a portion located on a side (right side in FIG. 26) opposite to the one side of the gate electrode CG.

On the other hand, in the low-breakdown-voltage MISFET formation region AR2, a p-channel type MISFET 7b is formed of the n-type well NWL, the gate insulating film GI2, the gate electrode GE2, the sidewall spacer SW4, the $p^-$-type semiconductor region 21d and $p^+$-type semiconductor region 22d. Moreover, a p-type semiconductor region 23d including the $p^-$-type semiconductor region 21d and the $p^+$-type semiconductor region 22d is formed.

In this step S15, note that the resist film PR2 is patterned so as to expose the region AR3, and an n-type impurity is introduced into the semiconductor film 24c and the semiconductor region VT1 in the region AR3. Moreover, in the region AR3, a contact region CR1 including the semiconductor film 24c and the semiconductor region VT1 to which the p-type impurity has been introduce is formed.

Next, as shown in FIG. 3, a silicide film SIL is formed (step S16 in FIG. 14).

In this step S16, a metal film is formed in the entire upper surface of the SOI substrate SB so as to cover the $n^+$-type semiconductor region 21a and 21c, the $p^+$-type semiconductor regions 21b and 21d, the gate electrodes CG, GE1 and GE2, and the sidewall spacers SW1, SW2, SW3 and SW4. The metal film is made of, for example, a cobalt (Co) film, a nickel (Ni) film, a nickel-platinum alloy metal film or others, and can be formed by using a sputtering method or others. Moreover, by performing a heat treatment on the SOI substrate SB, each upper layer portion of the $n^+$-type semiconductor regions 21a and 21c, the $p^+$-type semiconductor regions 21b and 21d, and the gate electrodes CG, GE1 and GE2, is reacted with the metal film. Then, an unreacted metal film is removed.

By performing a so-called salicide process, the silicide film SIL is formed on each of the $n^+$-type semiconductor regions 21a and 21c, the $p^+$-type semiconductor regions 21b and 21d, and the gate electrodes CG, GE1 and GE2. The silicide film SIL can be prepared as, for example, a cobalt silicide layer, a nickel silicide layer, or a nickel silicide layer with platinum added thereto.

Next, as shown in FIG. 3, the interlayer insulating film IL1 and the plug PG are formed (step S17 in FIG. 14).

In this step S17, first, as shown in FIG. 3, the interlayer insulating film IL1 is formed in the entire upper surface of the SOI substrate SB. The interlayer insulating film IL1 is made of, for example, an insulating film made of a silicon oxide film or a stacked film of an insulating film made of a silicon nitride film and an insulating film made of a silicon oxide film, or others. After forming the interlayer insulating film IL1 by using, for example, a CVD method, the upper surface of the interlayer insulating film IL1 is flattened.

In this step S17, as shown in FIG. 3, a plug PG that penetrates through the interlayer insulating film IL1 is formed. First, a contact hole CNT is formed in the interlayer insulating film IL1 by dry-etching the interlayer insulating film IL1 by using a resist pattern (not illustrated) formed on the interlayer insulating film IL1 as an etching mask by using photolithography. Next, a conductive plug PG made of, tungsten (W) or others, is formed inside the contact hole CNT as, for example, a conductor portion.

In order to form the plug PG, for example, a barrier conductor film made of, for example, a titanium (Ti) film, a titanium nitride (TiN) film, or a stacked film of them, is formed on the interlayer insulating film IL1 including the inside of the contact hole CNT. Then, on this barrier conductor film, a main conductor film made of, for example, a tungsten (W) film or others, is formed so as to bury the contact hole CNT, and unnecessary main conductor film and barrier conductor film on the interlayer insulating film IL1 are removed by using a CMP method, an etch back method or others. Thus, the plug PG can be formed. For simplicity of drawings, note that FIG. 3 illustrates the barrier conductor film and the main conductor film forming the plug PG as an integral portion.

The contact hole CNT and the plug PG buried therein are also formed on each of the $n^+$-type semiconductor regions 22a and 22c, and each of the $p^+$-type semiconductor regions 22b and 22d, and also each of the gate electrodes CG, GE1 and GE2 although illustrations thereof will be omitted. On the bottom of the contact hole CNT, a part of the silicide film SIL on, for example, each of the $n^+$-type semiconductor regions 22a and 22c and each of the $p^+$-type semiconductor regions 22b and 22d, is exposed, and a part of the silicide film SIL on each of the gate electrodes CG, GE1 and GE2 is also exposed although illustrations thereof will be omitted.

Next, as shown in FIG. 3, the interlayer insulating film IL2 and the wiring ML1 are formed (step S18 in FIG. 14).

In this step S18, first, as shown in FIG. 3, on the interlayer insulating film IL1 on which the plug PG is formed, an interlayer insulating film IL2 made of, for example, a silicon oxide film is formed. And, by using a photolithography technique and an etching technique, wiring trenches are formed in the interlayer insulating film IL2. Then, on the interlayer insulating film IL2 including the inside of the wiring trench, a copper (Cu) film is formed. Then, the copper film exposed onto the interlayer insulating film IL2 other than the inside of the wiring trench is removed by polishing by, for example, a CMP method, so that the copper film is left only inside the wiring trench formed in the interlayer insulating film IL2. Thus, a wiring ML1 can be formed. In this manner, a semiconductor chip CHP1 serving as the semiconductor device of the present embodiment can be formed.

In the present first embodiment, note that the example of the formation of the wiring ML1 made of a copper film has been explained. However, a wiring ML1 made of an aluminum (Al) film may be formed.

Second Embodiment

In the semiconductor device according to the first embodiment, in the memory formation region MR, the n-type semiconductor region 23a is formed on one side of the gate electrode CG, and the p-type semiconductor region 23b is formed on the side opposite to the one side of the gate electrode CG. On the other hand, in the semiconductor device according to a second embodiment, the impurity concentration in the channel region CHM of the memory cell MC formed in the memory formation region MR is set to be higher than the impurity concentration in the channel region CH1 of the MISFET 7a formed in the low-breakdown-voltage MISFET formation region AR1.

Also in the present second embodiment, note that the layout of the semiconductor CHP1 and the circuit block of the non-volatile memory may be formed as similar to those of the first embodiment.

<Configuration of Semiconductor Device>

Figure 27:
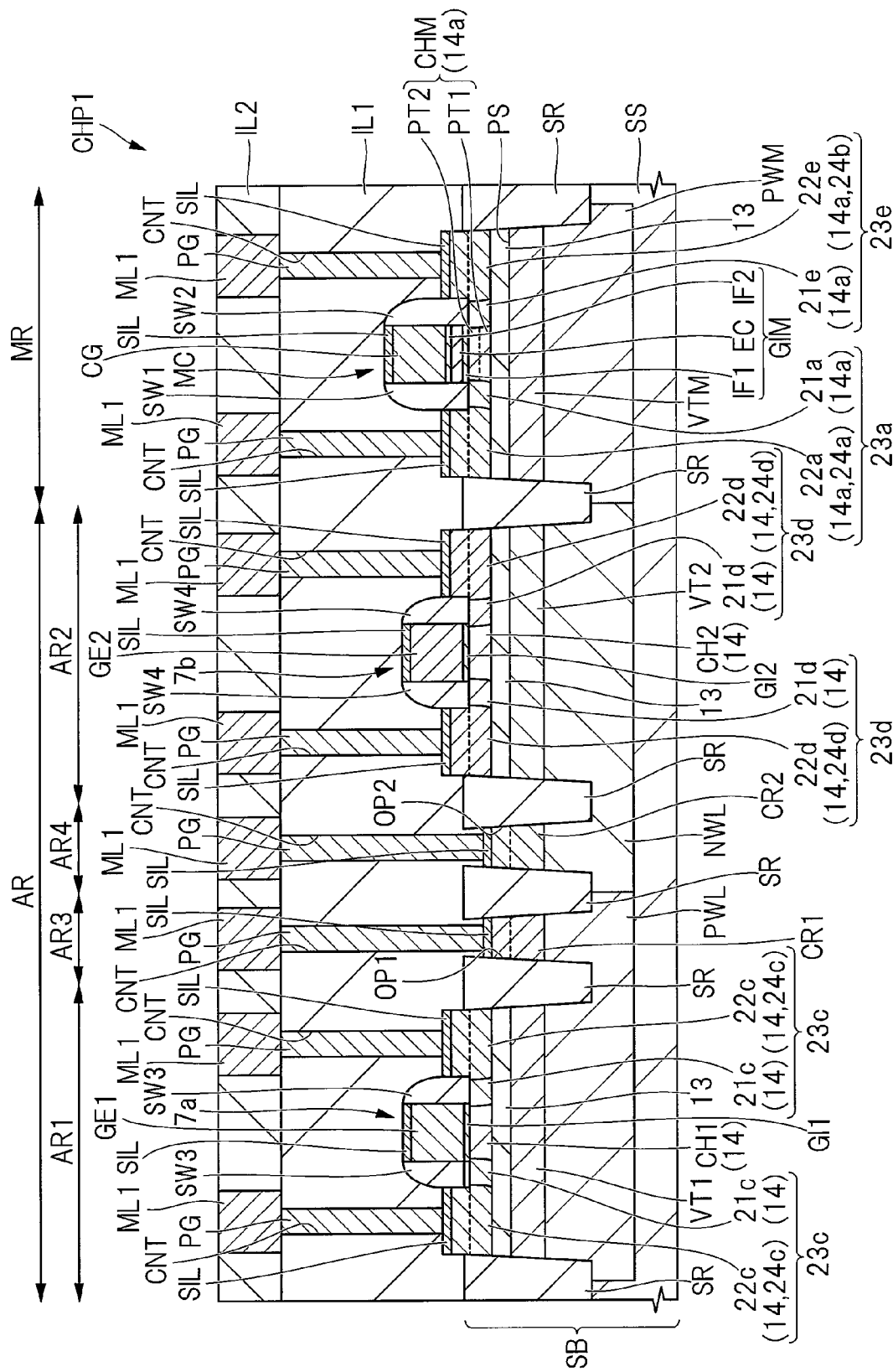
FIG. 27 is a cross-sectional view of a principal part of a semiconductor device of a second embodiment.

Next, with respect to drawings, the configuration of a semiconductor chip CHP1 serving as the semiconductor device of the second embodiment is explained. FIG. 27 is a cross-sectional view of a principal part of the semiconductor device of the second embodiment.

As shown in FIG. 27, each portion of the semiconductor device of the present second embodiment except for a channel region CHM, an n⁻-semiconductor region 21e and an n⁺-semiconductor region 22e in the memory formation region MR can be as similar to each portion of the semiconductor device of the first embodiment shown in FIG. 3, and the description thereof will be omitted.

Note that the memory cell MC in the semiconductor device of the second embodiment has a configuration similar to that of a normal field-effect transistor in that both of the two semiconductor regions corresponding to the source region and the drain region are n-type semiconductor regions.

The memory cell MC according to the second embodiment has a p-type well PWM, a semiconductor region VTM, a BOX layer 13, a channel region CHM, a gate insulating film GIM, a gate electrode CG and sidewall spacers SW1 and SW2. Moreover, the memory cell MC of the second embodiment has an n⁻-type semiconductor region 21a, an n⁻-type semiconductor region 21e, an n⁺-type semiconductor region 22a and a p⁺-type semiconductor region 22e.

Note that the p-type well PWM, the semiconductor region VIM, the BOX layer 13, the gate insulating film GIM, the gate electrode CG and the sidewall spacers SW1 and SW2, the n⁻-type semiconductor region 21a and the n⁺-type semiconductor region 22a can be the same as the respective portions of the first embodiment, and the description thereof will be omitted.

In the memory formation region MR, an SOI layer 14a to which a p-type impurity is introduced is formed. Moreover, in the memory formation region MR, a channel region CHM is formed in the SOI layer 14a of a portion located below the gate electrode CG. The channel region CHM is a p-type semiconductor region to which a p-type impurity such as boron (B) is introduced. The p-type impurity concentration in the channel region CHM can be set to, for example, about $1 \times 10^{17}$ to $1 \times 10^{18}$ cm⁻³.

As different from the first embodiment, in the present second embodiment, an n⁻-type semiconductor region 21e is formed in the SOI layer 14a in a portion located below the sidewall spacer SW2. Moreover, when seen in a plan view, an n⁺-type semiconductor region 22e is formed in the SOI layer 14a in a portion located on the side opposite to the gate electrode CG across the n⁻-type semiconductor region 21e. The n⁺-type semiconductor region 22e is made in contact with the n⁻-type semiconductor region 21e, and the impurity concentration in the n⁺-type semiconductor region 22e is higher than the impurity concentration in the n⁻-type semiconductor region 21e. An LDD configuration is formed of the n⁻-type semiconductor region 21e and the n⁺-type semiconductor region 22e. The n-type impurity concentration in the n⁺-type semiconductor region 22e can be set to, for example, about $5 \times 10^{19}$ to $5 \times 10^{20}$ cm⁻³, and the n-type impurity concentration in the n⁻-type semiconductor region 21e can be made lower than the n-type impurity concentration in the n⁺-type semiconductor region 22e.

That is, in the present second embodiment, as similar to the first embodiment, in the memory formation region MR, an n-type semiconductor region 23a including the n⁻-type semiconductor region 21a and the n⁺-type semiconductor region 22a is formed in the SOI layer 14a in a portion located on one side (left side in FIG. 27) of the gate electrode CG when seen in a plan view. Moreover, in the present second embodiment, as different from the first embodiment, when seen in a plan view, in the memory formation region MR, an n-type semiconductor region 23e including the n⁻-type semiconductor region 21e and the n⁺-type semiconductor region 22e is also formed in the SOI layer 14a in a portion located on the side (right side in FIG. 27) opposite to the one side of the gate electrode CG.

Moreover, in the memory formation region MR, a semiconductor film 24b made of a silicon film grown by a selective epitaxial growth may be formed on the SOI layer 14a in a portion located on the side when seen in a plan view. Moreover, the n⁺-type semiconductor region 22e may also be formed in the semiconductor film 24b. At this time, when seen in a plan view, the n⁺-type semiconductor region 22e is formed in the SOI layer 14a in a portion located on the side opposite to the one side of the gate electrode CG and on the semiconductor film 24b.

<Operations of Non-Volatile Memory Cell>

The operations of a memory cell serving as a non-volatile memory cell included in the semiconductor device of the present second embodiment can be the same as the operations of the memory cell explained with reference to FIGS. 4 to 6 in the first embodiment, except that the n-type semiconductor region 23e is formed in place of the p-type semiconductor region 23b.

Main Features and Effects of Present Embodiment

In the semiconductor device of the present second embodiment, in the memory formation region MR, when seen in a plan view, an n-type semiconductor region 23a including an n⁻-type semiconductor region 21a and an n+-type semiconductor region 22a is formed in the SOI layer 14a in a portion located on one side of the gate electrode CG as similar to the semiconductor device of the first embodiment.

On the other hand, in the semiconductor device of the present second embodiment, in the memory formation region MR, when seen in a plan view, the n-type semiconductor region 23e including the n−-type semiconductor region 21e and the n+-type semiconductor region 22e is formed in the SOI layer 14a in a portion located on the side opposite to the one side of the gate electrode CG as different from the semiconductor device of the first embodiment. Moreover, the p-type impurity concentration in the channel region CHM of the memory cell MC formed in the memory formation region MR is higher than the p-type impurity concentration in the channel region CH1 of the n-channel-type MISFET 7a formed in the low-breakdown-voltage MISFET formation region AR1. That is, the channel region CH1 contains the p-type impurity having a concentration lower than the p-type impurity concentration in the channel region CHM, or does not contain the p-type impurity.

As similar to the semiconductor device of the comparative example explained with reference to FIG. 7, in the semiconductor device of the present second embodiment, electrons are implanted from the n-type semiconductor region 23a to the charge storage film EC when the data is written into the memory cell MC. On the other hand, in the semiconductor device of the present second embodiment, positive holes are implanted from the channel region CHM to the charge storage film EC when data stored in the memory cell MC is erased.

Therefore, in the semiconductor device of the present second embodiment, when the data of the memory cell MC is erased, the speed of the implantation of the positive holes from the channel region CHM to the charge storage film EC becomes faster than that of the semiconductor device of the comparative example, and the data erasing speed becomes faster, so that the performances of the semiconductor device can be improved.

In the specification of the present application, note that the p-type impurity concentration in a certain region means the average value of the p-type impurity concentration in the entire region.

Moreover, the channel region CH1 of the MISFET 7a formed in the low-breakdown-voltage MISFET formation region AR1 may contain a p-type impurity. In such a case, the p-type impurity concentration in a portion PT1 in contact with the BOX layer 13 of the channel region CHM in the memory cell MC formed in the memory formation region MR is higher than the p-type impurity concentration in the channel region CH1 of the MISFET 7a formed in the low-breakdown-voltage MISFET formation region AR1.

Thus, the p-type impurity concentration in the channel region CHM of the memory cell MC can be made securely higher than the p-type impurity concentration in the channel region CH1 of the MISFET 7a formed in the low-breakdown-voltage MISFET formation region AR1. Moreover, the p-type impurity concentration of a portion PT2 in contact with the gate insulating film GIM of the channel region CHM can be made lower than the p-type impurity concentration of the portion PT1 in contact with the BOX layer 13 of the channel region CHM.

That is, preferably, the portion PT2 in contact with the gate insulating film GIM of the channel region CHM contains the p-type impurity having a concentration lower than the p-type impurity concentration in the portion PT1 in contact with the BOX layer 13 of the channel region CHM, or does not contain the p-type impurity.

Thus, while keeping the high p-type impurity concentration in the channel region CHM, the p-type impurity concentration in the portion PT2 in contact with the gate insulating film GIM of the channel region CHM can be made lower. Therefore, when the data in the memory cell MC is erased, the speed of the implantation of the positive holes from the channel region CHM to the charge storage film EC becomes faster, and the data erasing speed becomes faster, so that the performances of the semiconductor device can be improved, and the threshold voltage of the memory cell MC can be made lower.

More preferably, the channel region CHM contains the p-type impurity and an impurity made of carbon. The impurity made of carbon has characteristics suppressing diffusion of the p-type impurity. Therefore, in the channel region CHM containing a p-type impurity and an impurity made of carbon, the random fluctuation of the impurity (Random Dopant Fluctuation) in the p-type impurity can be reduced. Therefore, the fluctuation in the threshold voltage among the memory cells MC can be made smaller. Therefore, even when the power-supply voltage is lowered, the writing operation, erasing operation and reading operation can be stably performed.

Note that the conductive types of the respective semiconductor regions included in the memory cell MC in the present second embodiment may be collectively changed to the reversed conductive types. In the erasing operation in such a case, electrons are implanted in place of positive holes, and the speed of the implantation of the electrons can be made faster, so that the performances of the semiconductor device can be improved.

Moreover, the gate insulating film GIM of the memory cell MC in the present second embodiment may have a conductor film such as a metal film in place of the charge storage film EC, and the conductor film may be in an electrically floating state. That is, the memory cell MC in the present first embodiment may have not an SONGS film but a floating gate as the charge storage portion.

<Method of Manufacturing Semiconductor Device>

Next, a method of manufacturing the semiconductor device of the present second embodiment will be explained.

Figure 28:
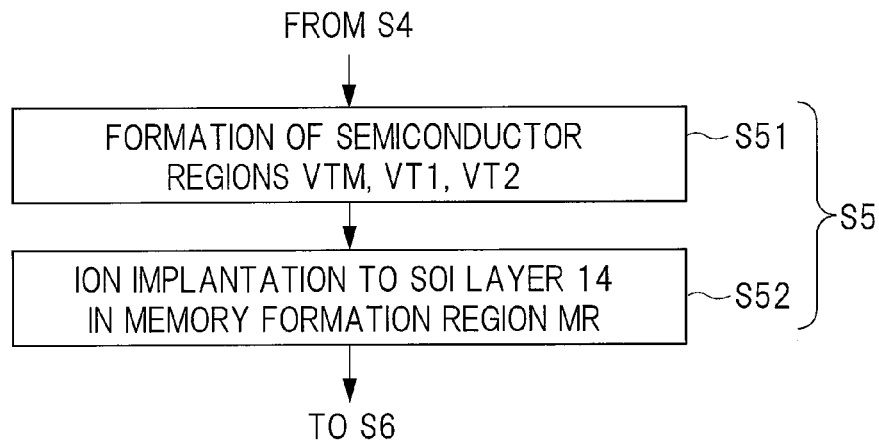
FIG. 28 is a process flowchart showing a part in manufacturing processes of the semiconductor device of the second embodiment.
Figure 29:
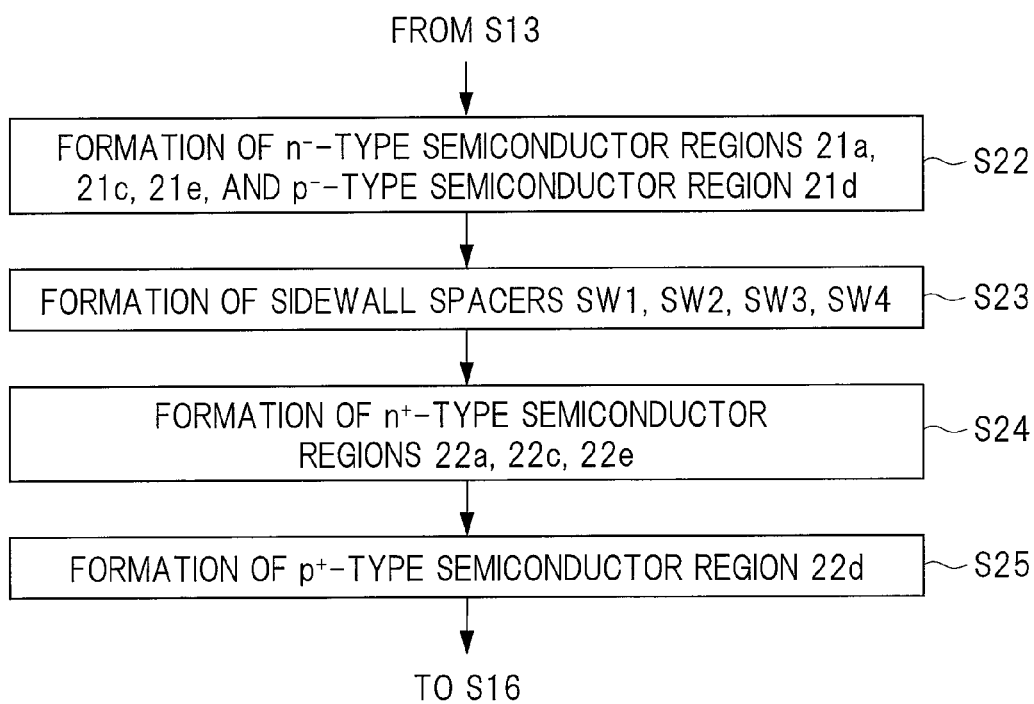
FIG. 29 is a process flowchart showing a part in manufacturing processes of the semiconductor device of the second embodiment.

FIGS. 28 and 29 are process flowcharts each showing a part of manufacturing processes of the semiconductor device of the second embodiment. FIGS. 30 to 36 are cross-sectional views of a principal part in the manufacturing processes of the semiconductor device of the second embodiment. FIGS. 30 to 36 show cross-sectional views of a principal part of the memory formation region MR and the main circuit formation region AR.

In the method of manufacturing the semiconductor device of the present second embodiment, first, by performing steps S1 to S3 of FIG. 13 as similar to the method of manufacturing the semiconductor device of the first embodiment, an SOI substrate SB is prepared, an element separation region SR is formed and a sacrificed oxide film SO1 is formed, as shown in FIG. 15.

Next, as similar to the method of manufacturing the semiconductor device of the first embodiment, by performing step S4 of FIG. 13, p-type wells PWN and PWL and an n-type well NWL are formed, as shown in FIG. 16.

Figure 30:
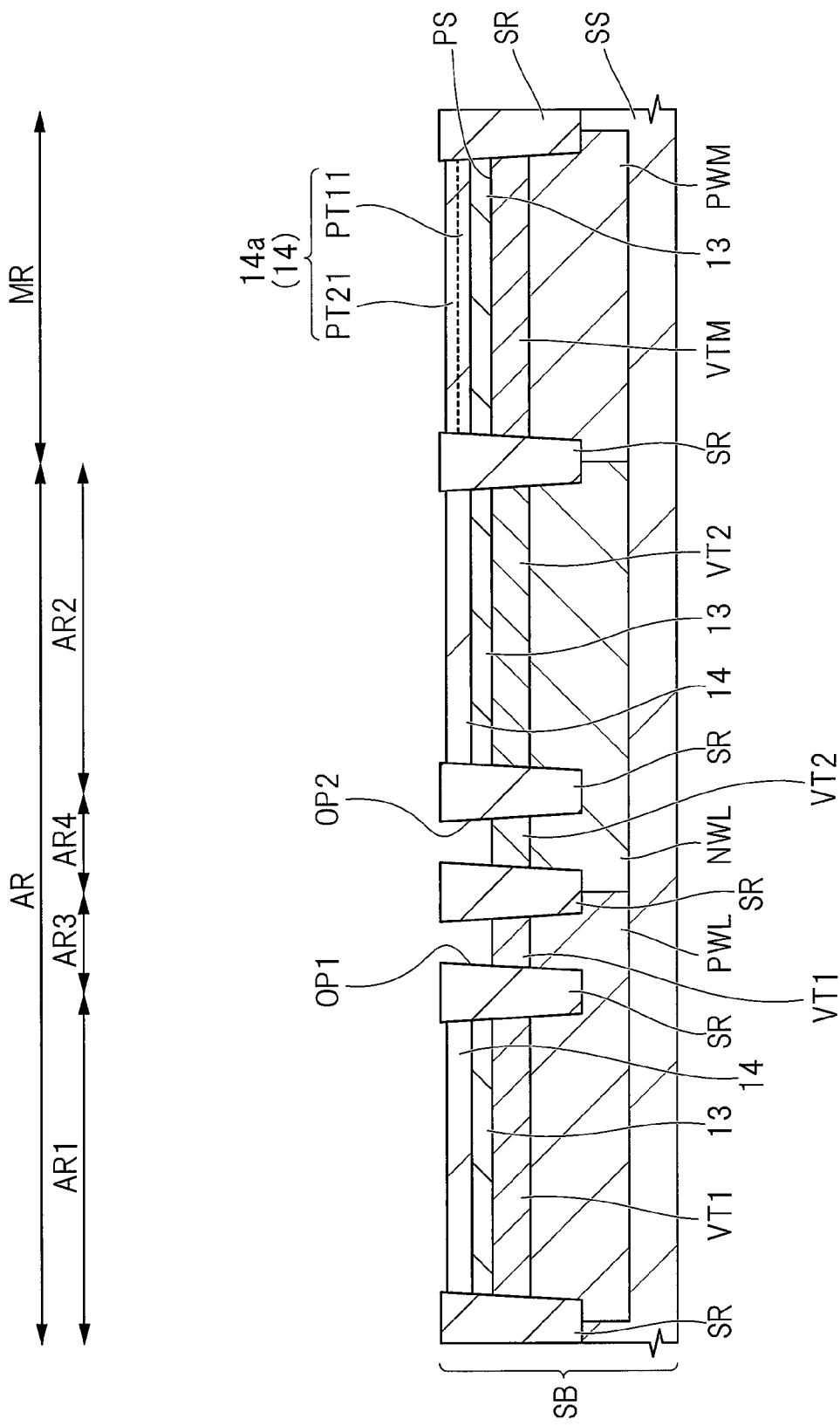
FIG. 30 is a cross-sectional view of a principal part in manufacturing processes of the semiconductor device of the second embodiment.

Next, as shown in FIG. 30, semiconductor regions VTM, VT1 and VT2 are formed (step S5 in FIG. 28). Here, in the present second embodiment, as different from the first embodiment, step S5 includes a step of forming the semiconductor regions VTM, VT1 and VT2 (step S51 in FIG. 28)

and a step of implanting ions to the SOI layer 14 in the memory formation region MR (step S52 in FIG. 28).

First, in step S51, as shown in FIG. 30, the semiconductor regions VTM, VT1 and VT2 are formed. The step of forming the semiconductor regions VTM, VT1 and VT2 may be the same as the step explained with reference to FIG. 17 in the first embodiment.

Next, in step S52, a resist film (illustration is omitted) is patterned so as to cover the low-breakdown-voltage MISFET formation regions AR1 and AR2 and also to expose the memory formation region MR. Then, by an ion implantation method using the patterned resist film (illustration is omitted) as a mask, a p-type impurity such as boron (B) is introduced into the SOI layer 14.

Thus, in the memory formation region MR, an SOI layer 14a serving as the SOI layer 14 to which the p-type impurity is introduced is formed. The implantation condition at the time of ion implantation is adjusted so that the p-type impurity concentration in the SOI layer 14a is, for example, about $1 \times 10^{17}$ to $1 \times 10^{18}$ cm$^{-3}$.

Note that step S52 may be performed not after but before step S51. That is, the step of implanting ions to the SOI layer 14 in the memory formation region MR may be performed at point of time either before or after the step of forming the semiconductor regions VTM, VT1 and VT2.

At this time, the p-type impurity concentration in a portion PT21 in contact with the gate insulating film GIM of the SOI layer 14a in the memory formation region MR may be made lower than the p-type impurity concentration in a portion PT11 in contact with the BOX layer 13 of the SOI layer 14a in the memory formation region MR.

In step S52, it is preferable to introduce carbon to the SOI layer 14 in the memory formation region MR when the p-type impurity such as boron (B) is introduced into the SOI layer 14 by an ion implantation method using the patterned resist film (illustration is omitted) as a mask. By this process, for example, boron ions can be co-introduced together with carbon ions (Carbon co-implantation).

Carbon ions have characteristics suppressing diffusion of the p-type impurity. Therefore, the random fluctuation of the impurity in the p-type impurity can be reduced in the channel region CHM (see FIG. 34 described later), which is formed in a portion of the SOI layer 14a serving as the SOI layer 14 to which boron ions are co-implanted with carbon ions, the portion located below the gate electrode CG (see FIG. 32 described later). Therefore, the fluctuation in the threshold voltage among the memory cells MC can be made smaller, the writing operation. Therefore, even when the power-supply voltage is lowered, the writing operation, erasing operation and reading operation can be stably performed.

Note that the step of ion-implanting the carbon is preferably performed before the step of ion-implanting a p-type impurity such as boron. Thus, when the p-type impurity is ion-implanted to the SOI layer 14, the carbon has been already introduced to the SOI 14 layer, and therefore, the random dopant fluctuation in the channel region CHM (see FIG. 34 described later) can be securely reduced.

Figure 31:
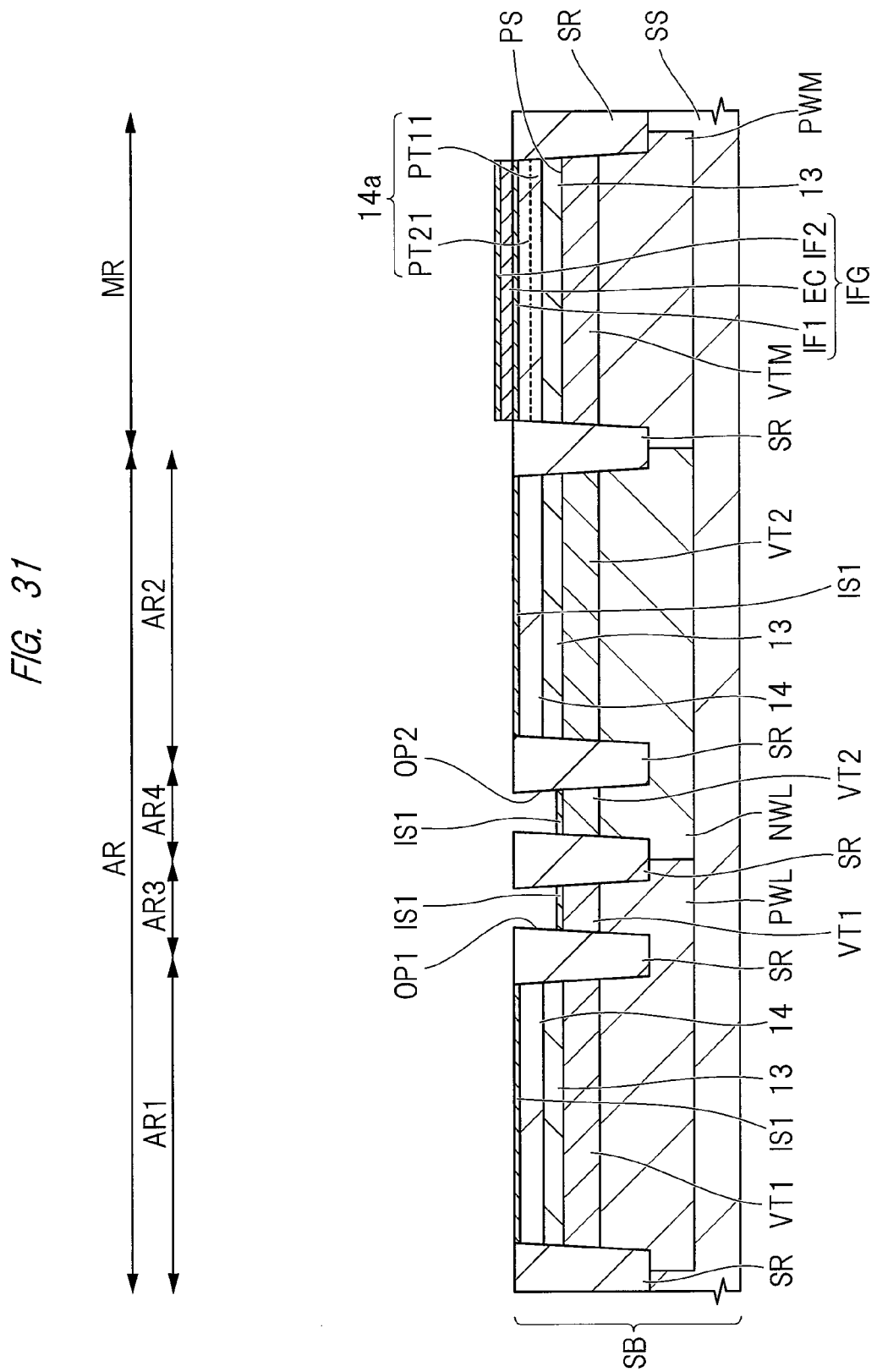
FIG. 31 is a cross-sectional view of a principal part in manufacturing processes of the semiconductor device of the second embodiment.

Next, as similar to the method of manufacturing the semiconductor device of the first embodiment, by performing a step corresponding to step S6 of FIG. 13, insulating films IFG and IS1 are formed as shown in FIG. 31.

Figure 32:
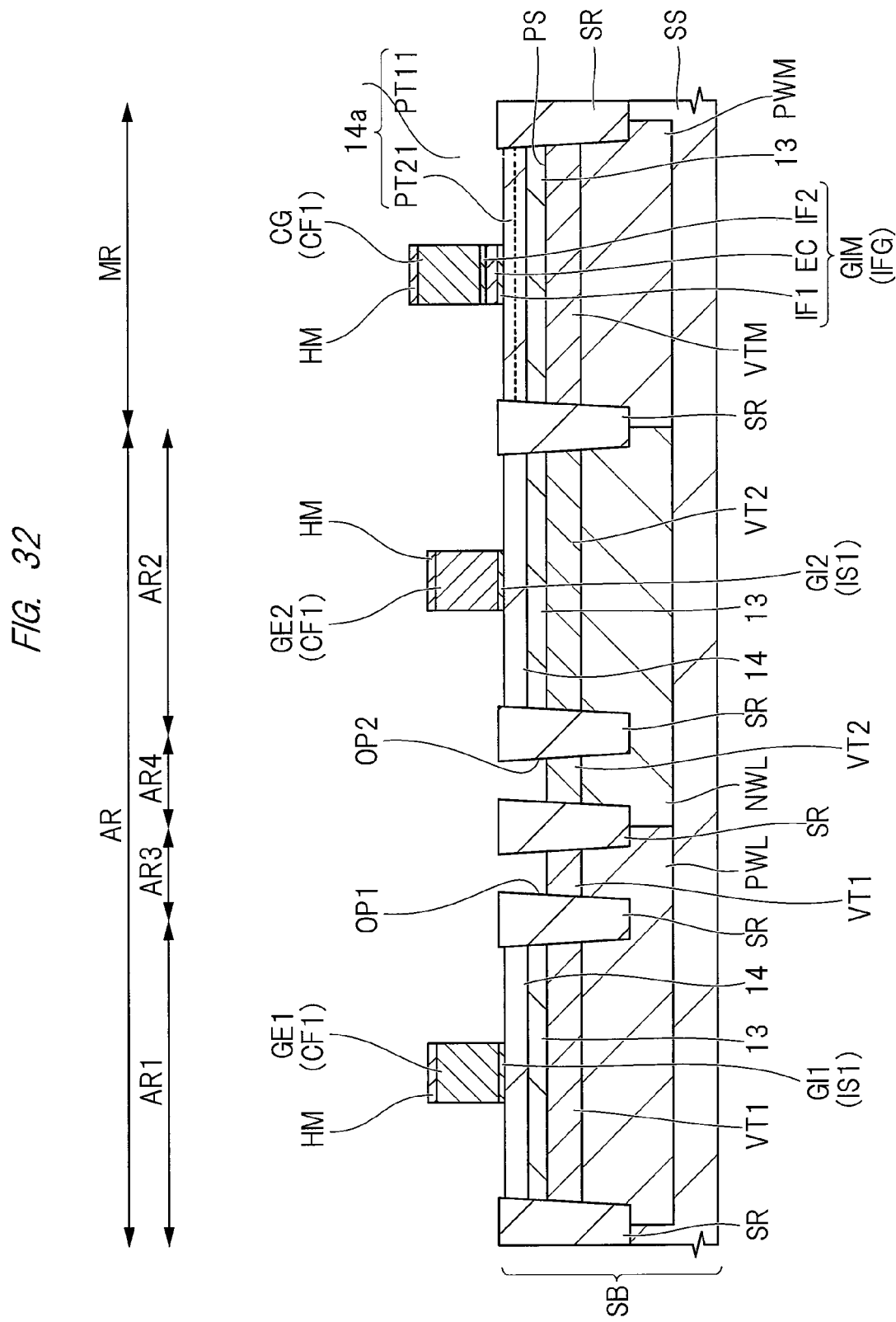
FIG. 32 is a cross-sectional view of a principal part in manufacturing processes of the semiconductor device of the second embodiment.

Next, as similar to the method of manufacturing the semiconductor device of the first embodiment, by performing a step corresponding to step S7 of FIG. 13, the conductor film CF1 is formed as shown in FIG. 32.

Next, as similar to the method of manufacturing the semiconductor device of the first embodiment, by performing a step corresponding to step S8 of FIG. 13, the conductor film CF1 and the insulating films IFG and IS1 are patterned formed as shown in FIG. 32.

Figure 33:
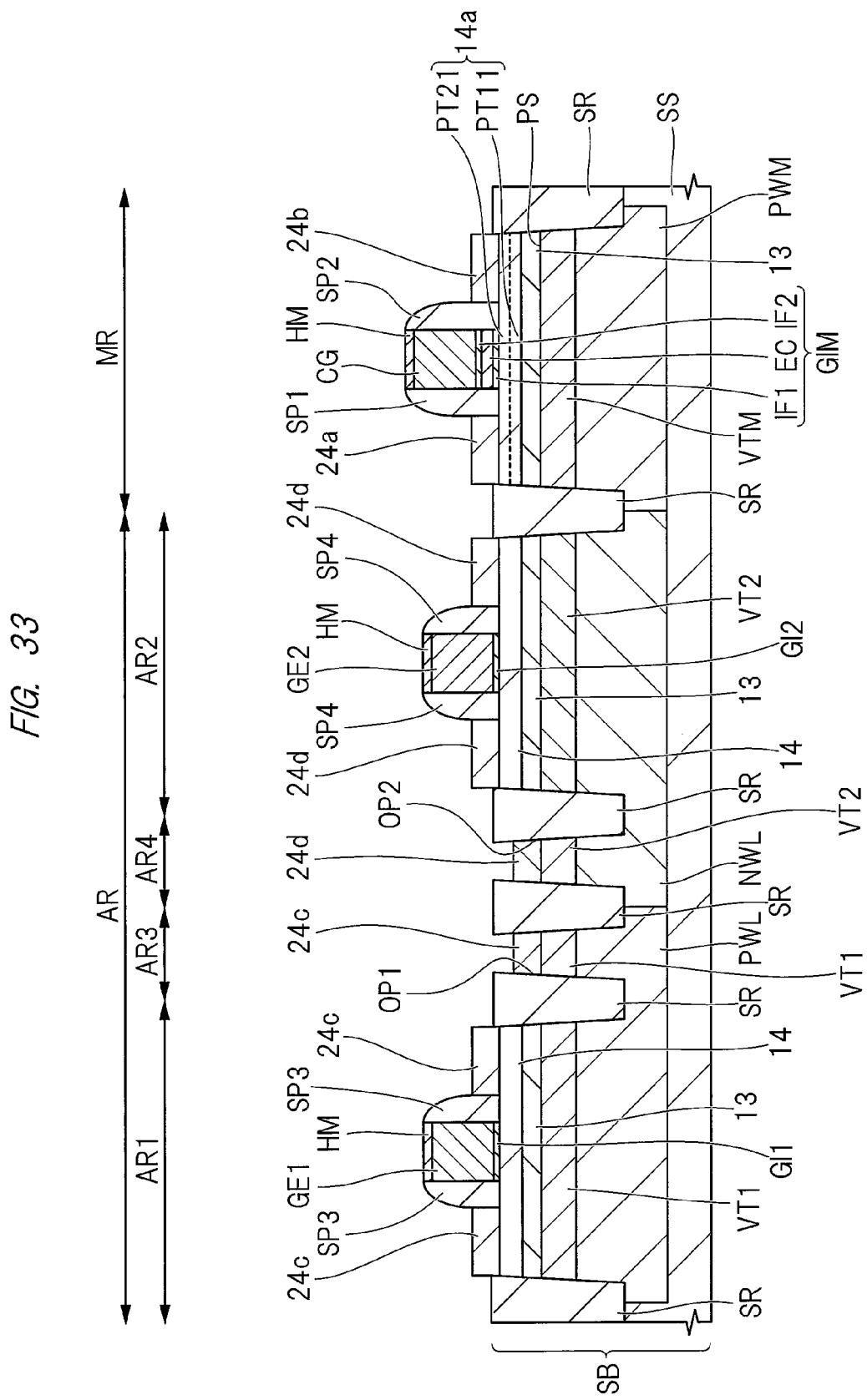
FIG. 33 is a cross-sectional view of a principal part in manufacturing processes of the semiconductor device of the second embodiment.

Next, as similar to the method of manufacturing the semiconductor device of the first embodiment, by performing a step corresponding to step S9 of FIG. 13, the sidewall spacers SP1, SP2, SP3, and SP4 are formed as shown in FIG. 33.

Next, as similar to the method of manufacturing the semiconductor device of the first embodiment, by performing a step corresponding to step S10 of FIG. 13, the semiconductor films 24a, 24b, 24c, and 24d are formed as shown in FIG. 33.

Figure 34:
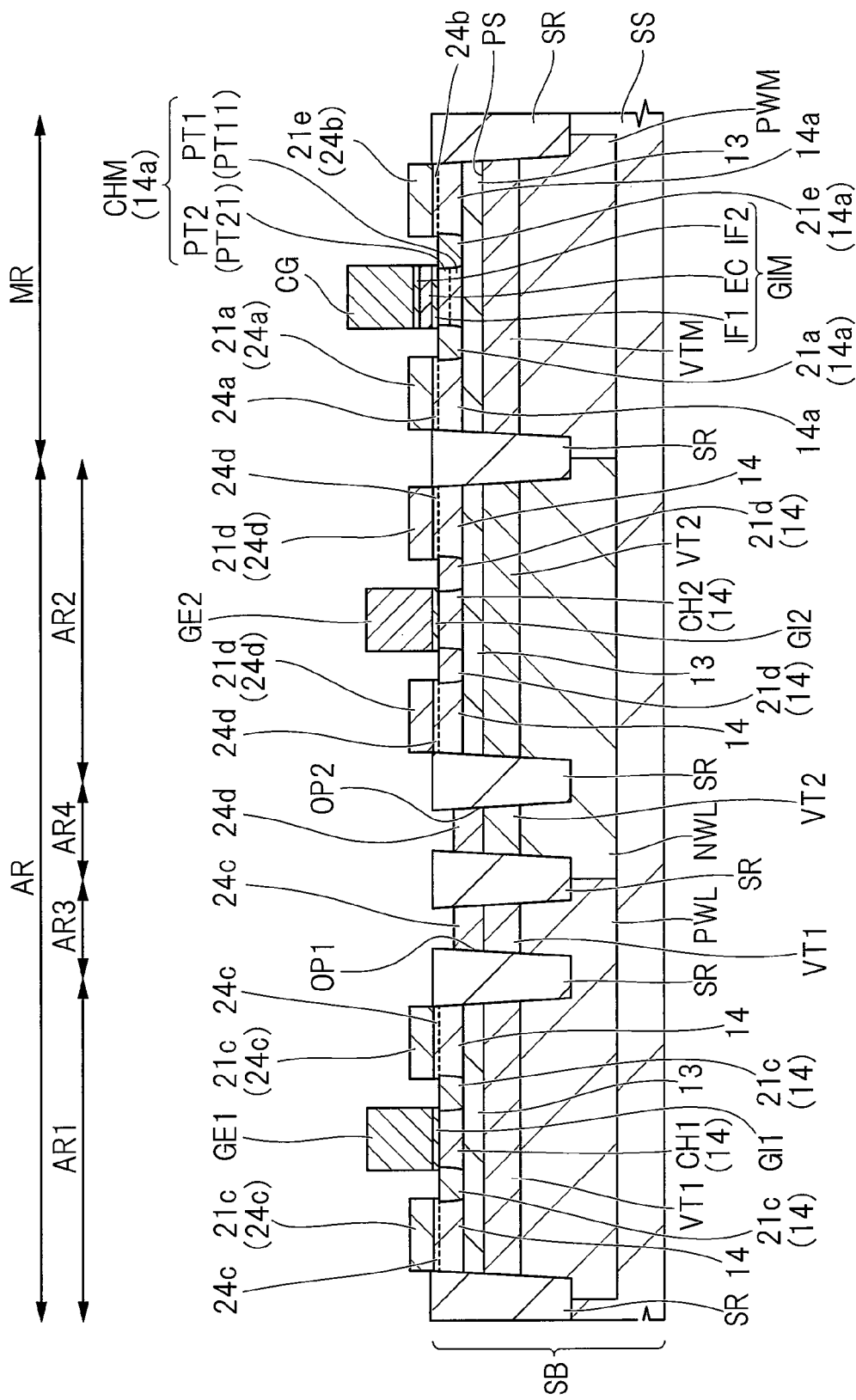
FIG. 34 is a cross-sectional view of a principal part in manufacturing processes of the semiconductor device of the second embodiment.

Next, as similar to the method of manufacturing the semiconductor device of the first embodiment, by performing a step corresponding to step S11 of FIG. 14, the sidewall spacers SP1, SP2, SP3, and SP4 are removed as shown in FIG. 34.

Next, by performing a step corresponding to step S12 of FIG. 14, the n$^-$-type semiconductor regions 21a, 21c, and 21e and the p$^-$-type semiconductor region 21d are formed as shown in FIG. 34 (step S22 of FIG. 29).

Next, in step S22, a resist film (illustration is omitted) is patterned so as to cover the low-breakdown-voltage MISFET formation region AR2 and also to expose the memory formation region MR and the low-breakdown-voltage MISFET formation region AR1. Then, by an ion implantation method using the patterned resist film (illustration is omitted) as a mask, an n-type impurity such as phosphorous (P) or arsenic (As) is introduced into the semiconductor film 24a and the SOI layer 14a below the semiconductor film 24a, and into the semiconductor film 24b and the SOI layer 14a below the semiconductor film 24b. Also, an n-type impurity is introduced into the semiconductor film 24c and the SOI layer 14 below the semiconductor film 24c.

Thus, in the memory formation region MR, when seen in a plan view, an n$^-$-type semiconductor region 21a is formed in the SOI layer 14a in a portion located on one side (left side in FIG. 34) of the gate electrode CG. Moreover, in the memory formation region MR, when seen in a plan view, an n$^-$-type semiconductor region 21e is formed in the SOI layer 14a in a portion located on the side (right side in FIG. 34) opposite to the one side of the gate electrode CG. Moreover, in the low-breakdown-voltage MISFET formation region AR1, when seen in a plan view, an n$^-$-type semiconductor region 21c is formed in the SOI layer 14 in portions located on both sides across the gate electrode GE1. The n$^-$-type semiconductor region 21a and 21e are formed in the memory formation region MR so as to be aligned on the gate electrode CG, and the n$^-$-type semiconductor region 21c is formed in the low-breakdown-voltage MISFET formation region AR1 so as to be aligned on the gate electrode GE1.

Note that the n$^-$-type semiconductor region 21a is also formed in the upper layer portion of the semiconductor film 24a in the memory formation region MR, and the n$^-$-type semiconductor region 21e is also formed in the upper layer portion of the semiconductor film 24b in the memory formation region MR. Also, the n$^-$-type semiconductor region 21c is also formed in the upper layer portion of the semiconductor film 24c in the low-breakdown-voltage MISFET formation region AR1.

Moreover, in step S22, a resist film (illustration is omitted) is patterned so as to cover the memory formation region MR and the low-breakdown-voltage MISFET formation region AR1 and also to expose the low-breakdown-voltage MISFET formation region AR2. Then, by an ion implantation method using the patterned resist film (illustration is omitted) as a mask, a p-type impurity such as boron (B) is introduced into the semiconductor film 24d and the SOI layer 14 below the semiconductor film 24d.

Thus, in the low-breakdown MISFET formation region AR2, when seen in a plan view, the p⁻-type semiconductor region 21d is formed in the SOI layer 14 in portions located on both sides across the gate electrode GE2. The p⁻-type semiconductor region 21d is formed in the low-breakdown MISFET formation region AR2 so as to be aligned on the gate electrode GE2. Note that the p⁻-type semiconductor region 21d is also formed in the upper layer portion of the semiconductor film 24d in the low-breakdown MISFET formation region AR2.

Figure 35:
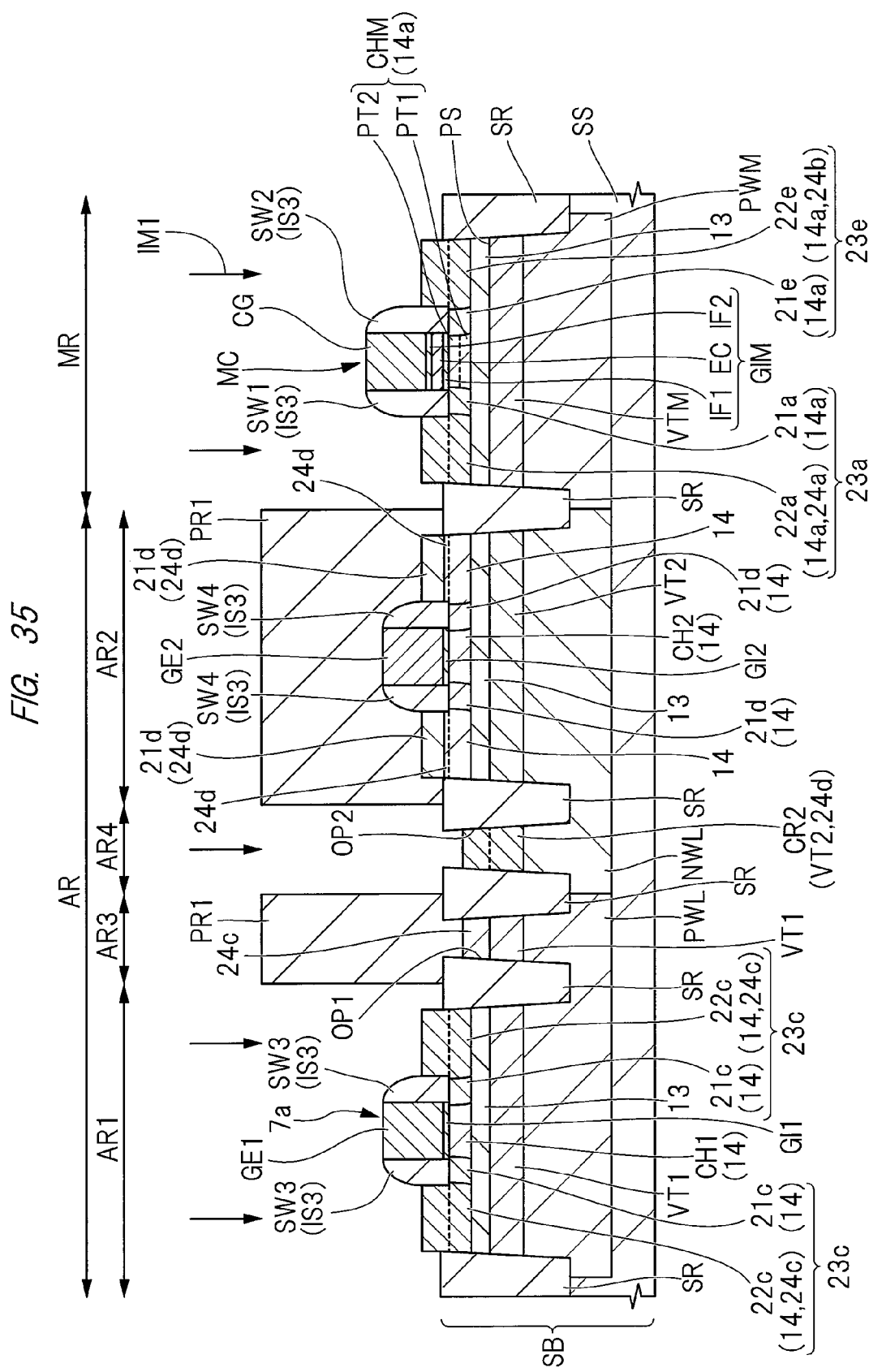
FIG. 35 is a cross-sectional view of a principal part in manufacturing processes of the semiconductor device of the second embodiment.

Next, as similar to the method of manufacturing the semiconductor device of the first embodiment, by performing a step corresponding to step S13 of FIG. 14, sidewall spacers SW1, SW2, SW3 and SW4 are formed (step S23 in FIG. 29), as shown in FIG. 35.

Next, as shown in FIG. 35, n⁺-type semiconductor regions 22a, 22c and 22e are formed (step S24 in FIG. 29).

In this step S14, a resist film. PR1 is patterned so as to cover the low-breakdown-voltage MISFET formation region AR2, and also to expose the memory formation region MR and the low-breakdown-voltage MISFET formation region AR1. Then, by an ion implantation method using the patterned resist film PR1 as a mask, an n-type impurity, such as phosphorus (P) or arsenic (As) is introduced to the semiconductor film 24a and the SOI layer 14a below the semiconductor film 24a, and to the semiconductor film 24b and the SOI layer 14 below the semiconductor film 24b. Moreover, the n-type impurity is introduced to the semiconductor film 24c and the SOI layer 14 below the semiconductor film 24c. That is, n-type impurity ions IM1 are ion-implanted into the semiconductor films 24a, 24b and 24c.

Thus, in the memory formation region MR, when seen in a plan view, an n⁺-type semiconductor region 22a is formed in the semiconductor film 24a and the SOI layer 14a in a portion located on the side opposite to the gate electrode CG across the sidewall spacer SW1. Moreover, in the memory formation region MR, when seen in a plan view, an n⁺-type semiconductor region 22e is formed in the semiconductor film 24b and the SOI layer 14a in a portion located on the side opposite to the gate electrode CG across the sidewall spacer SW2. Furthermore, in the low-breakdown MISFET formation region AR1, when seen in a plan view, an n⁺-type semiconductor region 22c is formed in the semiconductor film 24c and the SOI layer 14 in a portion located to the side opposite to the gate electrode GE1 across the sidewall spacer SW3. The n⁺-type semiconductor region 22a is formed in the memory formation region MR so as to be aligned on the sidewall spacer SW1, and the n⁺-type semiconductor region 22e is formed in the memory formation region MR so as to be aligned on the sidewall spacer SW2. Moreover, the n⁺-type semiconductor region 22c is formed in the low-breakdown-voltage MISFET formation region AR1 so as to be aligned on the sidewall spacer SW3. The implantation condition at the time of an ion implantation is adjusted so that the n-type impurity concentrations of the n⁺-type semiconductor regions 22a, 22c and 22e are, for example, about $5\times10^{19}$ to $5\times10^{20}$ cm$^{-3}$.

Thus, as shown in FIG. 35, in the memory formation region MR, a memory cell MC is formed of the p-type well region PWM, the gate insulating film GIM, the gate electrode CG, the sidewall spacers SW1 and SW2, the n⁻-type semiconductor region 21a, the n⁻-type semiconductor region 21e, the n⁺-type semiconductor region 22a and the n⁺-type semiconductor region 22e. Moreover, as shown in FIG. 35, in the low-breakdown-voltage MISFET formation region AR1, an n-channel type MISFET 7a is formed of the p-type well PWL, the gate insulating film GI1, the gate electrode GE1, the sidewall spacer SW3, the n⁻-type semiconductor region 21c and the n⁺-type semiconductor region 22c.

In this step S24, note that a resist film PR1 is patterned so as to expose the region AR4, and an n-type impurity is introduced to the semiconductor film 24d and the semiconductor region VT2 in the region AR4. Moreover, in the region AR4, a contact region CR2 including the semiconductor film 24d and the semiconductor region VT2 to which the n-type impurity has been introduced is formed.

Figure 36:
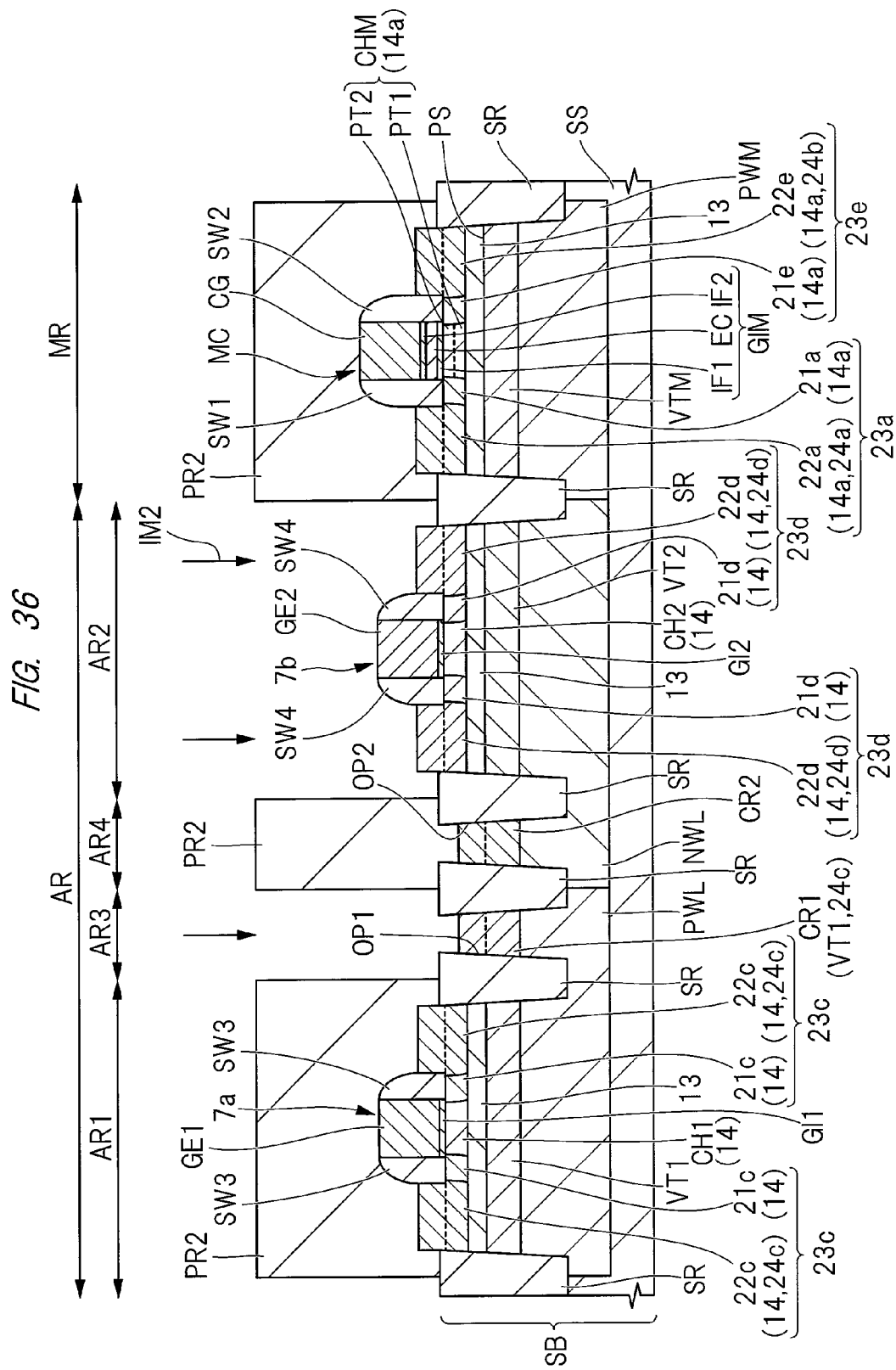
FIG. 36 is a cross-sectional view of a principal part in manufacturing processes of the semiconductor device of the second embodiment.

Next, as shown in FIG. 36, a p⁺-type semiconductor region 22d is formed (step S25 in FIG. 29).

In this step S25, the resist film PR2 is patterned so as to cover the memory formation region MR and the low-breakdown MISFET formation region AR1 and also to expose the low-breakdown MISFET formation region AR2. Then, by an ion implantation method using the patterned resist film PR2 as a mask, a p-type impurity such as boron (B) is introduced to the semiconductor film 24d and the SOI layer 14 below the semiconductor film 24d. That is, p-type impurity ions IM2 are ion-implanted into the semiconductor film 24d.

Thus, in the low-breakdown-voltage MISFET formation region AR2, when seen in a plan view, the p⁺-type semiconductor region 22d is formed in the semiconductor film 24b and the SOI layer 14 in a portion located on the side opposite to the gate electrode GE2 across the sidewall spacer SW4. The p⁺-type semiconductor region 22d is formed in the low-breakdown-voltage MISFET formation region AR2 so as to be aligned on the sidewall spacer SW4. The implantation condition at the time of ion implantation is adjusted so that the p-type impurity concentration in the p⁺-type semiconductor region 22d is, for example, about $5\times10^{19}$ to $5\times10^{20}$ cm$^{-3}$.

In this step S25, note that a resist film PR2 is patterned so as to expose the region AR3, and an n-type impurity is introduced to the semiconductor film 24c and the semiconductor region VT1 in the region AR3. Moreover, in the region AR3, a contact region CR1 including the semiconductor film 24c and the semiconductor region VT1 to which the p-type impurity has been introduced is formed.

Then, by performing processes corresponding to steps S16 to S18 in FIG. 14 as similar to the method of manufacturing the semiconductor device of the first embodiment, a semiconductor device of the present second embodiment can be formed as shown in FIG. 27.

In the foregoing, the invention made by the present inventors has been concretely described based on the embodiments. However, it is needless to say that the present invention is not limited to the foregoing embodiments and various modifications and alterations can be made within the scope of the present invention.

The present invention includes the following embodiments.

[Additional Note 1]

A method of manufacturing a semiconductor device includes the steps of: (a) preparing a semiconductor substrate including a base body, an insulating layer formed on the base body in a first region of a main surface of the base body and a second region of the main surface of the base body, and a semiconductor layer formed on the insulating layer; (b) in the first region, introducing a first impurity of a first conductive type into the semiconductor layer; and (c) in the first region, forming a first gate insulating film having a charge storage portion formed therein, on the semiconductor layer, forming a first gate electrode on the first gate insulating film, forming a first semiconductor region on the semiconductor layer in a portion located below the first gate electrode, and, in the second region, forming a second gate insulating film on the semiconductor layer, forming a second gate electrode on the second gate insulating film, and forming a second semiconductor region on the semiconductor layer in a portion located below the second gate electrode. A non-volatile memory cell is formed of the first gate insulating film, the first gate electrode and the first semiconductor region, an MISFET is formed of the second gate insulating film, the second gate electrode and the second semiconductor region, and the second semiconductor region contains the first impurity having a concentration lower than the concentration of the first impurity in the first semiconductor region, or does not contain the first impurity.

[Additional Note 2]

In the method of manufacturing a semiconductor device described in the additional note 1, the second semiconductor region contains the first impurity, and the concentration of the first impurity in a first portion of the first semiconductor region which is in contact with the insulating layer is higher than the concentration of the first impurity in the second semiconductor region.

[Additional Note 3]

In the method of manufacturing a semiconductor device described in the additional note 1, a second portion of the first semiconductor region which is in contact with the first gate insulating film contains the first impurity having a concentration lower than the concentration of the first impurity in a third portion of the first semiconductor region which is in contact with the insulating layer, or does not contain the first impurity.

[Additional Note 4]

In the method of manufacturing a semiconductor device described in the additional note 1, the first conductive type is a p-type, the first impurity is made of boron, and the method of manufacturing a semiconductor device further includes a step of (d) introducing a second impurity made of carbon to the semiconductor layer in the first region after the step of (a) and before the step of (b).

[Additional Note 5]

In the method of manufacturing a semiconductor device described in the additional note 1, the method further includes a step of (e) forming a third semiconductor region of an n-type on the semiconductor layer in a portion located on a first side of the first gate electrode in the first region when seen in a plan view, the first conductive type is a p-type, electrons are implanted from the third semiconductor region to the charge storage portion when data is written in the non-volatile memory cell, and positive holes are implanted from the first semiconductor region to the charge storage portion when data stored in the non-volatile memory cell is erased.

What is claimed is:

1. A semiconductor device comprising:
   a base body;
   an insulating layer formed on the base body;
   a semiconductor layer formed on the insulating layer;
   a gate insulating film having a charge storage portion formed therein, and formed on the semiconductor layer;
   a gate electrode formed on the gate insulating film;
   a first semiconductor region of a first conductive type formed in the semiconductor layer in a portion located on a first side of the gate electrode, in plan view;
   a second semiconductor region of a second conductive type different from the first conductive type, formed in the semiconductor layer in a portion located on a second side opposite to the first side of the gate electrode, in plan view;
   a first conductive plug connected to the first semiconductor region; and
   a second conductive plug connected to the second semiconductor region,
   wherein a non-volatile memory cell is formed of the gate insulating film, the gate electrode, the first semiconductor region and the second semiconductor region,
   wherein a third conductive plug is connected to the gate electrode,
   wherein, when data is written in the non-volatile memory cell, electrons are implanted from the first semiconductor region to the charge storage portion by applying a first voltage to the first semiconductor region through the first conductive plug, a second voltage to the second semiconductor region through the second conductive plug and a third voltage to the gate electrode through the third conductive plug, the third voltage being higher than the first and second voltages, and
   when data stored in the non-volatile memory cell is erased, positive holes are implanted from the second semiconductor region to the charge storage portion by applying a fourth voltage to the first semiconductor region through the first conductive plug, a fifth voltage to the second semiconductor region through the second conductive plug and a sixth voltage to the gate electrode through the third conductive plug, the sixth voltage being lower than the fourth and fifth voltages.

2. The semiconductor device according to claim 1, further comprising:
   a third semiconductor region of a p-type formed in the semiconductor layer in a portion located below the gate electrode,
   wherein the first conductive type is an n-type,
   the second conductive type is a p-type, and
   a p-type impurity concentration in the second semiconductor region is higher than a p-type impurity concentration in the third semiconductor region.

3. The semiconductor device according to claim 2,
   wherein an n-type impurity concentration in the first semiconductor region is higher than the p-type impurity concentration in the second semiconductor region.

4. The semiconductor device according to claim 3,
   wherein, when data stored in the non-volatile memory cell is read, a voltage that is higher than a voltage to be applied to the first semiconductor region through the first conductive plug is applied to the second semiconductor region through the second conductive plug.

5. The semiconductor device according to claim 3,
   wherein the second voltage is higher than the first voltage, and
   wherein the fifth voltage is higher than the fourth voltage.

6. The semiconductor device according to claim 3,
   wherein the gate insulating film includes a first insulating film and a second insulating film serving as the charge storage portion.

7. The semiconductor device according to claim 6,
   wherein the gate insulating film further includes a third insulating film,
   wherein, in cross-section view, the second insulating film is located between the first and third insulating films.

8. The semiconductor device according to claim 7,
   wherein each of the first and third insulating films is comprised of a silicon oxide film, and
   wherein the second insulating film is comprised of a silicon nitride film.

9. The semiconductor device according to claim 3, wherein the first conductive plug is electrically connected with the first semiconductor region via a first silicide film, wherein the second conductive plug is electrically connected with the second semiconductor region via a second silicide film, and wherein the third conductive plug is electrically connected with the third semiconductor region via a third silicide film.

10. The semiconductor device according to claim 1, wherein the second voltage is higher than the first voltage, and wherein the fifth voltage is higher than the fourth voltage.

11. The semiconductor device according to claim 1, wherein the gate insulating film includes a first insulating film and a second insulating film serving as the charge storage portion.

12. The semiconductor device according to claim 11, wherein the gate insulating film further includes a third insulating film, wherein, in cross-section view, the second insulating film is located between the first and third insulating films.

13. The semiconductor device according to claim 12, wherein each of the first and third insulating films is comprised of a silicon oxide film, and wherein the second insulating film is comprised of a silicon nitride film.

14. The semiconductor device according to claim 1, wherein the first conductive plug is electrically connected with the first semiconductor region via a first silicide film, wherein the second conductive plug is electrically connected with the second semiconductor region via a second silicide film, and wherein the third conductive plug is electrically connected with the third semiconductor region via a third silicide film.

* * * * *